US012782465B2

(12) United States Patent
Atias et al.

(10) Patent No.: US 12,782,465 B2
(45) Date of Patent: Nov. 3, 2026

(54) SYSTEMS AND METHODS FOR GROUND FAULT DETECTION

(71) Applicant: Solaredge Technologies Ltd., Herzeliya (IL)

(72) Inventors: Matan Atias, Tel Aviv (IL); Gideon Eitan, Haifa (IL); Ohad Gidon, Netanya (IL); Dotan Freiberg, Tel Aviv (IL); Meir Gazit, Rosh Ha'ayin (IL); David Braginsky, Yokne'am (IL); Raz Toledano, Migdal HaEmek (IL); Amnon Yaacobi, Rishon LeZion (IL)

(73) Assignee: Solaredge Technologies Ltd., Herzeliya (IL)

( * ) Notice: Subject to any disclaimer, the term of this patent is extended or adjusted under 35 U.S.C. 154(b) by 62 days.

(21) Appl. No.: 18/940,017

(22) Filed: Nov. 7, 2024

(65) Prior Publication Data

US 2025/0147120 A1 May 8, 2025

Related U.S. Application Data

(60) Provisional application No. 63/664,352, filed on Jun. 26, 2024, provisional application No. 63/597,013, filed on Nov. 8, 2023.

(51) Int. Cl.
*G01R 31/52* (2020.01)
*H02S 50/10* (2014.01)
*H10F 19/90* (2025.01)

(52) U.S. Cl.
CPC .............. *G01R 31/52* (2020.01); *H02S 50/10* (2014.12); *H10F 19/902* (2025.01)

(58) Field of Classification Search
CPC ...... G01R 31/52; G01R 31/086; G01R 31/08; G01R 31/11; G01R 31/28; G01R 31/2812;
(Continued)

(56) References Cited

U.S. PATENT DOCUMENTS 11,398,749 B2 7/2022 Braginsky et al.
2014/0253138 A1* 9/2014 Ishii ........................ H02S 50/10 324/509

(Continued)

OTHER PUBLICATIONS

E. Garcia et al., "Solar Panels String Predictive and Parametric Fault Diagnosis Using Low-Cost Sensors," Sensors, vol. 22, Jan. 2022.

(Continued)

*Primary Examiner* — Son T Le
(74) *Attorney, Agent, or Firm* — Banner & Witcoff, Ltd.

(57) ABSTRACT

Systems and/or methods for mapping power device in a string of serially connected power devices are disclosed herein. A power source may apply a source voltage to a first end of the string. A power system controller coupled to the two ends of the string may send a first signal to the power devices in the string. The power devices in the string, responsive to receiving the first signal, may measure electrical characteristics of the power devices, where the measured electrical characteristics may indicate the parasitic leakage of the power devices. The power devices may send second signals to the power system controller to report the measured electrical characteristics. The power system controller may determine the mapping of the power devices in the string based on the second signals.

20 Claims, 43 Drawing Sheets

(58) Field of Classification Search
CPC ....... G01R 31/364; G01R 31/50; H02S 50/10; H02S 50/00; H02S 40/34; H02S 50/15; H10F 19/902
See application file for complete search history.

(56) References Cited

U.S. PATENT DOCUMENTS

| | | | | |
|---|---|---|---|---|
| 2019/0131925 | A1* | 5/2019 | Sano | H02S 40/32 |
| 2019/0392893 | A1 | 12/2019 | Yang et al. | |
| 2020/0358396 | A1 | 11/2020 | Rao et al. | |
| 2021/0055356 | A1* | 2/2021 | Stafl | B60L 3/0046 |

OTHER PUBLICATIONS

May 27, 2025—European Search Report—EP App. No. 24211683.8.

* cited by examiner

SYSTEMS AND METHODS FOR GROUND FAULT DETECTION

CROSS-REFERENCE TO RELATED APPLICATION

The present application claims priority to U.S. Application No. 63/597,013, filed Nov. 8, 2023 and U.S. Application No. 63/664,352, filed Jun. 26, 2024, the disclosures of which are incorporated herein by reference in their entireties.

FIELD OF THE DISCLOSURE

The disclosure herein relates generally to photovoltaic power systems. More specifically, the disclosure herein describes systems and methods for detecting ground faults in photovoltaic power systems.

BACKGROUND OF THE DISCLOSURE

Power systems may comprise various modules, devices, or components that may be connected to provide power to a load (e.g., a home, a factory, a warehouse, or a building). For example, in a photovoltaic power system, a photovoltaic panel may be connected to power devices, which may use a power conversion circuit to harvest power from the photovoltaic panel at the maximum power point (MPP) of the photovoltaic panel. In some photovoltaic power systems, a plurality of power devices may be serially connected to form a string. A power device may be connected to an inverter, which converts the power from the string and delivers the converted power to the load. The string may be connected to an inverter.

In some example power systems, the various modules, devices, or components of the photovoltaic power system may be connected to a ground potential via parasitic impedances in the systems. These parasitic impedances may create one or more conduction paths in the power system for current to flow, referred to as leakage current. Such leakage current may cause power losses in the power system. In some cases, a current conduction path with impedances lower than those of parasitic impedances may be inadvertently created. Such a conduction path may be referred to as a ground fault. The current or currents flowing through such ground faults may further increase the power losses in the system and may even be a source of safety hazards, since the leakage current flowing through the ground fault may cause heating of the power system modules, devices, and/or components and may even result in a fire.

BRIEF SUMMARY OF THE DISCLOSURE

The following presents a simplified summary of the disclosure in order to provide a basic understanding of some aspects of the disclosure. This summary is not an extensive overview of the disclosure. It is not intended to identify key or critical elements of the disclosure or to delineate the scope of the disclosure. The following summary merely presents some concepts of the disclosure in a simplified form as a prelude to the more detailed description provided below.

A first aspect of the disclosure provides for a system and/or a method for detecting a ground fault in a power device based on measuring a current or current flowing through the power device. To detect a ground fault, a power system controller may control a power source to generate and/or supply power at the terminals of the power device. A sensor or multiple sensors in the power device may measure a current flowing through the power device. For example, one sensor may measure a current flowing through a power conversion circuit in the power device. Another sensor may measure a current flowing through a bypass diode in the power device. A ground fault may be detected based on the sensor measurements. For example, the measured current or currents may be higher if a ground fault occurs relative to a case in which no ground fault occurs.

A second aspect of the disclosure may provide for a system and/or a method for detecting ground fault based on measuring a voltage of an electrically conducting plate in a power device. The electrically conducting plate may be a heat spreader that thermally couples switches in a power conversion circuit of the power device to a heatsink. The electrically conducting plate may be biased relative to a voltage between a positive terminal and a negative terminal of the power device. A sensor may measure a voltage between the electrically conducting plate and one of the positive terminal and the negative terminal of the power device. A ground fault may be detected based on the measurements of this voltage. For example, the measured voltage may be lower if a ground fault occurs relative to a case in which no ground fault occurs.

A third aspect of the disclosure may provide a system and/or a method for detecting ground faults based on a measured temperature of the power device. In case a ground fault occurs, the current or currents through the power device may increase, resulting in a rise in the temperature of the power device. Thus, a ground fault may be detected based on measuring the temperature sensor of the power device.

A fourth aspect of the disclosure may provide a system and/or a method for detecting a ground fault in a serial connection (e.g., string) of power devices, which may be coupled to a power system controller. The power system controller may control a power source by applying a voltage to the string of power devices. Each power device in the serial connection may measure, using a sensor, a voltage between a positive terminal and a negative terminal of the power device. Each power device may transmit a signal relating to this measured voltage to the power system controller. The power system controller may detect a ground fault in the string based on the received measured voltages of the power devices in the string. For example, in cases in which the output resistances of the power devices in the string are equal, and no ground fault occurs, the measured voltages of the power devices in the string may be equal. In case a ground fault occurs, some measured voltages of power devices in the string may be different from others.

BRIEF DESCRIPTION OF THE DRAWINGS

A more complete understanding of the present disclosure and the advantages thereof may be acquired by referring to the following description in consideration of the accompanying drawings, in which like reference numbers indicate like features, and wherein.

DETAILED DESCRIPTION OF THE DISCLOSURE

In the following description of the various embodiments, reference is made to the accompanying drawings, which form a part hereof and are shown by way of illustration of various embodiments in which the disclosure may be practiced. It is to be understood that other embodiments may be utilized, and structural and functional modifications may be made without departing from the scope of the present disclosure. Herein, Direct Current is abbreviated 'DC,' Alternating current is abbreviated 'AC,' maximum power point is abbreviated 'MPP,' and maximum power point tracking is abbreviated 'MPPT.'

Figure 1A:
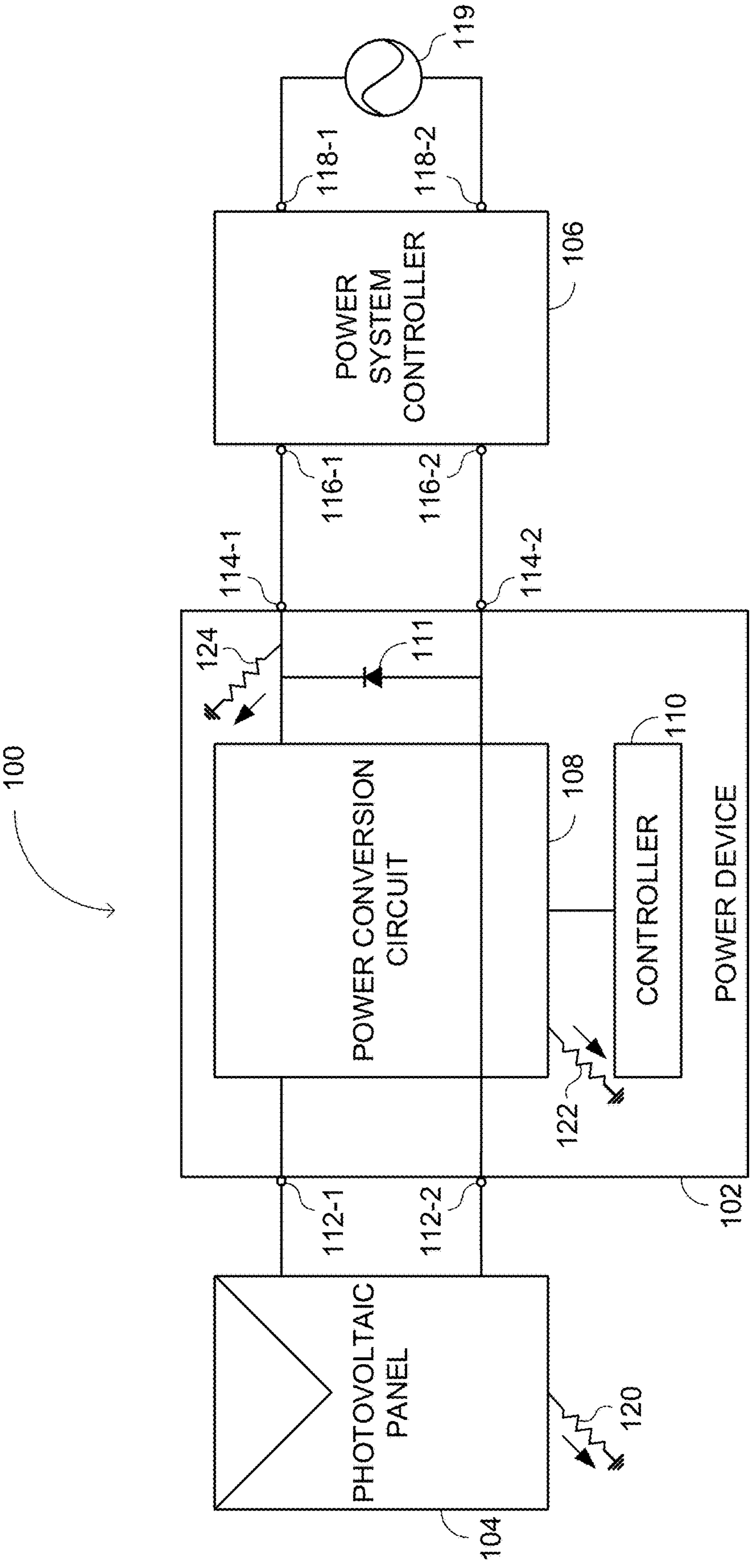
FIG. 1A shows a power system according to the disclosure herein.

The disclosure herein may describe systems and methods for detecting a ground fault or ground faults in power systems. Reference is made to FIG. 1A, which may show a power system generally referenced 100, in accordance with the disclosure herein. System 100 may be a photovoltaic power system and may comprise a power device 102, a photovoltaic panel 104, and/or a power system controller 106. Power device 102 may comprise a power conversion circuit 108, a controller 110, and/or a bypass diode 111. Further details regarding the power device 102 and the power system controller 106 may be described in conjunction with FIGS. 8A and 8B, respectively. The photovoltaic panel 104 may be coupled to power device 102 via first terminals 112-1 and 112-2. The power device 102 may be coupled with the power system controller 106 via second terminals 114-1 and 114-2 of the power device 102, and the terminals 116-1 and 116-2 of the power system controller 106. The power system controller 106 may be connected to a load (not illustrated) and/or to a power grid 119 via terminals 118-1 and 118-2. Terminal 112-1 may be coupled to terminal 114-2 (e.g., directly coupled, coupled via a capacitor, or coupled via a transformer).

In operation, the photovoltaic panel 104 may generate power (e.g., DC power) from light irradiated thereon. The power device 102 may receive the power generated by the photovoltaic panel 104 via the terminals 112-1 and 112-2. The controller 110 may control power conversion circuit 108 that converts a level of voltage, current, or both received from the photovoltaic panel 104 to another level at terminals 114-1 and 114-2. The controller 110 may control the power conversion circuit 108 to draw power from the photovoltaic panel 104 at the MPP of the photovoltaic panel (e.g., using an MPP tracking algorithm). The power system controller 106 may receive, at terminals 116-1 and 116-2, power from the power device 102. The power system controller 106 may convert the power at the terminals 116-1 and 116-2 to AC power and provide the AC power to a load, to grid 119, or to both. In some cases, as may further be described below, the power system controller may receive power from the grid 119 and/or provide the received power to the terminals 116-1 and 116-2.

System 100 may suffer from a ground fault or ground faults, where inadvertent current paths may be created for current to flow to ground. For example, a ground fault, such as the ground fault 120, may be created in the photovoltaic panel 104. A ground fault, such as the ground fault 122, may be created in the power conversion circuit 108 or in other locations or components of the power device 102 (e.g., ground fault 124). Ground faults, such as ground faults 120, 122, and/or 124, may result in losses of power. For example, the photovoltaic panel 104 may generate X watts of power (e.g., 200 Watts, 400 Watts, 500 Watts). However, some current may flow through the ground fault 120, which may result in the photovoltaic panel 104 providing less than X Watts of power. Similarly, the power device 102 may be able to provide Y Watts of power (e.g., 200 Watts, 400 Watts, 500 Watts) to power system controller 106. However, some current may flow through the ground fault 122 or ground fault 124, which may result in the power device 102 providing less than Y Watts of power. Ground faults such as the ground faults 120, 122 and/or 124 may also present a safety hazard in cases in which the current flowing through these ground faults generates a substantial amount of heat, which may result in a fire.

Figure 1B:
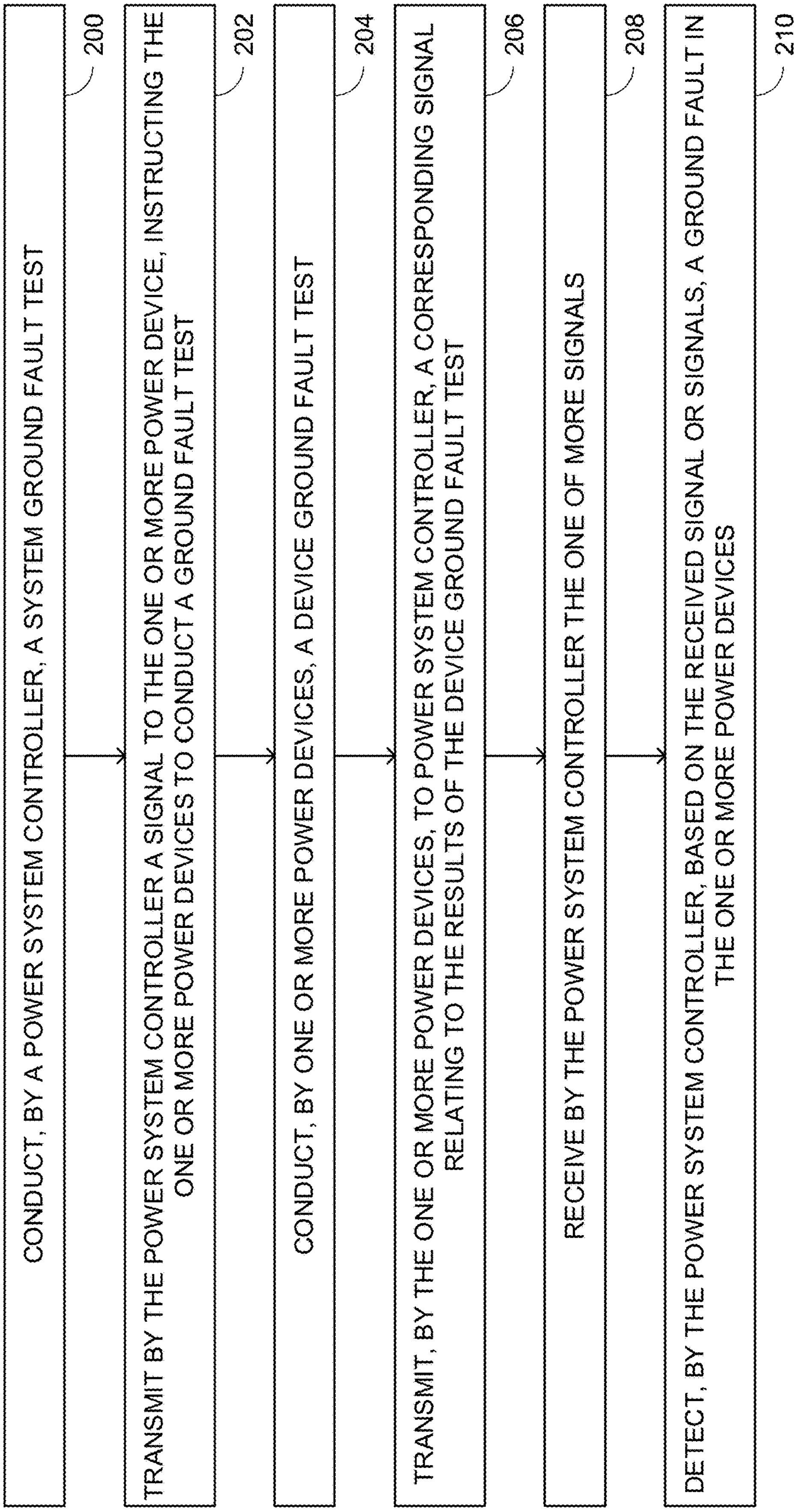
FIG. 1B shows a method for ground fault testing.

To detect a ground fault, the system 100 may conduct a ground fault test. Reference is made to FIG. 1B, which may show a method for ground fault testing in the system 100. In step 200, the power system controller 106 may conduct a system ground fault test. For example, the power system controller 106 may connect the terminal 116-1 to the ground via a test resistor and measure a current through the test resistor. The power system controller 106 may connect the terminal 116-2 to ground via the test resistor and measure a current through the test resistor. The power system controller 106 may detect a ground fault based on the current flowing through the test resistor.

In step 202, the power system controller 106 may transmit a signal to one or more power devices (e.g., the power device 102), instructing the one or more power devices to conduct a ground fault test. It is noted that step 202 may be optional.

In step 204, the power device 102 may conduct a device ground fault test. The power device 102 may conduct a ground fault test by performing various measurements. For example, the power device 102 may measure the level of the electrical characteristics (e.g., voltage or current) of one or more components in the power device 102. The power device 102 may perform measurements of the temperature in the power device 102. Conducting a ground fault test in power device 102 may further be elaborated in conjunction with FIGS. 2A-2D, 3A-3C, 5A-5B, 6A-6B, 7A-7B, and 8.

In step 206, one or more power devices, such as power device 102, may transmit to the power system controller 106 a corresponding signal relating to the results of the device ground fault test. The signal may comprise an indication of whether a ground fault occurred. The signal may comprise the measurements conducted during the device ground fault test.

In step 208, the power system controller 106 may receive the signal from the one or more power devices.

In step 210, the power system controller 106 may detect, based on the received signal or signals, a ground fault in the one or more power devices. The power system controller 106 may further detect a location of the ground fault in cases in which more than one power device is connected in a string of power devices (e.g., described in FIG. 4).

Figure 2A:
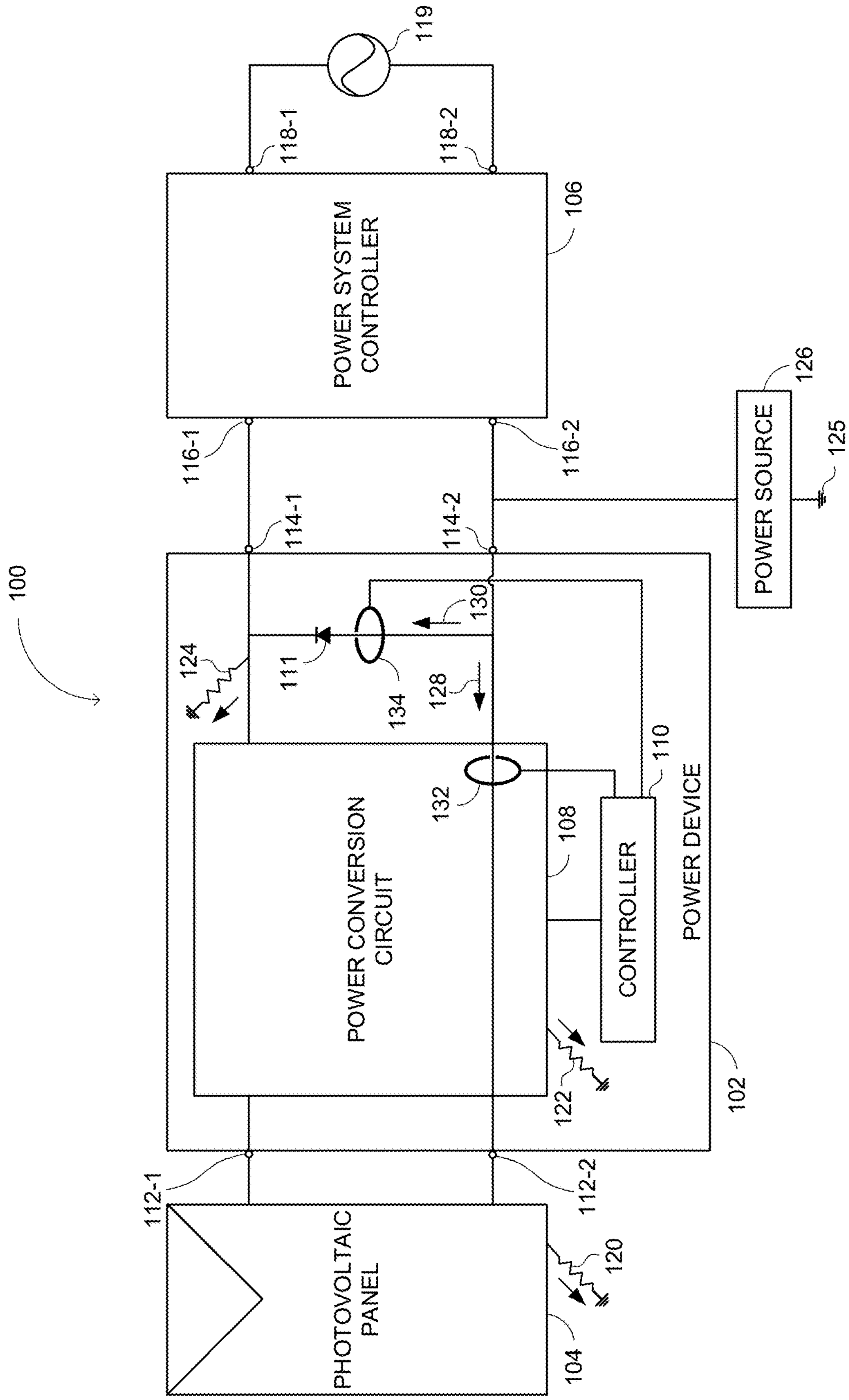
FIG. 2A shows a power system, for ground fault detection, which may comprise a power source external to a power system controller.
Figure 2B:
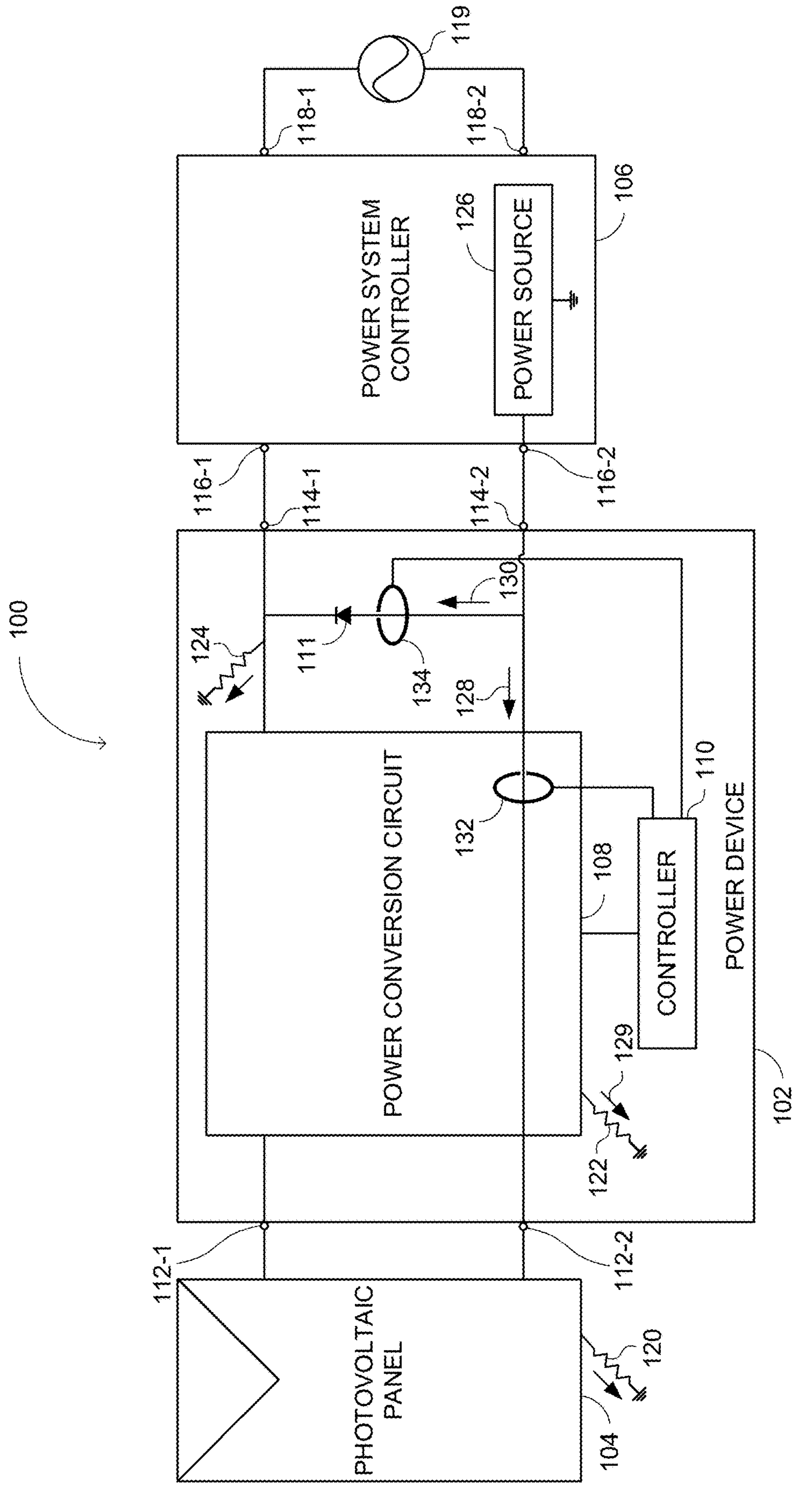
FIG. 2B shows a power system, for ground fault detection, which may comprise a power source internal to a power system controller.
Figure 2C:
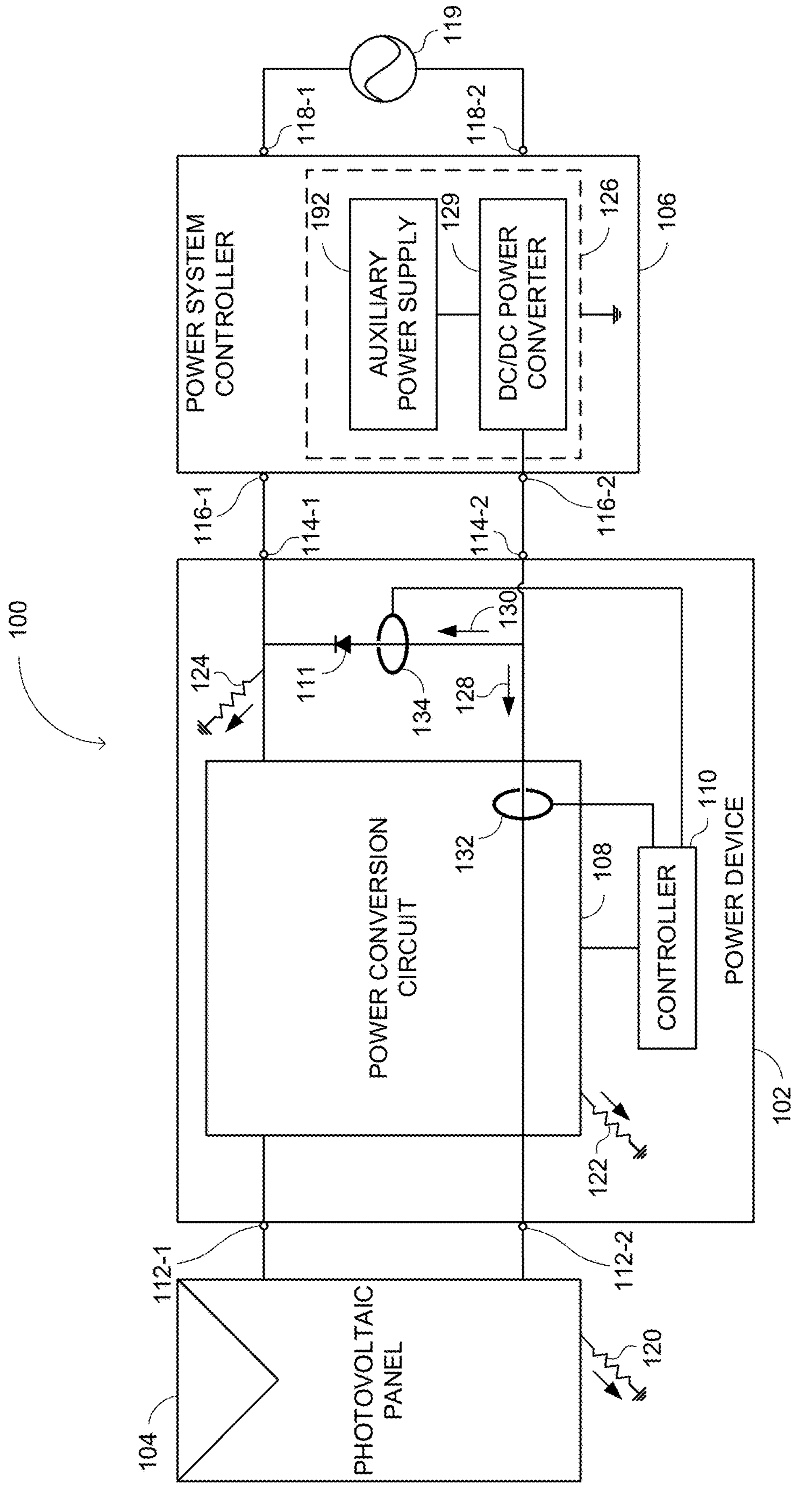
FIG. 2C shows a power system, for ground fault detection, which may show another example of a power source internal to a power system controller.

According to aspects of the disclosure herein, a ground fault may be detected based on measuring a current that may flow in the power device 102. Reference is now made to FIGS. 2A-2C, which shows system 100, where power device 102 may comprise a current sensor 132 and a current sensor 134, coupled to controller 110. Additionally, the system 100 may comprise a power source 126. The current sensor 132 may be configured to measure a level of current, such as the current 128, flowing through the power conversion circuit between the terminals 112-2 and 114-2. The current sensor 134 may be configured to measure a level of current, such as the current 130, flowing through the bypass diode 111. As may be further elaborated below, the measurements from current sensor 132 may be used (e.g., by controller 110 or by the power system controller 106) to detect the ground faults 120 and/or 122. The measurements from the current sensor 134 may be used to detect the ground fault 124. To detect a ground fault, the system 100 may use a power source, such as power source 126. For example, the power source 126 may be configured to generate power at terminals 114-2 and 116-2. The power source 126 may be an independent power source (e.g., a battery, a fossil fuel-based generator, a wind turbine). The power source 126 may be external to power system controller 106 (FIG. 2A). Alternatively, the power source 126 may be internal to power system controller 106 (FIGS. 2B-2C). Power source 126 may be a DC power source or an AC power source.

According to the disclosure herein, to detect a ground fault, the power source 126 may generate power at terminals 114-2 and 116-2. In response to the power generated by the power source 126, a current may flow in the power device 102. For example, a current may flow through the power conversion circuit 108, as indicated by arrow 128. A current may flow through the bypass diode 111, as may be indicated by arrow 130. The current sensor 132 may measure a level of current flowing through power conversion circuit 108, and/or the current sensor 134 may measure a level of current flowing through the bypass diode 111. The controller 110 may receive the measurements from the current sensor 132 and/or from current sensor 134.

In cases in which no ground fault occurs, the level of current flowing through the power conversion circuit 108 and/or the level of current flowing through bypass diode 111 may be zero or negligible (e.g., since this current or currents may flow through large parasitic impedances). In cases in which a ground fault occurs, such as ground fault 122, the impedance to the ground may be reduced. The reduced impedance may result in an increased level of the current flowing through the power conversion circuit 108 (e.g., relative to the current when no ground fault occurs). Similarly, in cases in which a ground fault occurs, such as ground fault 124, the impedance to the ground may be reduced. The reduced impedance may result in an increased level of the current flowing through the bypass diode 111 (e.g., relative to the current when no ground fault occurs).

As mentioned above, the power source 126 may be external to the power system controller 106. For example, FIG. 2A shows the power source 126 is outside the power system controller 106. As mentioned above, the power source 126 may be internal to the power system controller 106. For example, FIG. 2B shows the power source 126 being inside the power system controller 106. FIG. 2C may show an example of a power source located within the power system controller 106, which employs power from grid 119. In the example of FIG. 2C, the power system controller 106 may comprise an auxiliary power supply 192, which uses power from grid 119 for the operation of the various modules and components of the power system controller 106. For example, the auxiliary power supply 192 may convert AC power from the grid 119 (e.g., 230 Volts RMS) to DC power (e.g., 12 Volts or 5 Volts). The power source 126 may comprise a DC/DC power converter 129, which converts the power from the auxiliary power supply 192, and may increase or decrease the power during the conversion. For example, the DC/DC power converter 129 may up-convert the auxiliary power from the auxiliary power supply 193 from 12 volts to 1000 volts.

Figure 2D:
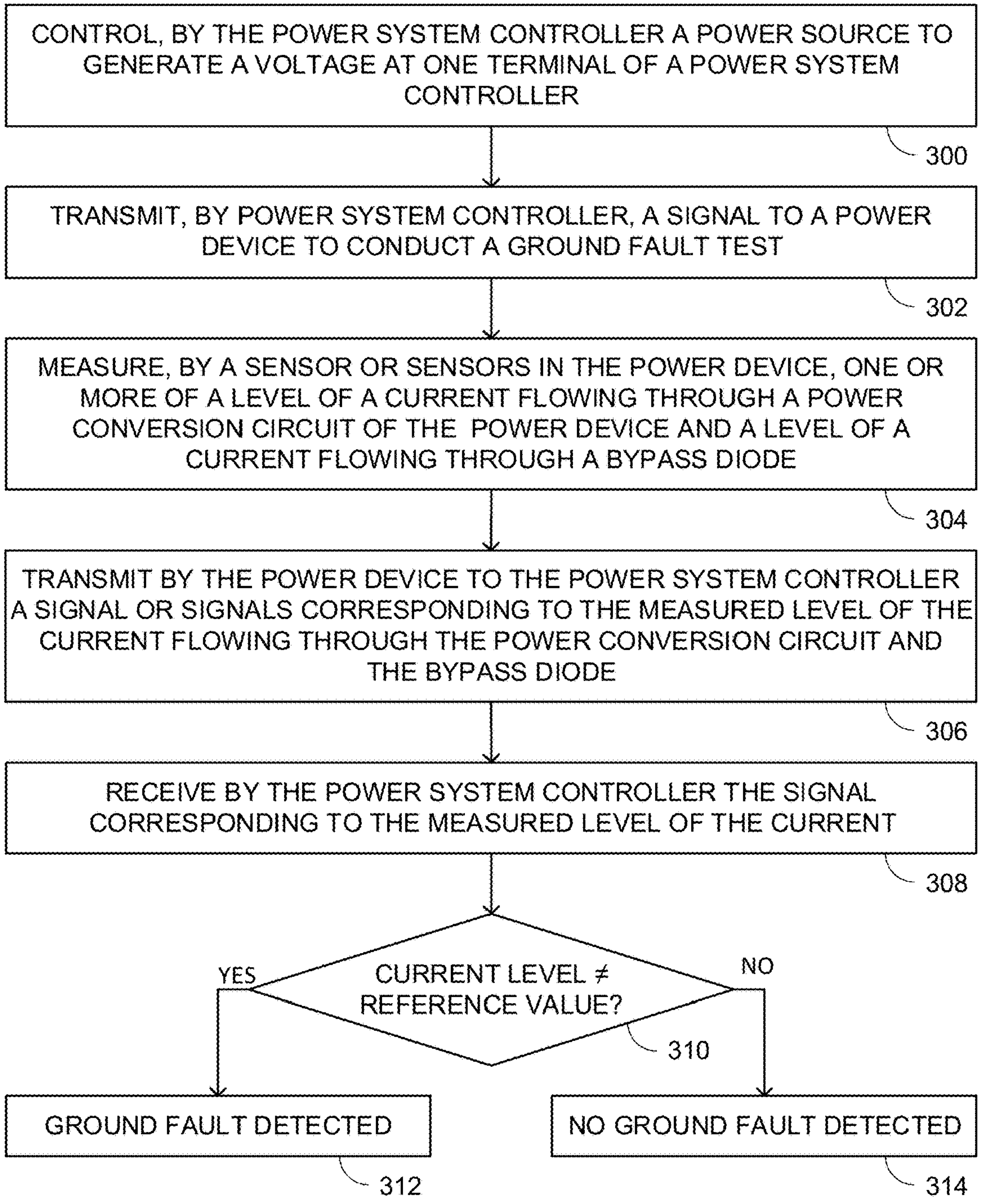
FIG. 2D shows a method for detecting a ground fault in a power system based on measurements of a current or currents in the power device.

Reference is made to FIG. 2D, which may show a method for detecting a ground fault in system 100 based on measuring a current flowing through a power conversion circuit or a bypass diode of a power device according to the disclosure herein. In step 300, the power system controller 106 may control the power source 126 by sending a signal (e.g., instructions) to the power source 126 to generate a voltage at one terminal of the power system controller (e.g., terminal 116-2 of the power system controller 106) relative to the ground.

In step 302, the power system controller 106 may transmit a signal to the power device 102, where the signal may comprise instructions for the power device 102 to conduct a ground fault test.

In step 304, responsive to receiving the signal from the power system controller 106, the current sensor 132 may measure a level of current flowing through the power conversion circuit 108. The current sensor 134, in response to the signal from the power system controller 106, may measure a level of current flowing through the bypass diode 111. The controller 110 may receive, from the current sensor 132, the measurements relating to the level of current flowing through the power conversion circuit 108, and/or from the sensor 134, the measurements relating to the level of current flowing through the bypass diode 111. It is noted that power device 102 may measure one or both of the currents flowing through the power device 108 and the bypass diode 111.

In step 306, the power device 102 may transmit, to the power system controller 106, a signal or signals corresponding to the level of currents flowing through the power conversion circuit 108 and/or the bypass diode 111.

In step 308, the power system controller 106 may receive the signal or signals corresponding to the measured level of currents flowing through the power conversion circuit 108 and/or the bypass diode 111.

In step 310, the power system controller 106 may compare the level of current flowing through the power conversion circuit 108, and/or the measurements of the level of current flowing through the bypass diode 111 to a reference value. The reference value may be a value corresponding to the level of current flowing through the power conversion circuit 108 and/or the bypass diode 111 when there is no ground fault.

In step 312, the power system controller 106 may detect that a ground fault occurs in cases in which the measurements of the level of current flowing through the power conversion circuit 108 (e.g., as may be measured by current sensor 132), and/or the measurements of the level of current flowing through the bypass diode 111 (e.g., as may be measured by current sensor 134), is different from the reference value (e.g., the level of current may be above or below the reference value). In some cases, the controller 110 or the power system controller 106 may detect a ground fault in cases in which there is a difference between measurements of the level of current flowing through the power conversion circuit 108 from two different sampling times, and/or if there is a difference between measurements of the level of the current flowing through the bypass diode 111 from two different sampling times (e.g., the derivative of the measurements of the current levels are above a threshold).

Alternatively, in step 314, the power system controller 106 may detect that a ground fault does not occur in cases in which the measurements (or the differences between the measurements) of the level of current flowing through the power conversion circuit 108, and/or the measurements (or the differences between the measurements) of the level of current flowing through the bypass diode 111 is not different from the reference value.

In some cases, prior to conducting a ground fault test, the controller 110 may produce a control signal to the power conversion circuit 108. The signal may comprise instructions for the power conversion circuit to transition to a ground fault detection mode. For example, the controller 110 may produce a control signal to transition the switches in the power conversion circuit 108 to a non-conducting state. Also, although the power source 126 is depicted in FIGS. 2A-2C as connected to terminals 116-2 and 114-2, the power source may alternatively be connected to terminals 116-1 and 114-1.

Power conversion circuits, such as the power conversion circuit 108, may comprise one or more switches (e.g., transistors, thyristors). Such switches may transition between a conducting state and a non-conducting state at high frequencies (e.g., on the order of kilohertz, tens of kilohertz, hundreds of kilohertz, megahertz, or higher). When switching in such frequencies, the switches may generate heat that needs to be dissipated. Dissipating the heat may be achieved by using a heatsink (e.g., a fan, a fin-based heatsink, or a pin-based heatsink). The switches may be thermally coupled to the heatsink using a heat spreader. The heat spreader may be an electrically conducting (e.g., metallic) plate thermally coupled between the switches and the heatsink. The heat spreader may be electrically biased relative to a voltage in the power conversion circuit and/or be electrically insulated from other components of the power device. Some heat spreaders may be prone to ground faults. Also, the heat spreader insulation from other components of the power device may undergo degradation over time, which may eventually result in a ground fault.

Figure 3A:
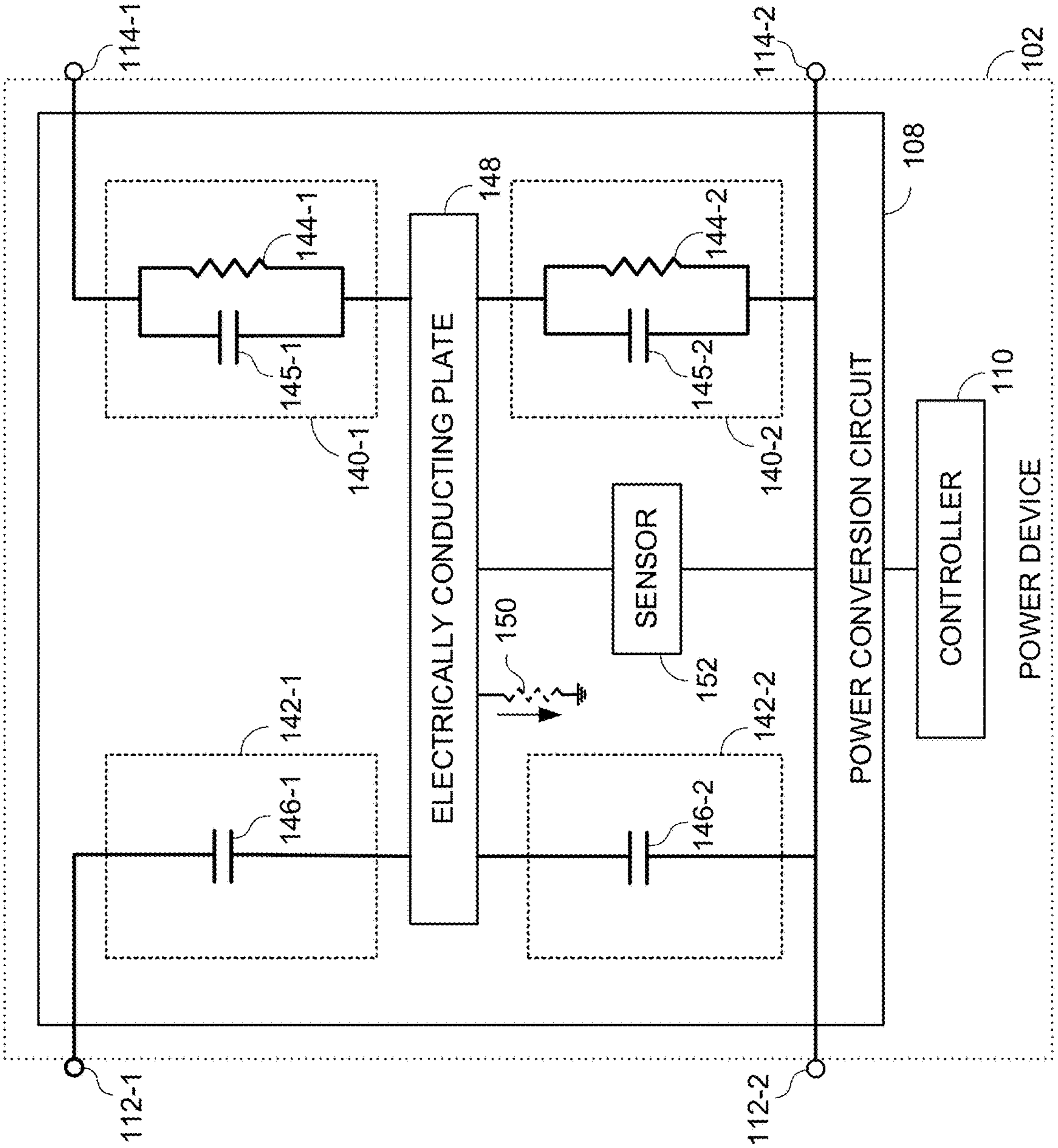
FIG. 3A shows an example power conversion circuit in a power device comprising an electrically conducting plate.

Reference is now made to FIG. 3A, which shows parts of a power device, such as the power device 102. In FIG. 3A, the power conversion circuit 108 may comprise an electrically conducting plate 148, which may function as a heat spreader. The electrically conducting plate 148 may be biased relative to a voltage between terminals 114-1 and 114-2. To that end, the electrically conducting plate 148 may be coupled to terminal 114-1 via an impedance circuit 140-1, and to terminal 114-2 via an impedance circuit 140-2. The impedance circuit 140-1 may comprise a resistor 144-1, and/or the impedance circuit 140-2 may comprise a resistor 144-2. The impedance circuit 140-1 may further comprise a capacitor 145-1, and/or the impedance circuit 140-2 may further comprise a capacitor 145-2. The electrically conducting plate 148 may further be coupled to terminal 112-1 via an impedance circuit 142-1 and/or to terminal 112-2 via an impedance circuit 142-2. The impedance circuit 142-1 may comprise a capacitor 146-1, and/or the impedance circuit 142-2 may comprise a capacitor 146-2. The power device 100 may further comprise a sensor 152 coupled to the controller 110. The impedance circuits 140-1 and 140-2 may form a voltage divider of the voltage between terminals 114-1 and 114-2 for biasing the electrically conducting plate 148. The sensor 152 may be a voltage sensor for sensing a voltage between the electrically conducting plate 148 and terminals 112-2 and/or 114-2. The sensor 152 may be a current sensor for sensing a current flowing between the electrically conducting plate 148 and the terminal 114-2 and/or terminal 112-2.

The resistors 144-1 and 144-2 may bias the electrically conducting plate 148 at a voltage level relative to the voltage between terminals 114-1 and 114-2. The sensor 152 may measure a level of voltage or a level of current between the electrically conducting plate 148 and the terminal 114-2 and produce these measurements to controller 110. In cases in which the electrical insulation of the electrically conducting plate 148 fails, a ground fault, such as the ground fault 150, may occur, resulting in a current flowing from the electrically conducting plate 148 to the ground. Consequently, the voltage between the electrically conducting plate 148 and the terminal 114-2 may change. For example, the voltage between the electrically conducting plate 148 and the terminal 114-2 may decrease since a portion of the current that flowed through resistor 144-2 may flow to the ground because of the ground fault.

Figure 3B:
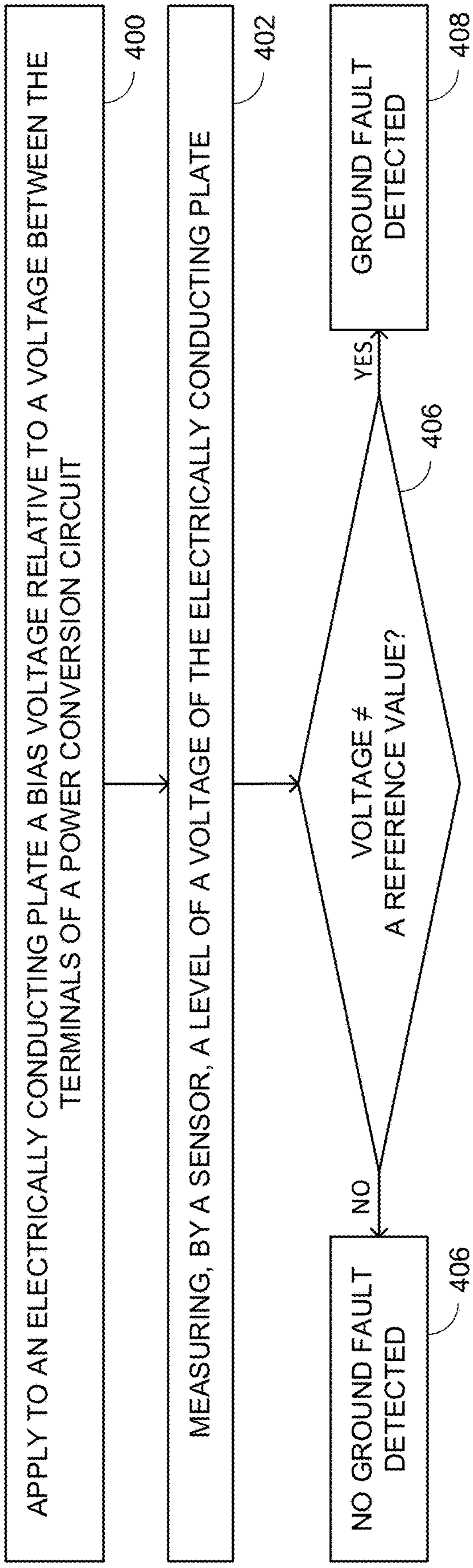
FIG. 3B shows a method for detecting a ground fault in a power device based on measuring a voltage of the electrically conducting plate.
Figure 3C:
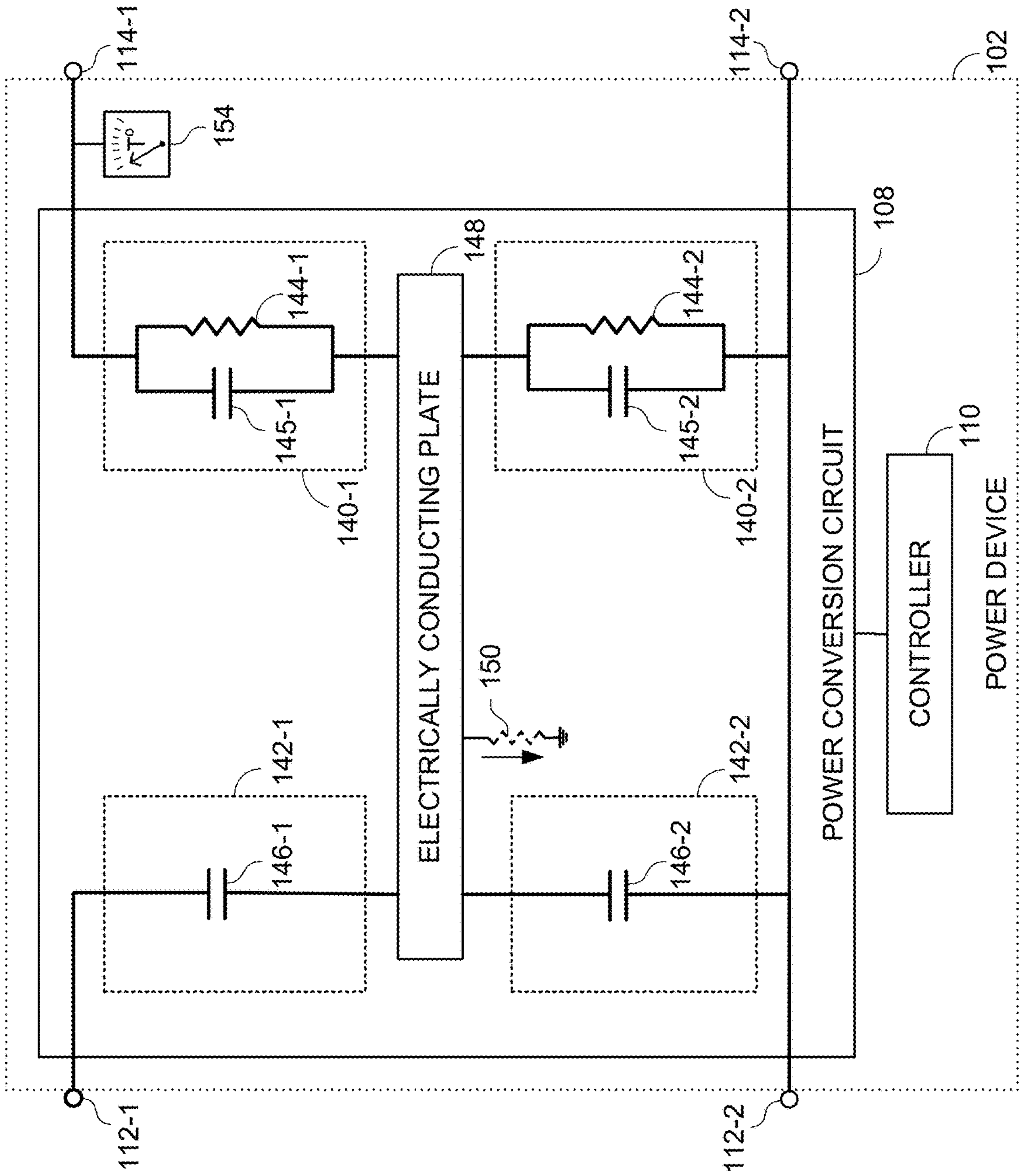
FIG. 3C shows another example of a power conversion circuit in a power device comprising a temperature sensor.

Reference is now made to FIG. 3B, which may show a method for detecting a ground fault based on a voltage or a current of the electrically conducting plate 148 of the power device 102. In step 400, an impedance divider formed by the impedance circuits 140-1 and 140-2 may apply a bias voltage to the electrically conducting plate 148 relative to the voltage between terminals 114-1 and 114-2.

In step 402, the sensor 152 may measure a level of an electrical characteristic (e.g., a voltage level or a current level) of the electrically conducting plate 148 with reference to the terminal 114-2 or the terminal 114-1. For example, the sensor 152 may be a voltage sensor configured to measure a voltage between the electrically conducting plate 148 and the terminal 114-2.

In step 404, the controller 110 may determine if the level of the measured electrical characteristic is different from a reference value. For example, in cases in which the sensor 152 is a voltage sensor, the controller 110 may determine if the measured voltage between the electrically conducting plate 148 and the terminal 114-2 is different from the bias voltage. In cases in which sensor 152 is a current sensor, the controller 110 may determine if the measured current from the electrically conducting plate 148 to the terminal 114-1 is different from a reference current level. The reference current level may be the current level when no ground fault occurs (e.g., the current that may flow through parasitic impedances or zero).

In step 406, the controller 110 may detect that no ground fault has occurred based on the level of the electrical characteristic being equal to the reference value.

In step 408, controller 110 may detect that a ground fault has occurred based on the level of the electrical characteristic not being equal to the reference value.

According to the disclosure herein, the power device 102 may transmit a signal relating to the measurements received from the sensor 152 to the power system controller 106. The power system controller 106, using the received signal or signals, may determine if a ground fault has occurred. According to the disclosure herein, the controller 110 may detect a ground fault, based on the measurements from sensor 152, and transmit a signal to the power system controller 106 indicating that a ground fault has occurred. The controller 110 or the power system controller 106 may detect a ground fault based on the level of voltage or the current between the electrically conducting plate and the terminal 114-2 being different from a reference value (e.g., a threshold). The controller 110 or the power system controller 106 may receive a plurality of measurements from the sensor 152 and detect a ground fault based on a derivative of the levels of the voltage between the electrically conducting plate and the terminal 114-2 being different from a reference value.

According to the disclosure herein, the measurements for the sensor 152 may be used to detect a trend in the level of voltage between the electrically conducting plate 148 and the terminal 114-2. For example, the measurements from the sensor 152 may indicate that the level of voltage between the electrically conducting plate 148 and the terminal 114-2 is decreasing or increasing over time. Detecting such a trend (e.g., an increase over time or a decrease over time) may provide an early alert that a ground fault may occur in the future. According to the disclosure herein, the controller 110 may store the measurements from the sensor 152, and use the stored measurements from sensor 152 to detect a trend in the level of voltage or current between the electrically conducting plate 148 and the terminal 114-2. According to the disclosure herein, the power device 102 may transmit signals indicating the measurements from sensors 152 to the power system controller 106. The power system controller 106 may store the received measurements and use the received measurements to detect a trend in the level of voltage or current between the electrically conducting plate 148 and the terminal 114-2.

In some cases, a ground fault or a degradation of the electrical insulation of the heat spreader may cause an increase in the level of a current flowing through the impedance circuit 140-1. Such an increase in the current level may result in an increase in the temperature of the power device 102. For example, an increase in current flowing through impedance 140-1 may result in an increase in the temperature of the resistor 144-1 and/or the conductors coupled to the terminal 114-1. According to the disclosure herein, a ground fault may be detected using a temperature sensor. For example, with reference to FIG. 3C, the power device 102 may comprise a temperature sensor 154 (e.g., thermistor, thermocouple) coupled to the controller 110 and/or thermally coupled to power device 102. For example, the temperature sensor 154 may be thermally coupled to the conductors coupled to the terminal 114-1 and/or to the resistor 144-1. The temperature sensor 154 may measure the level of temperature of the power device 102, the conductors coupled to the terminal 114-1, or the resistor 144-1. The controller 110 may receive, from the temperature sensor 154, a measurement or measurements relating to the level of temperature of the power device 102, the conductors coupled to the terminal 114-1, or the resistor 144-1.

Figure 3D:
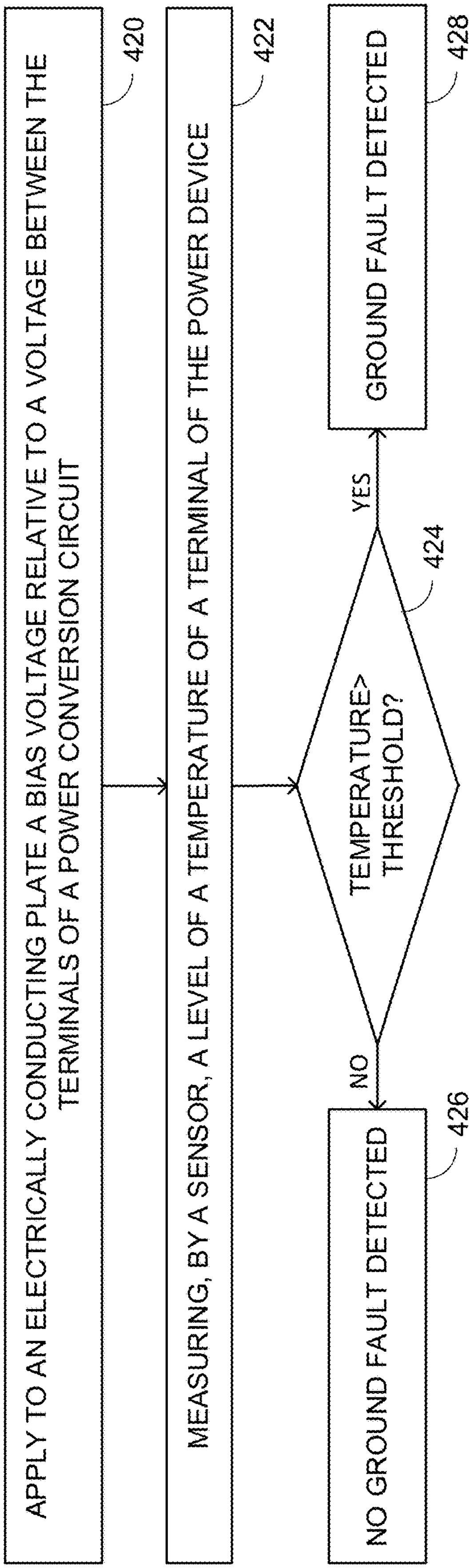
FIG. 3D shows a method for detecting a ground fault in a power device based on measuring a temperature of the power device.

Reference is now made to FIG. 3D, which may show an example method for detecting a ground fault based on the temperature of a power device (e.g., the power device 102). In step 420, an impedance divider formed by the impedance circuits 140-1 and 140-2 applies a bias voltage to the electrically conducting plate 148 relative to the voltage between the terminals 114-1 and 114-2.

In step 422, the temperature sensor 154 may measure the temperature of the power device 102, the conductors coupled to the terminal 114-1, or the resistor 144-1.

In step 424, the controller 110 may determine if the measured temperature exceeds a threshold (e.g., a temperature of the power device 102 when no ground fault has occurred). For example, in case of a ground fault, a current flowing through the power device 102 may increase, which may cause an increase in the temperature of the power device 102, the conductors coupled to the terminal 114-1, or the resistor 144-1.

In step 426, the controller 110 may detect that no ground fault has occurred based on the measured temperature being lower than the threshold.

In step 428, the controller 110 may detect that a ground fault occurred based on the measured temperature being higher than the threshold.

According to the disclosure herein, the power device 102 may transmit signals relating to the measurements from the temperature sensor 154 to the power system controller 106. The power system controller 106, using the received signal or signals, may determine if a ground fault occurred. According to the disclosure herein, the controller 110 may detect a ground fault based on the measurements from the temperature sensor 154, and transmit a signal to the power system controller 106 indicating that a ground fault has occurred. The controller 110 or the power system controller 106 may detect the ground fault based on the temperature of the power device 102, of the conductors, coupled to the terminal 114-1, or of the resistor 144-1 being different from a reference value (e.g., a threshold). The controller 110 or the power system controller 106 may receive a plurality of temperature measurements from the sensor 154 and detect a ground fault based on a derivative of the temperatures of power device 102 (e.g., the difference between two temperatures measured at two points in time) being different from a reference value. The controller 110 or the power system controller 106 may use the measurements from the sensor 154 to detect a trend in the temperature of the power device 102, the conductors coupled to the terminal 114-1, or the resistor 144-1 and may provide an early alert that a ground fault may occur in the future.

Figure 4:
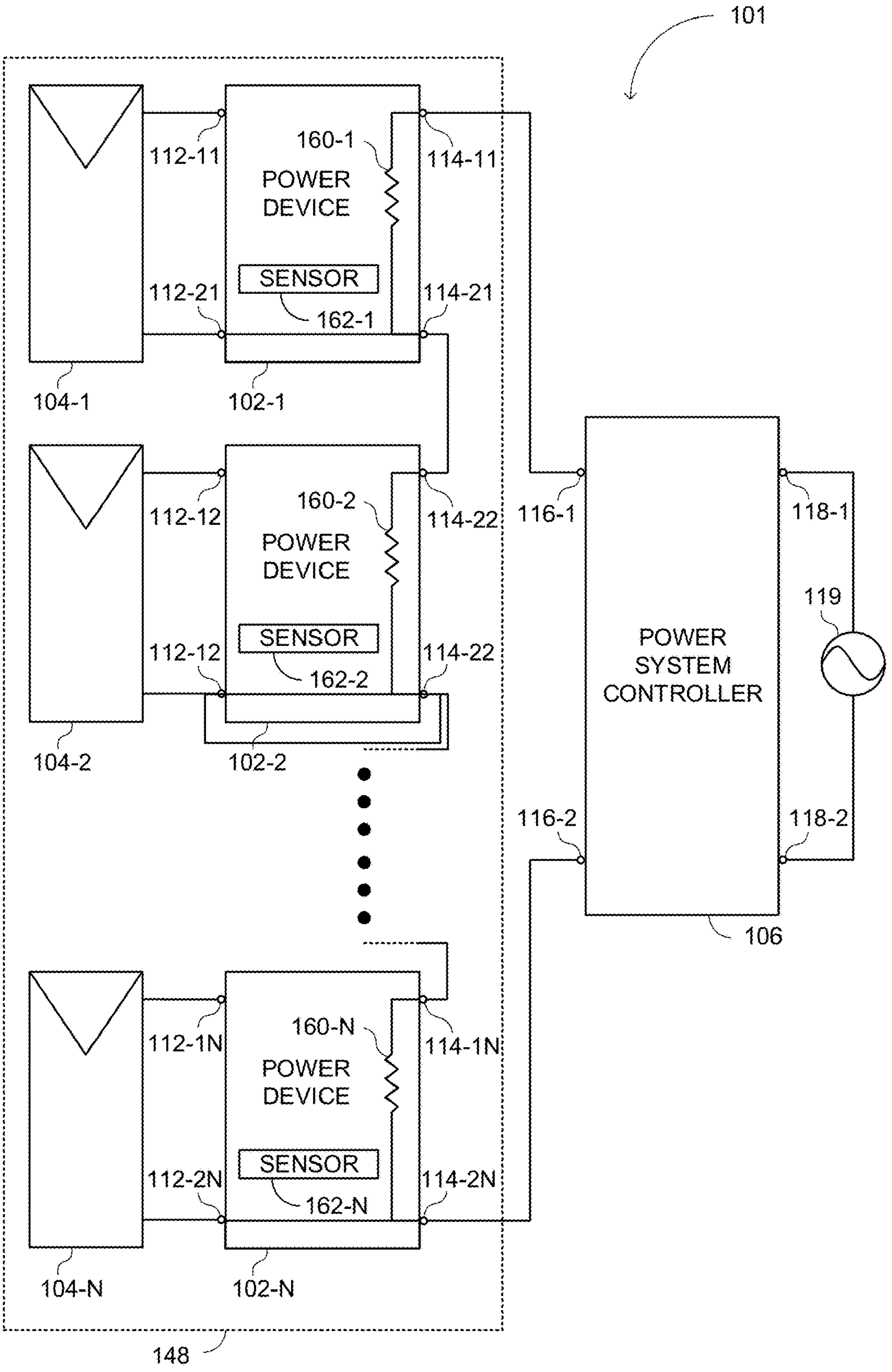
FIG. 4 shows a power system that comprises a plurality of serially connected power devices.

The description herein may relate to detecting ground faults in power devices or corresponding photovoltaic panels coupled to the power device, where the power devices may be connected in a series string. Reference is now made to FIG. 4, which may show a power system, generally referenced 101. The system 101 may comprise a power system controller 106 and a string 148 of power devices 102-1, 102-2, . . . , 102-N and corresponding photovoltaic panels 104-1, 104-2, . . . , 104-4 coupled to the power devices. Each power device may comprise a resistance, such as the resistance 160-1 in the power device 102-1, the resistance 160-2 in the power device 102-2, . . . , and the resistance 160-N in the power device 102-N. It is noted that the resistances 160-1, 160-2, . . . , 160-N may not be actual resistors but may represent equivalent resistances of the corresponding power devices 102-1, 102-2, . . . , 102-N as seen from the respective terminals 114-1 and 114-2. For example, the resistance 160-1 may indicate the equivalent resistance of the power device 102-1, as seen from terminals 114-11 and 114-12. In FIG. 4, the string 148 may be coupled to the power system controller 106 (e.g., the terminal 116-1 of the power system controller 106 may be coupled to the terminal 114-11 of the power device 102-1, and the terminal 116-2 of the power system controller 106 may be coupled to the terminal 114-2N of the power device 102-N).

The power devices in the string 148 may each detect a ground fault in the power device or the photovoltaic panel coupled to the power device using the methodology described above in conjunction with FIGS. 2A-2D. The methodology described above, in conjunction with FIGS. 2A-2D, may detect any number of ground faults in string 148. The methodology described above, in conjunction with FIGS. 2A-2D, may detect any number of ground faults in cases in which two or more strings are connected in parallel.

Another example for detecting ground fault may be that each power device 102-1-102-N, using the respective power source 104-1-104-N, may produce a voltage across the respective terminals 114-1 and 114-2 of power device 102. If no ground fault occurs, no current may flow through the power devices 102-1-102-N. If a ground fault occurs, current may flow through the power devices in which the fault occurred, and system 101 may detect the ground faults using a similar methodology described above in conjunction with FIGS. 2A-2D. In this example, the power system controller 106 may not produce power and may isolate string 148 from the ground. Additional methods for detecting a ground fault or ground faults in strings may be described herein in conjunction with FIGS. 5A-5C, 6A-6B, and 7A-7B.

Figure 5A:
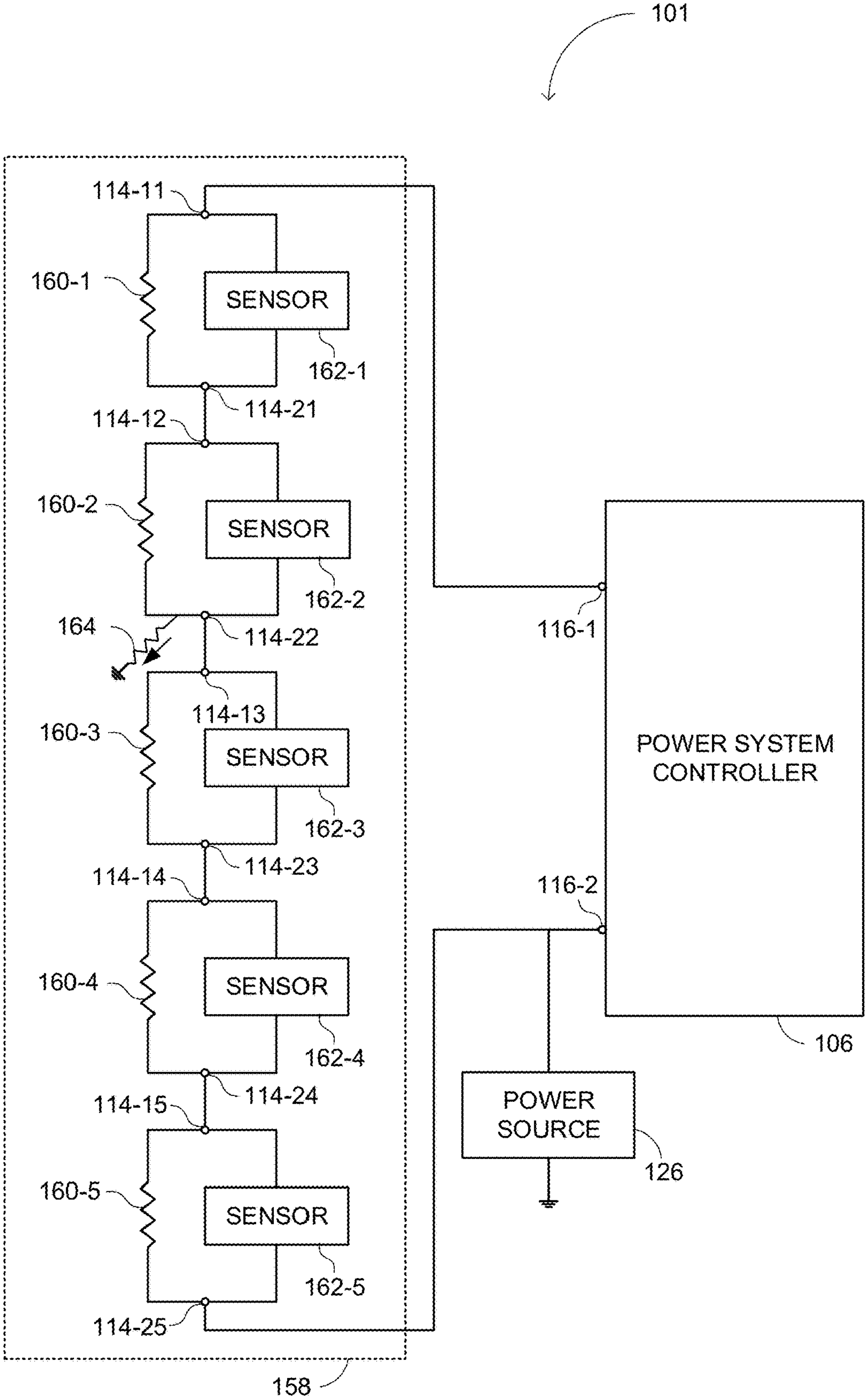
FIG. 5A shows a power system for detecting a ground fault in the serially connected power devices, which comprises a power source, external to a power system controller, applying a common voltage to the serially connected power devices.
Figure 5B:
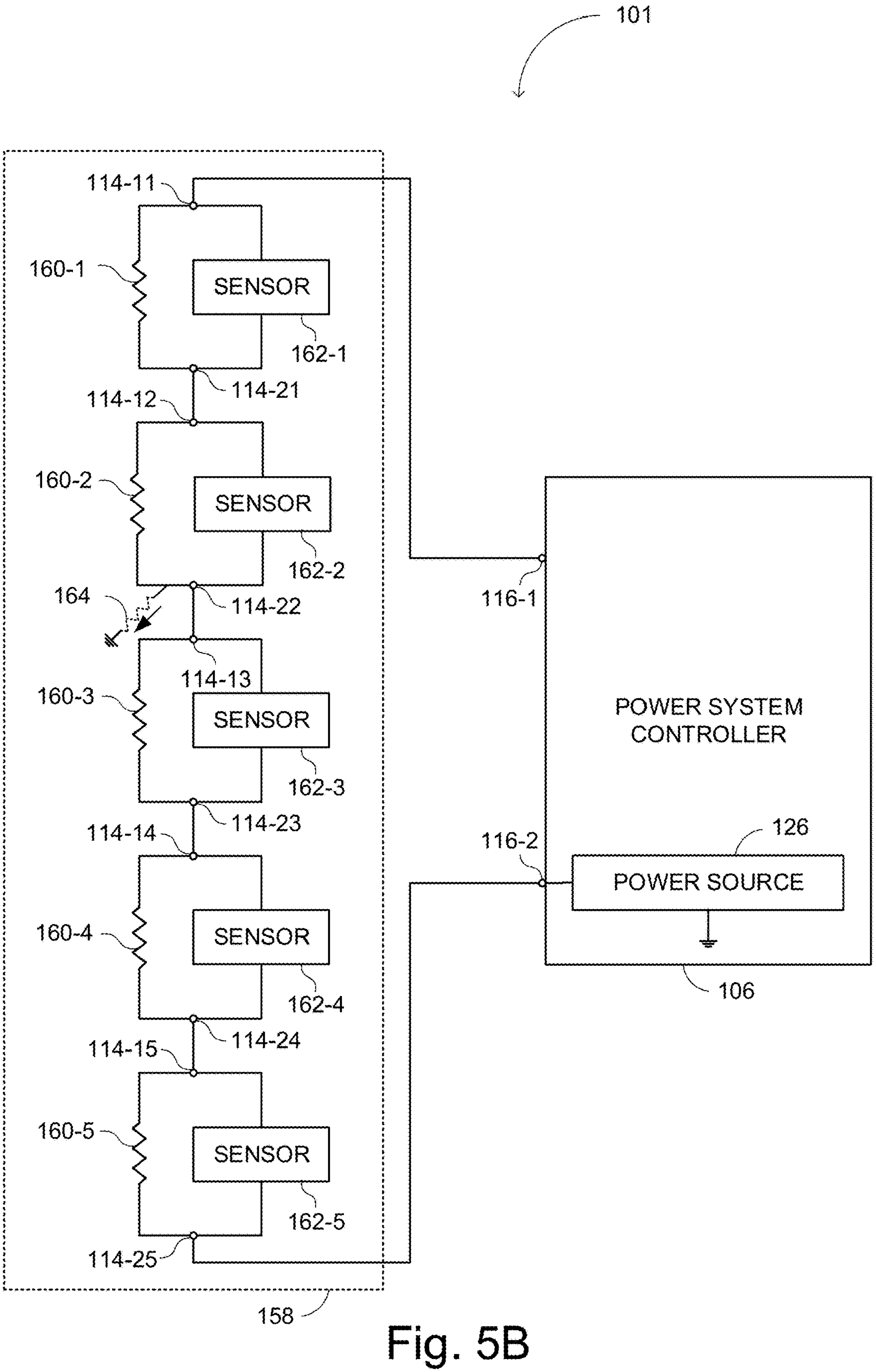
FIG. 5B shows another power system for detecting a ground fault in the serially connected power devices, which comprises a power source, internal to a power system controller, applying a common voltage to the serially connected power devices.
Figure 5C:
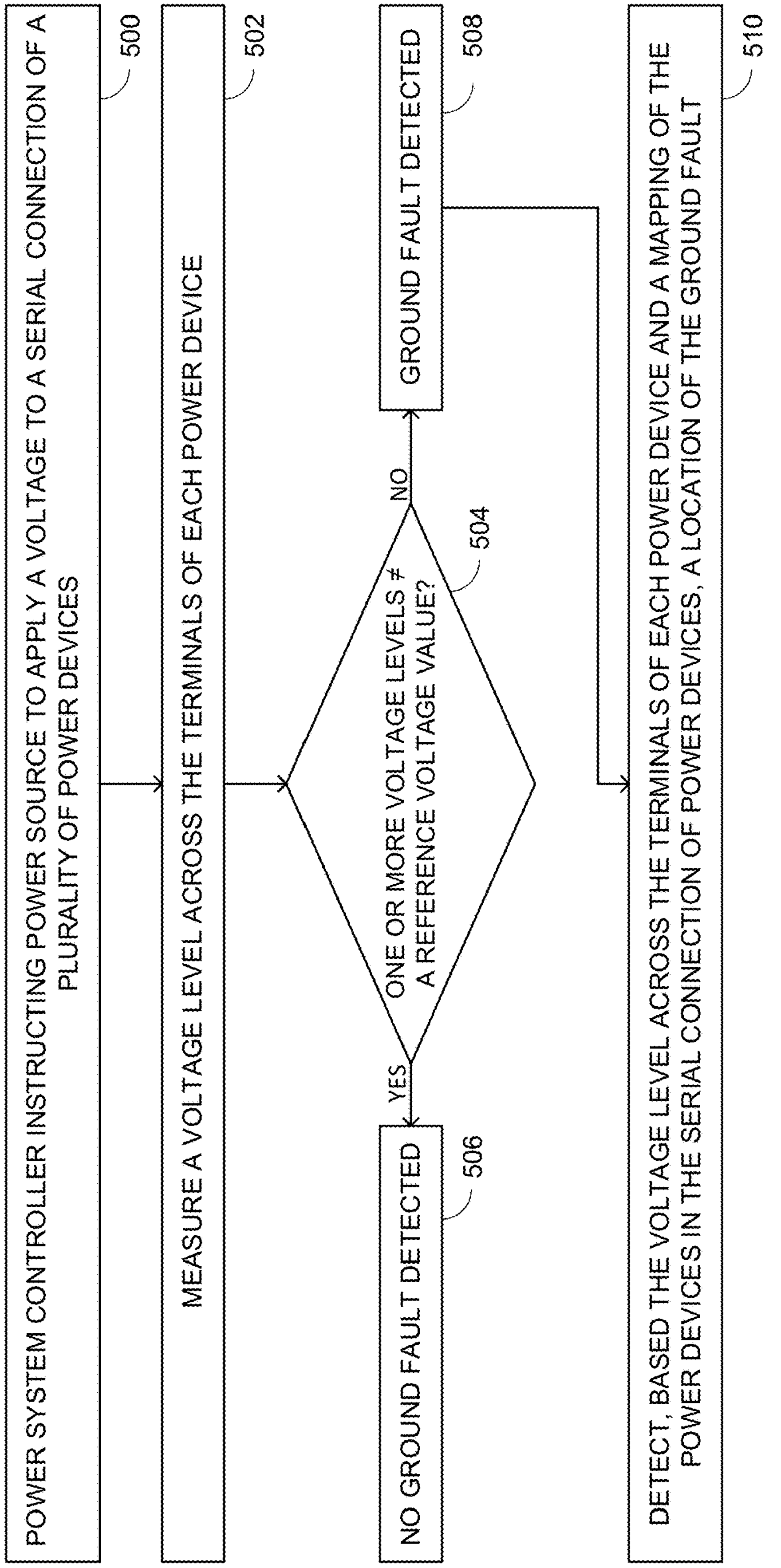
FIG. 5C shows a method of detecting a ground fault in the serially connected power devices when a voltage is applied to serially connected power devices.

Reference is now made to FIGS. 5A-5C, which may show aspects of a power system 101. For the sake of the clarity of FIGS. 5A and 5B, and of the explanations brought in conjunction therewith, the five resistances 160-1-160-5 and five sensors 162-1-162-5 corresponding to five power devices 102-1-102-5 are shown in the string 158 in FIGS. 5A and 5B. Each of sensors 162-1-162-5 may be a voltage sensor, which may be coupled between terminals 114-1 and 114-2 of the corresponding power device 102-1-102-5, and may be configured to measure a voltage level between the corresponding terminals 114-1 and 114-2. As shown in FIGS. 5A and 5B, the power system 101 may comprise a power source 126 coupled to the terminal 116-2 of the power controller system 106 and configured to apply a voltage to the terminal 116-2, and thus to string 158, relative to ground. The power source 126 may be similar to as described above in conjunction with FIGS. 2A-2C. For example, FIG. 5A shows a power source 126 that is external to the power system controller 106 (e.g., the power source 126 is located outside the power system controller 106), and FIG. 5B shows a power source 126 as internal to the power system controller 106 (e.g., the power source 126 is located inside the power system controller 106).

Reference is now made to FIG. 5C, which may show a method for detecting a ground fault in string 158. In step 500, the power system controller 106 may instruct (e.g., by sending a signal) the power source 126 to apply a voltage to the string 158 (e.g., by applying a voltage to the terminal 116-2). A voltage applied to terminal 116-2 may be referred to as a common voltage.

In step 502, the sensors 162-1-162-5 may measure a voltage level across the terminals of the corresponding power devices 102-1-102-5. Each one of power devices 102-1-102-5 may transmit, to the power system controller 106, a signal indicating the measured voltage level across the corresponding terminals 114-1 and 114-2 of the power device.

In step 504, the power system controller 106 may compare each of the voltage levels to a reference voltage value. In cases in which no ground fault occurs, the sensors 162-1-162-5 may measure a voltage level that may correspond to a nominal output voltage (e.g., zero volts in the case power devices 102-1-102-5 do not convert power from the corresponding power sources 104-1-104-5). In cases in which a ground fault has occurred, such as the ground fault 164, a current may flow through the ground fault 164. Therefore, the voltage levels sensed by sensors 162-1-162-5 may correspond to a voltage that may be different from the nominal value (e.g., non-zero volts). In the example shown in FIGS. 5A and 5B, the ground fault 164 may occur in power device 102-2, the sensors 162-1 and 162-2 may measure a positive voltage level relative to ground, and the sensors 162-3, 162-4 and 162-5 may measure a negative voltage relative to ground.

In step 506, if the voltage level corresponds to the reference voltage (e.g., a nominal output voltage), the power system controller 106 may determine that no ground fault has occurred.

In step 508, if the voltage level does not correspond to the reference voltage (e.g., nominal output voltage), the power system controller 106 may determine that a ground fault has occurred.

In step 510, the power system controller 106 may detect a location of the ground fault within the string 158 based on the received signals. The power system controller 106 may determine a location of the ground fault based on a mapping of the location of the power devices 102-1-102-5 (e.g., relative to each other) within the string 158 relative to each other. Such a mapping may be determined during installation of the system 101 or by the power system controller 106 based on the measurements from the sensors in the power devices 102-1-102-5 in the string 158.

In some cases, the power source 126 may be connected to the terminal 116-1. In such cases, the nominal value of the voltage across the resistance 160-1-160-5 may be different from the case in which the power source 126 may be connected to the terminal 116-2. For example, in cases in which no ground fault has occurred, and the values of resistances 160-1-160-5 are substantially equal, the voltage levels sensed by sensors 162-1-162-5 may be equal. In case a ground fault has occurred, such as the ground fault 164, the sensors 162-1 and 162-2 may measure a higher voltage level than the sensors 162-3 and 162-5. It is also noted that in the configuration shown in FIGS. 5A-5B, terminal 116-1 may be connected to ground via parasitic impedances, via the connection to the grid 119 (e.g., grid 119 is connected to ground), or via a dedicated resistor which connects terminals 116-1 to ground using a switch, during a ground fault test.

Figure 6A:
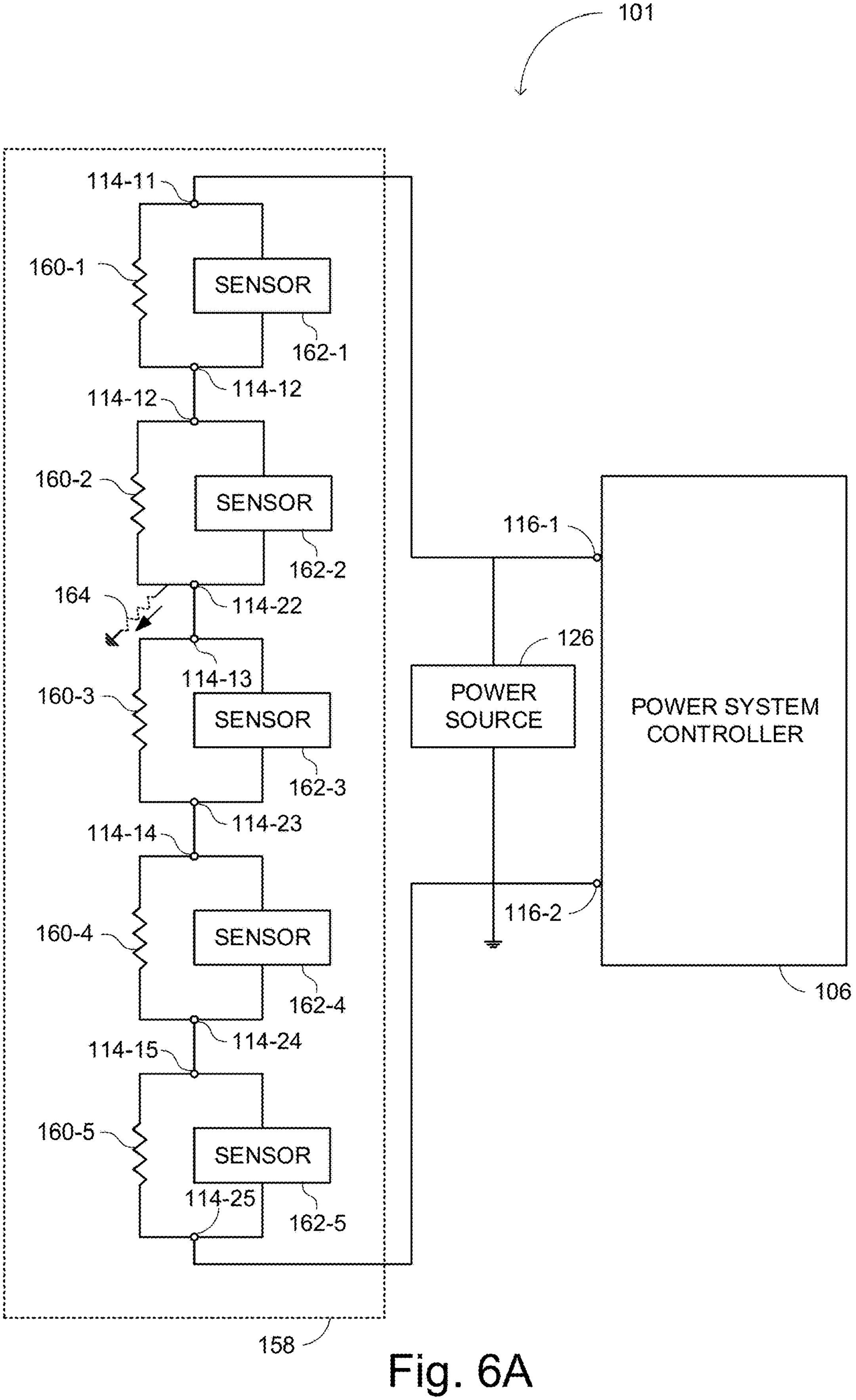
FIG. 6A shows another power system for detecting a ground fault in the serially connected power devices, which comprises a power source, external to a power system controller, applying a differential voltage to the serially connected power devices.
Figure 6B:
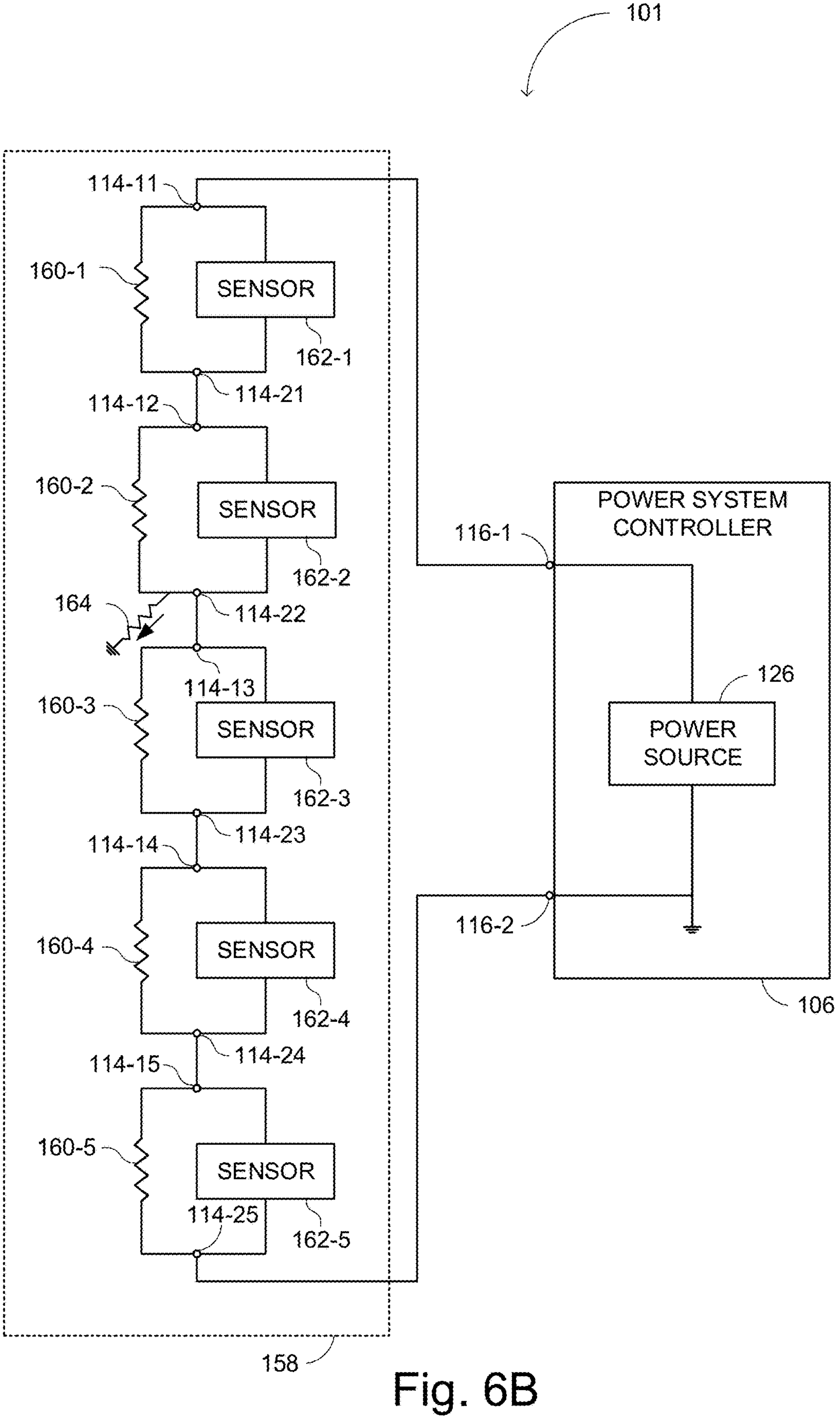
FIG. 6B shows another power system for detecting a ground fault in the serially connected power devices, which comprises a power source, internal to a power system controller applying a differential voltage to the serially connected power devices.
Figure 6C:
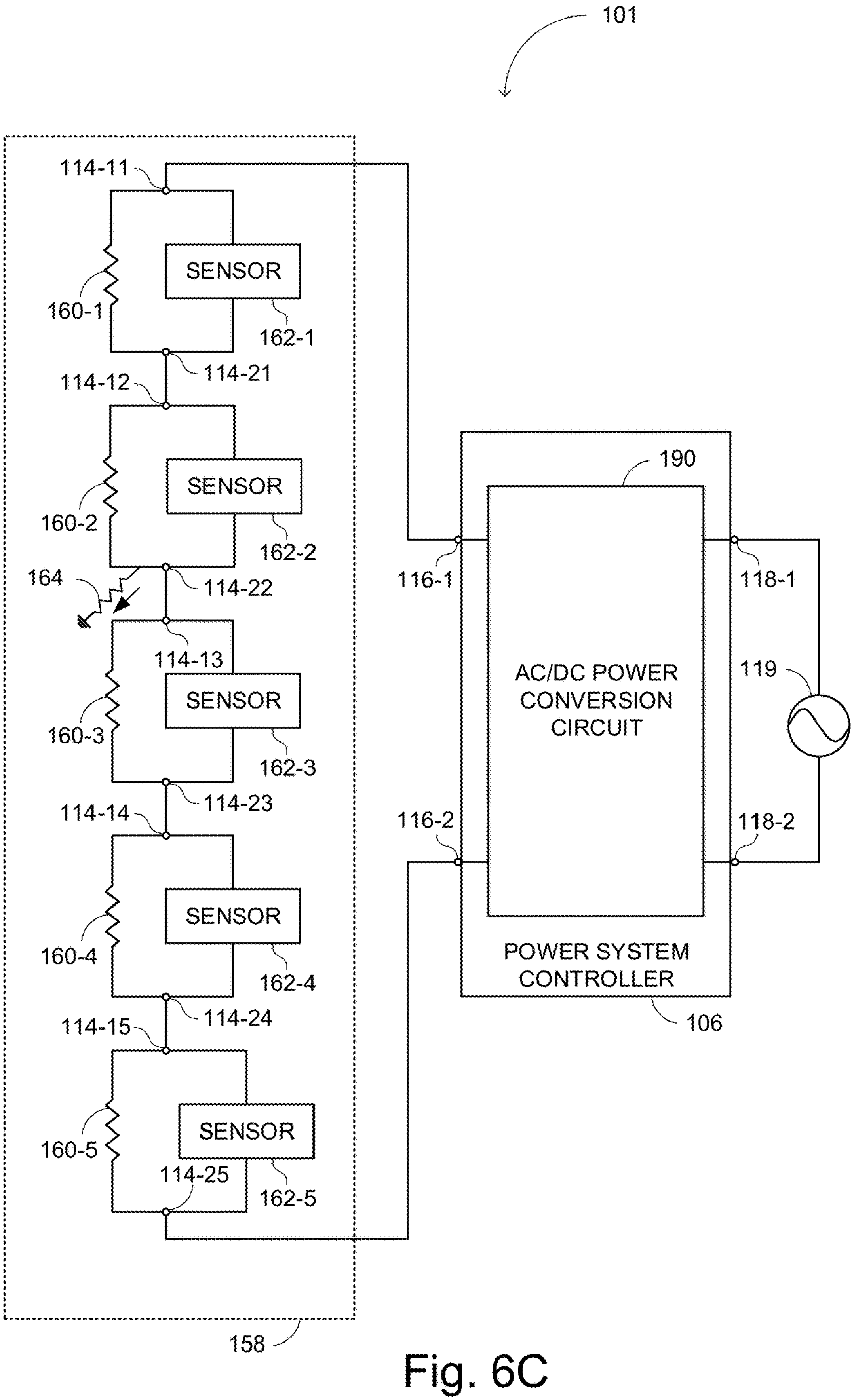
FIG. 6C shows another power system for detecting a ground fault in the serially connected power devices where the power source is a grid.

According to the disclosure herein, a voltage for ground fault detection in string 158 may be applied across the string 158 (e.g., between the terminals 116-1 and 116-2). For example, a power source may be coupled across the string 158 (e.g., between the terminal 114-11 and the 114-25). Reference is now made to FIGS. 6A-6C, which may show the power source 126 coupled between terminals 116-1 and 116-2, and thus across the string 158. Such a power source may be another string coupled in parallel with the string 158. The power source 126 may be an auxiliary power source, such as a fossil fuel type generator or a battery. The power source 126 may be external to the power system controller 106 (e.g., as may be shown in FIG. 6A), or internal to the power system controller 106 (e.g., as may be shown in FIG. 6B). As may be shown in FIG. 6C, the power source 126 may be grid 119, where a bidirectional Direct Current (DC)/Alternating Current (AC) power converter (inverter) 190 in the power system controller 106 may convert power from the grid 119 (e.g., AC power) to a voltage across the terminals 116-1 116-2 (e.g., DC power).

The power system controller 106 may control the power source 126 to apply a voltage across the string 158. Such a voltage may be referred to as differential voltage. In cases in which no ground fault has occurred, the voltage across each of the resistances 160-1-160-5, generated by the power sources 126, may divide across the resistances 160-1-160-5 based on the values of the resistances of the resistors. Therefore, in cases in which no ground fault has occurred, the voltage across each of resistances 160-1-160-5 may have a nominal value. In cases in which the resistance of the resistances 160-1-160-5 are equal, the corresponding nominal values may also be equal. Such a nominal value may be used as a reference. In cases in which a ground fault has occurred, such as the ground fault 164, the voltage across each of the resistances 160-1-160-5 may differ from the corresponding nominal value. For example, the sensors 162-1 and 162-2 may measure a voltage level across the corresponding resistances 160-1 and 160-2, which may be higher than the corresponding nominal values. The sensors 162-3 and 162-5 may measure across the corresponding resistances 160-3-160-5 another voltage which may be lower than the corresponding nominal values.

Each one of the power devices 102-1-102-5 may transmit to the power system controller 106 a signal indicating the measured voltage level across the corresponding terminals 114-1 and 114-2. The power system controller 106 may determine that a ground fault has occurred, as well as determine a location of the ground fault based on the received signals. The power system controller may determine the location of the ground fault based on a mapping of the location of the power devices 102-1-102-5 within string 158 relative to each other.

The example shown in FIGS. 6A and 6B refers to a single ground fault 164. In case of a single ground fault, the serially connected power devices 102-1-102-N may be divided into two groups based on the voltage across the respective terminals 114-1 and 114-2. In FIG. 6A, the first group is the power devices 102-1 and 102-2, and the second group is the power devices 102-3-102-5. If more than two ground faults occur, the power devices 102-3-102-N may be divided into N+1 groups where N is the number of faults. If system 101 comprises M strings connected in parallel, where M≥2, the power devices may divide into M*(N+1) groups based on the voltage across the respective terminals 114-1 and 114-2.

Figure 7A:
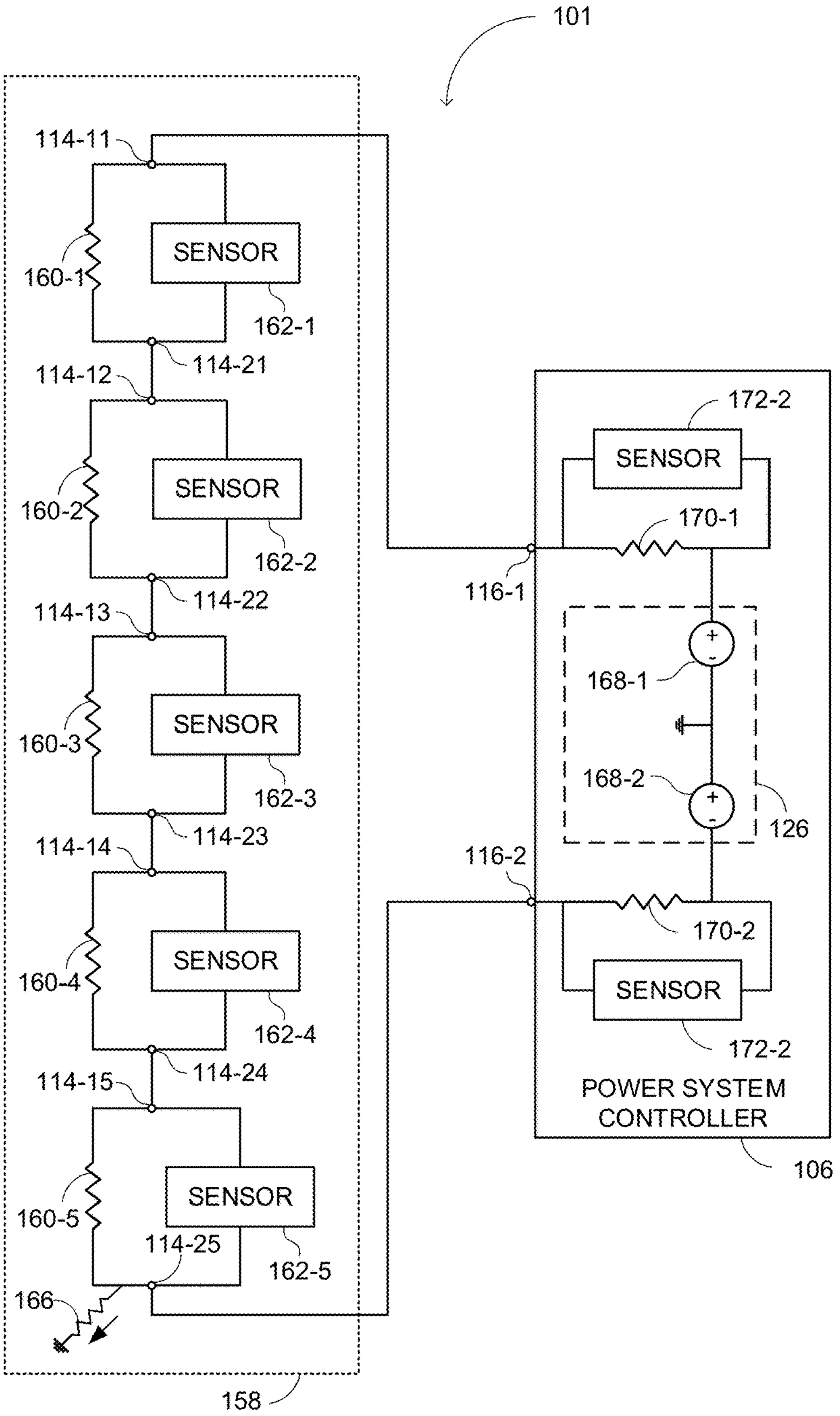
FIGS. 7A and 7B show power systems for detecting a ground fault in the serially connected power device, where the ground fault occurs at the end of serially connected power devices.
Figure 7B:
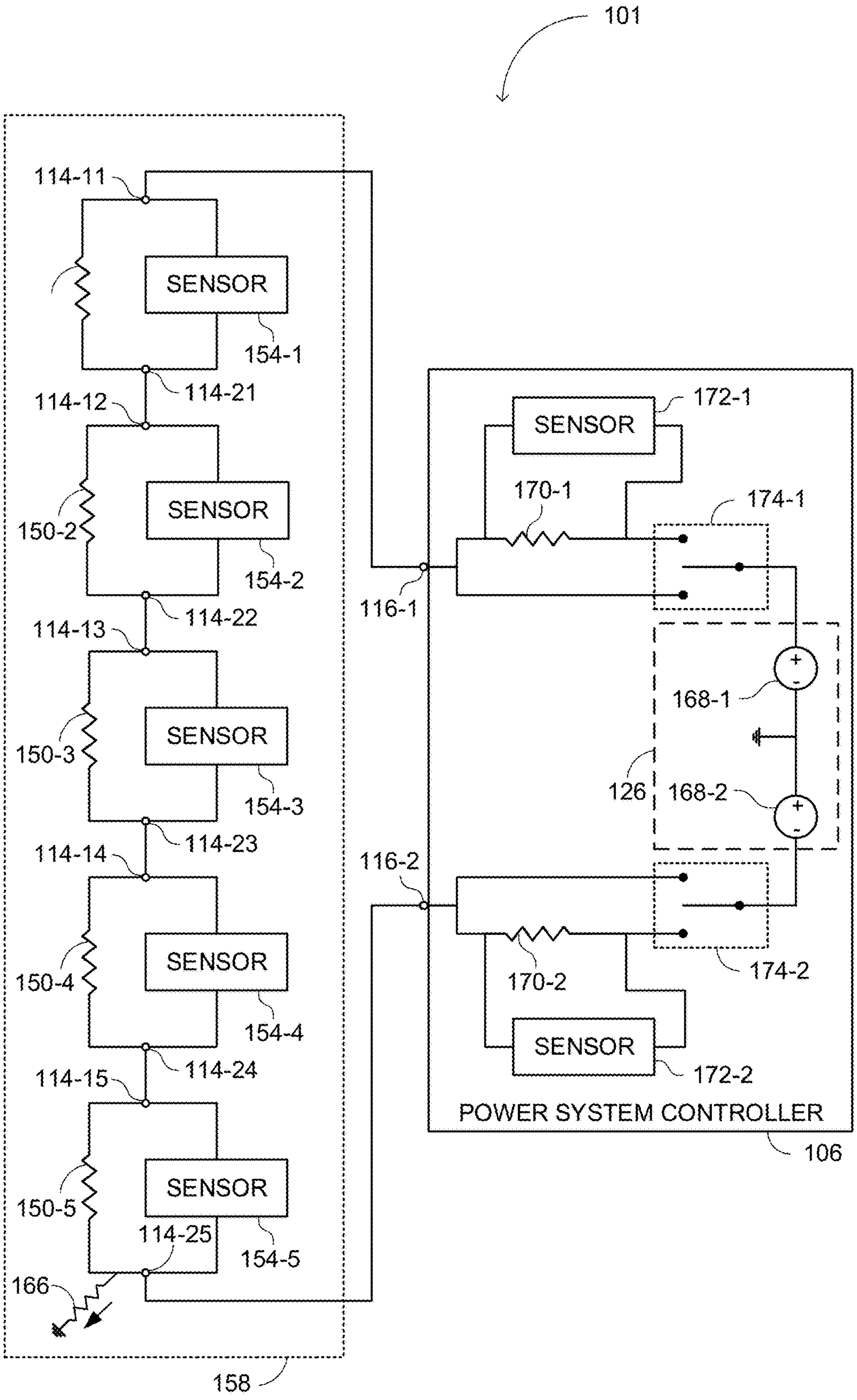

In some cases, a ground fault may occur at the end of string 158. Such a ground fault may not be detected since the ground fault may not affect the voltage across the terminals 114-1 and 114-2 of the power devices 102-1-102-N. Reference is made to FIGS. 7A and 7B, which may show a system 101, where a ground fault, such as ground fault 166, has occurred at the end of the string 158. In cases in which the power source 126 provides power across the string 158, the power source 126 may be modeled as two power sources 168-1 and 168-2, where a negative terminal of the power source 162-1 and a positive terminal of the power source 162-2 are coupled to ground. To detect the ground fault 166, the power system controller may comprise a resistor 170-1 and a resistor 170-2, a sensor 172-1, and/or a sensor 172-2. The resistor 170-1 and the sensor 172-1 may be coupled between the positive terminal of the power source 168-1 and the terminal 116-1. A negative terminal of the power source 168-1 may be coupled to the ground. The resistor 170-2 and the sensor 172-2 may be coupled between a negative terminal of the power source 168-2 and the terminal 116-2. A positive terminal of power source 168-1 may be coupled to the ground.

In FIGS. 7A and 7B, in cases in which no ground fault has occurred, the voltage across each of the resistances 160-1-160-5, 170-1, and 170-2, generated by the power sources 168-1, 168-2 may divide across resistances 160-1-160-5, 170-1, and 170-2 based on the values of these resistances. Therefore, in cases in which no ground fault has occurred, the voltage across each of resistances 160-1-160-5, 170-1, and 170-2 may have a nominal value. In cases in which the ground fault 166 has occurred, the voltage across each of the resistances 160-1-160-5, 170-1, and 170-2 may differ from the nominal value. For example, in cases in which the ground fault 166 has occurred, the voltage across the resistor 170-2 may increase, and the voltages across the resistances 160-1-160-5 and 170-1 may decrease. To determine if a ground fault, such as the ground fault 166, has occurred, the power system controller 106 may control the power source 126 to generate a voltage. The power system controller 106 may receive, from the sensor 172-1, measurements of the level of voltage across the resistor 170-1, and from the sensor 172-2, measurements of the level of voltage across the resistor 170-2. The power system controller 106 may receive, from the power devices 102-1-102-5, measurements of the level of voltage across the respective resistances 160-1-160-5. The power system controller 106 may determine that the ground fault 166 has occurred based on the level of voltages across the resistors 160-1-160-5, 170-1, and 170-2 being different from the corresponding nominal values.

Adding the resistors 170-1 and 170-2 may increase the power losses of the power system controller 106. According to the disclosure herein, and with reference to FIG. 7B, to alleviate the power losses due to the resistors 170-1 and 170-2, the power system controller may comprise the switches 174-1 and 174-2. Each of the switches 174-1 and 174-2 may be a single pole double throw switch (SPDT). A common terminal of the switch 174-1 may be connected to the positive terminal of the power source 168-1. The resistor 170-1 may be coupled between a first terminal of the switch 174-1 and the terminal 116-1. A second terminal of switch 174-1 may be coupled directly to the terminal 116-1. A common terminal of the switch 174-2 may be connected to the negative terminal of the power source 168-2. The resistor 170-2 may be coupled between a first terminal of the switch 174-2 and the terminal 116-1. A second terminal of the switch 174-2 may be coupled directly to the terminal 116-2. When conducting a ground fault test, the power system controller 106 may control the switch 174-1 to connect the resistor 170-1 to the positive terminal of the power source 168-1, and control the switch 174-2 to connect the resistor 170-2 to the negative terminal of the power source 168-2. Once the ground fault test is completed, the power system controller 106 may control the switch 174-1 to disconnect from the resistor 170-1 and connect the positive terminal of the power source 168-1 to terminal 116-1 (e.g., thus bypassing the resistor 170-1). Similarly, power system controller 106 may control the switch 174-2 to disconnect from the resistor 170-2 and connect the negative terminal of power source 168-1 to terminal 116-2 (e.g., thus bypassing resistor 170-2). In cases in which system 100 includes more than one string, then the power system controller may use more than one resistor, such as the resistors 170-1 and 170-2, and more switches (e.g., the switches 170-1 and 170-2) between the multiple strings.

According to the disclosure herein, prior to conducting a ground test, the system 100 or the system 101 may calibrate the reference values used to determine if ground faults have occurred. To that end, the power system controller 106 may conduct a system ground fault test, such as described above, in conjunction with step 200 in FIG. 1B. In cases in which the system ground fault test indicates that no ground fault occurs in the system, the power system controller transmits a signal to the power device 102 or to the power devices 102-1-102-N to measure the corresponding characteristic (e.g., current through the power conversion circuit 108, current through the bypass diode 111, voltage between the electrically conducting plate 158 and the terminal 114-2, the temperature of the power device 102, or the voltage across the terminals 114-1 and 114-2), and use these values as the various reference values. The power device 102 or the power devices 102-1-102-N may transmit one or more signals with these reference values to the power system controller 106.

Figure 8A:
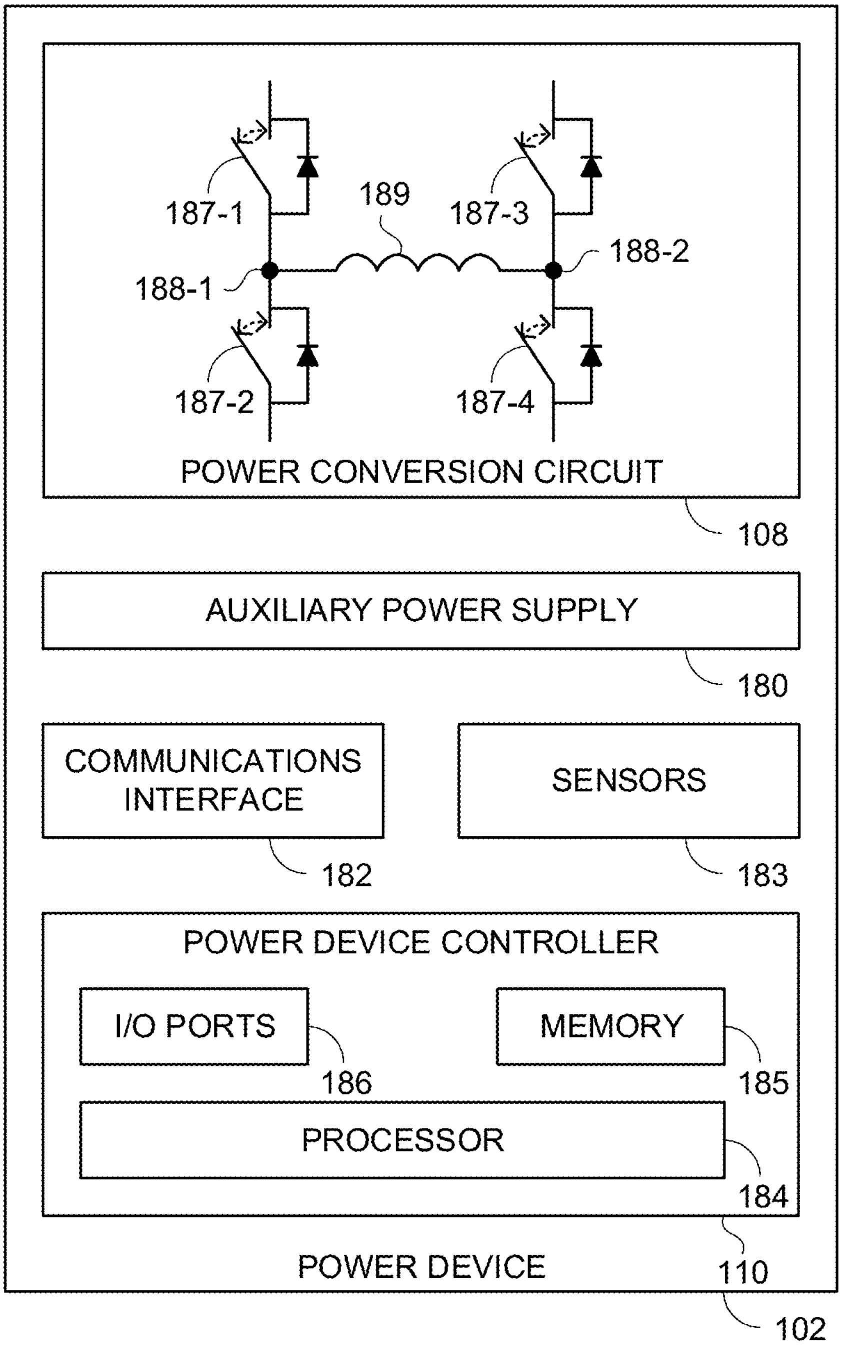
FIG. 8A shows a power device according to the disclosure herein.

Reference is now made to FIG. 8A, which may show the internal components of the power device 102. The power device 102 may comprise a controller 110, a power conversion circuit 108, an auxiliary power supply 180, a communications interface 182, and/or sensors 183. The controller 110 may comprise one or more processors (e.g., processor 184), memory 185, and/or input/output (I/O) ports 186.

The controller 110 may be partially or fully implemented as one or more computing devices or may include one or more processors, such as an Application Specific Integrated Circuit (ASIC) controller, Field Programmable Gate Array (FPGA) controller, a microcontroller, or a multipurpose computer. The memory 185 may store computer readable instructions as well as data (e.g., measurements from sensors 183 or parameters). The I/O ports 186 may be configured to connect modules (e.g., the sensors 183, the communication interface 182, the power conversion circuit 108) to the processor 184. The processor 184 may execute the instructions, which may result in the controller 110 performing one or more steps or functions as described herein that are attributed to one or both of the controller 110 and the processor 184.

Communications interface 182 may be a receiver, a transmitter, or a transceiver, and may be configured to communicate, based on a communications protocol, signals with one or more other transmitters, receivers or transceivers, over a medium. The communication protocol may define one or more characteristics of the signals and/or of communications using signals, such as a transmission frequency or frequencies, a modulation scheme (e.g., Amplitude shift keying—ASK, Frequency shift keying—FSK, Quadrature Phase Shift Keying—QPSK, Quadrature Amplitude Modulation—QAM, ON OFF keying—OOK), multiple access scheme (e.g., Time Division Multiple Access—TDMA, Frequency Division Multiple Access—FDMA, Code Division Multiple Access—CDMA, Carrier Sense Multiple Access—CSMA, Aloha), encoding/decoding schemes (e.g., Non Return to Zero—NRZ, Manchester coding, Block coding), or any other characteristic. The medium may be a wired or a wireless medium. For example, a wired medium may be a dedicated communications cable (e.g., twisted pair, coaxial cable). A wired medium may be power lines connecting power devices 102-1, 102-2, . . . , 102-N to the power system controller 106 (e.g., may also be referred to as Power Line Communications—PLC) in FIG. 8B. The communications interface 182 may be configured to communicate (e.g., transmit and/or receive signals) with the communications interface 193 of the power system controller 106 in FIG. 8B.

Referring back to FIG. 8A, the sensors 183 may comprise one or more voltage sensors, such as the voltage sensor 152 or the voltage sensors 162-1-162-N, which may be implemented by employing a resistive or capacitive divider, a resistive or capacitive bridge, or comparators. The sensors 183 may also comprise one or more current sensors, such as the current sensors 132 and 134, which may be implemented by employing a Current Transformer (CT) sensor, a Hall Effect sensor, or a zero-flux sensor, a current sense resistor. Additionally, the sensors 183 may comprise one or more temperature sensors, such as temperature sensor 154, which may be implemented as a thermistor or thermocouple.

The auxiliary power supply 180 may receive power from terminals 112-1 and 112-2 and/or from terminals 114-1 and 114-2 and may supply power to the various modules and components of power device 102.

The power conversion circuit 108 may be a switched mode power converter that uses switches (e.g., transistors, SCR, TRAICS) inductors and capacitors. For example, the power conversion circuit 108 may convert DC power from a first voltage level to a second voltage level. The power conversion circuit 108 may be a buck converter, a boost converter, a buck-boost converter (e.g., inverting buck-boost converter, non-inverting buck-boost converter, boost-buck converters), a flyback converter, a CUK converter, a SEPIC converter, or similar devices. For example, in FIG. 8A, converter 108 is shown as a non-inverting buck and boost converter, which may comprise switches 187-1, 187-2, 187-3, and 187-4. Switches 187-1 and 187-2 may be connected in series at a connection point 188-1. Switches 187-3 and 187-4 may be connected in series at a connection point 188-2. An inductor 189 may be connected between connection points 188-1 and 188-2.

Figure 8B:
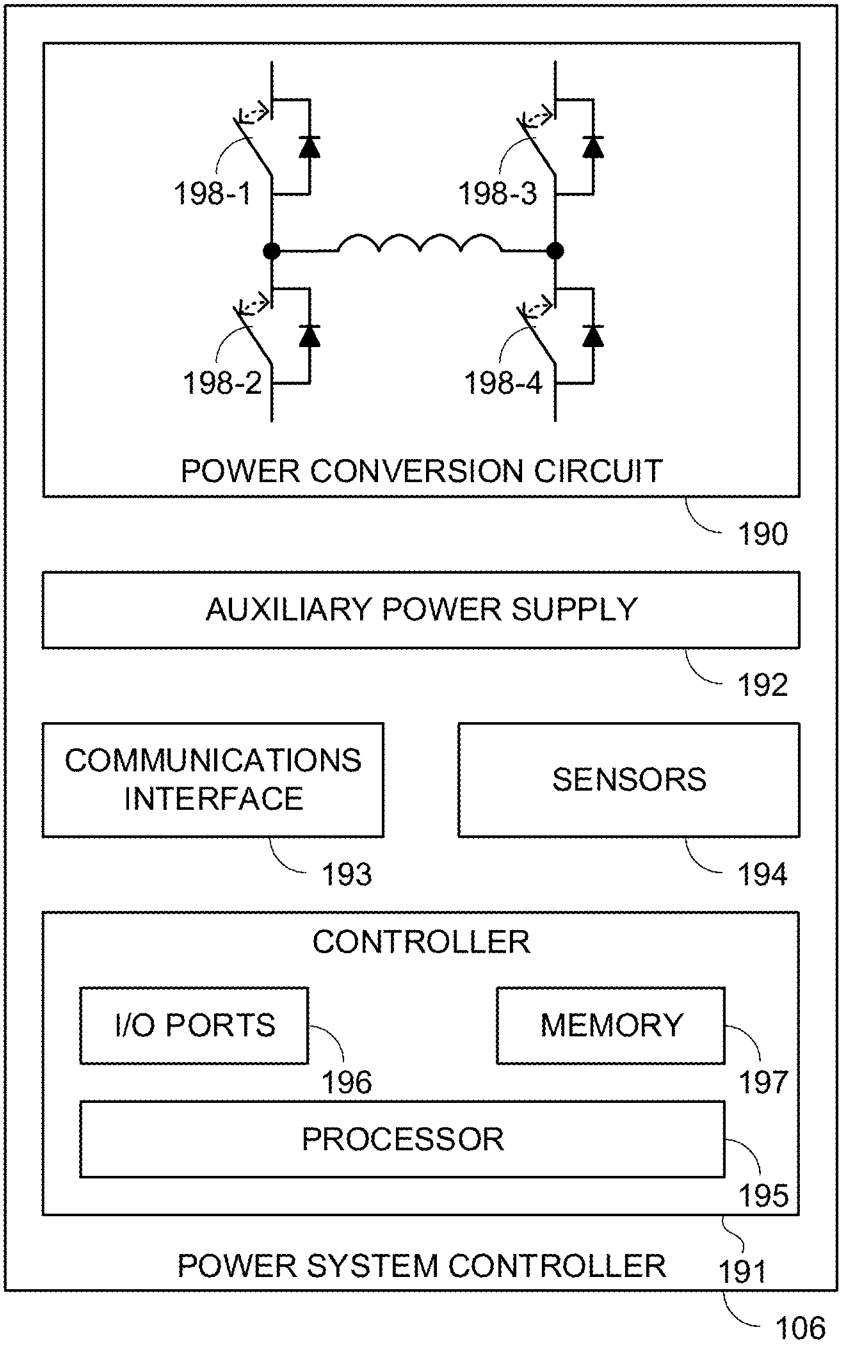
FIG. 8B shows a power system controller according to the disclosure herein.

Reference is now made to FIG. 8B, which shows the power system controller 106. The power system controller 106 may comprise a controller 191, a power conversion circuit 190, an auxiliary power supply 192, a communications interface 193, and/or sensors 194. The controller 191 may comprise one or more processors (e.g., processor 195), memory 197, and/or I/O ports 196.

The controller 191 may be partially or fully implemented as one or more computing devices or may include one or more processors, such as an Application Specific Integrated Circuit (ASIC) controller, Field Programmable Gate Array (FPGA) controller, a microcontroller, or a multipurpose computer. The memory 197 may store computer readable instructions as well as data (e.g., measurements from sensors 194 or parameters). The I/O ports 196 may be configured to connect modules (e.g., the sensors 194, the communication interface 193, or the power conversion circuit 190) to the processor 195. The processors 195 may execute the instructions, which may result in the controller 191 performing one or more steps or functions as described herein that are attributed to one or both of the controller 191 and the processor 195.

The communications interface 193 may be a receiver, a transmitter, or a transceiver and may be configured to communicate, based on a communications protocol, signals with one or more other transmitters, receivers, or transceivers over a medium. The communication protocol may define one or more characteristics of the signals and/or of communications using signals, such as a transmission frequency or frequencies, a modulation scheme (e.g., Amplitude shift keying—ASK, Frequency shift keying—FSK, Quadrature Phase Shift Keying—QPSK, Quadrature Amplitude Modulation—QAM, ON OFF keying—OOK), multiple access scheme (e.g., Time Division Multiple Access—TDMA, Frequency Division Multiple Access—FDMA, Code Division Multiple Access—CDMA, Carrier Sense Multiple Access—CSMA, Aloha), encoding/decoding schemes (e.g., Non Return to Zero—NRZ, Manchester coding, Block coding), or any other characteristic. The medium may be a wired or a wireless medium. For example, a wired medium may be a dedicated communications cable (e.g., twisted pair, coaxial cable). A wired medium may be power lines connecting power devices 102-1, 102-2, . . . , 102-N to the power system controller 106. Communications interface 193 may be configured to communicate (e.g., transmit and/or receive signals with communications interface 182 of power device 102-FIG. 8A).

The sensors 194 comprise one or more voltage sensors, which may be implemented by employing a resistive or capacitive divider, a resistive or capacitive bridge, or comparators. The sensors 194 may comprise one or more current sensors, which may be implemented by employing a Current Transformer (CT) sensor, a Hall Effect sensor, a zero-flux sensor, or a current sense resistor. The sensors 194 may comprise one or more temperature sensors, which may be implemented as a thermistor or thermocouple. Sensors 194 may comprise one or more humidity sensors.

The auxiliary power supply 192 may receive power from the terminals 119 via the terminals 118-1 and 118-2, and may supply power to the various modules and components of the power system controller 106. The power conversion circuit 190 may be a switched-mode power converter that uses switches (e.g., transistors, SCR, TRAICS), inductors, and/or capacitors. For example, the power conversion circuit 190 may convert DC power to AC power (e.g., a power inverter). The power converter 190 may comprise a half-bridge, a full-bridge (H-Bridge), a flying capacitor circuit, a cascaded-H-bridge, a Neutral Point Clamped (NPC), an A-NPC, or a T-type NPC inverting circuit employing two or more conversion levels. The controller 210 may control and monitor the power converter 190 by employing a pulse width modulation (PWM) signal. The power converter 190 may operate at a switching frequency between 1 KHz-10 MHz. For example, power converter 190 may operate at a switching frequency between 16 KHz-1 MHZ, (e.g., at frequencies which losses may be reduced). It is noted that during a ground fault test, such as described above in conjunction with FIGS. 5A-5C, 6A-6C, 7A-7B, the switches in power conversion circuit 190 may be controlled to be in a non-conducting state.

As mentioned above, and according to the disclosure herein, the power system controller 106 (FIGS. 4, 5A-5B, 6A-6C, 7A-7B) may determine a location of the ground fault based on a mapping of the locations of the power devices 102-1-102-N (e.g., relative to each other) within the string 148 in FIG. 4, or 158 in FIGS. 5A, 5B, 6A, 6B, 6C, 7A and 7B. According to the disclosure herein, a power system controller may determine such a mapping by using parasitic leakages of the photovoltaic panels 104-1-104-N.

Figure 9:
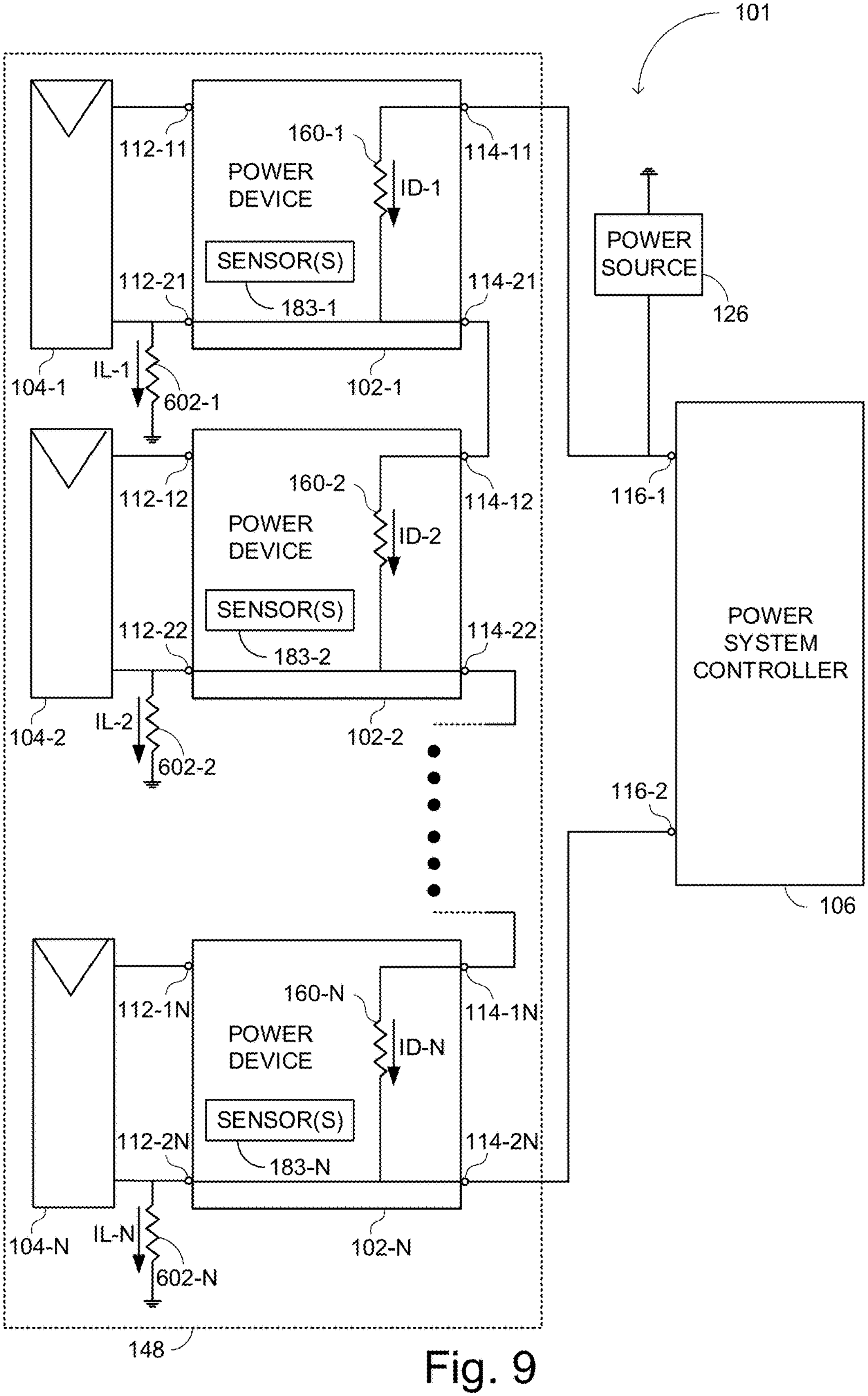
FIG. 9 shows a power system for mapping the locations of power devices in a serial string of power devices.

Reference is now made to FIG. 9, which may show aspects of a power system 101. For the sake of the clarity of FIG. 9 and of the explanations brought in conjunction therewith, details of the photovoltaic panels 104-1-104-N are not illustrated in FIG. 9. Shown in FIG. 9 are impedances 602-1-602-N (e.g., shown in FIG. 9 as resistances for the sake of clarity), which may represent equivalent parasitic impedances between corresponding photovoltaic panels 104-1-104-N and ground. It is noted that the equivalent parasitic impedances 602-1-602-N may not be ground faults but rather the parasitic characteristic of the photovoltaic panels 104-1-104-N, which may result in a parasitic leakage. The parasitic impedances 602-1-602-N may be any combination of resistive, capacitive, and inductive impedances. The power system controller 106 may use the effects of these parasitic leakages to map the order or location of the power devices 102-1-102-N (e.g., relative to each other) within the string 148.

The mapping of power devices described herein is based on measuring an electrical characteristic (e.g., voltage, current, power) that may be affected by the parasitic leakages. To verify that a measured electrical characteristic is indeed affected by parasitic leakage, prior to the mapping of the power devices 102-1-102-N, a test may be performed by the power system controller 106 that other leakages are not present in system 101. This preliminary test may be described further herein in conjunction with FIGS. 13A-13C. To determine the order of the power devices 102-1-102-N (e.g., relative to each other) within the string 148, the power source 126 may be connected to the terminal 116-1 of the power system controller 106 (e.g., via switches). Terminal 116-2 may be floating (e.g., disconnected). The controller 191 may control the power source 126 to generate a voltage at the terminal 116-1 of the power system controller 126. This voltage may cause a current to flow through the power devices 102-1-102-N in the string 148. This current may be depicted in FIG. 9 as ID-1-ID-N. However, some current may leak through the equivalent parasitic impedances 602-1-602-N. These currents are depicted in FIG. 9 as IL-1-IL-N. The current levels of the currents ID-1-ID-N may be different from each other. Thus, the voltage drops across equivalent resistances 160-1-160-N (e.g., between terminals 114-1 and 114-2 of the corresponding power device 102-1-102-N) may also be different from each other. In the example shown in FIG. 9, ID-1>ID-2> . . . >ID-N. This difference in the current levels may be used to determine the order of the power devices 102-1-102-N within the string 148. Also, the current levels of the current IL-1-IL-N through the parasitic impedances 602-1-602-N may be different from each other. If the equivalent resistances 160-1-160-N are equal or nearly equal, and the parasitic resistance 602-1-602-N of the photovoltaic panel 104-1-104-N are equal or nearly equal, the level of the current through each parasitic resistance 602-1-602-N may reduce such that IL-1>IL-2> . . . >IL-N. Thus, by measuring the level of an electrical characteristic relating to the parasitic leakage, the order or location of the power devices 102-1-102-N within string 148 may be determined. For example, sensor(s) 183 may measure a voltage across the equivalent resistance 160-1-160-N (e.g., by measuring the voltage level between terminals 114-1 and 114-2 of the corresponding power device 102-1-102-N). Alternatively, the sensor(s) 183 may measure a current through the equivalent resistance 160-1-160-N. Furthermore, the sensor(s) 183 may measure a voltage across the parasitic resistance 602-1-602-N, or a current through the parasitic resistance 602-1-602-N (e.g., by measuring the current level through the terminal 112-2 of the corresponding power device 102-1-102-N).

According to the disclosure herein, to map the locations of the power devices 102-1-102-N (e.g., relative to each other) within the string 148, the power system controller 106 may control the power source 126 to generate a voltage at the terminals 116-1. The power system controller 106 may transmit (e.g., via communications interface 193) a signal to the power devices 102-1-102-N to measure a level of an electrical characteristic relating to the parasitic leakages for mapping the locations of the power devices 102-1-102-N (e.g., relative to each other) within the string 148. Responsive to receiving the signal, the controllers 110 in the power devices 102-1-102-N may control the switches 187-3 and/or 187-4 in the power devices 102-1-102-N to a non-conducting state. The sensor(s) may measure a level of an electrical characteristic relating to the parasitic leakage. The controller 110 may receive the measurement from the sensor(s) 183, and may transmit, via the communications interface 182, a signal, which may comprise the level of the measured electrical characteristic, to the power system controller 106. The power system controller 106 may determine, after receiving the signals from the power devices 102-1-102-N, the location mapping of the power devices 102-1-102-N based on the levels of the measured electrical characteristic, where the power device 102-*i* with the highest measured electrical characteristic may be the first power device in the string from the direction of the terminal 116-1.

Figure 10:
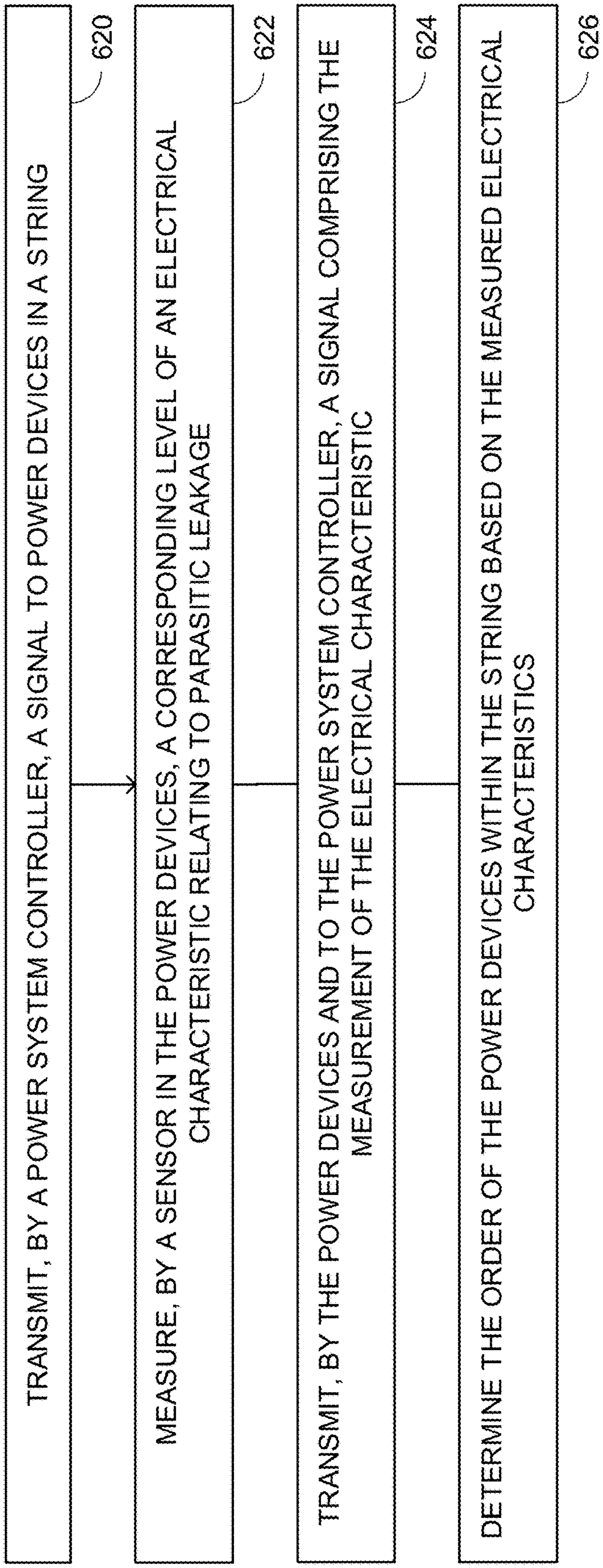
FIG. 10 shows an example method for mapping the locations of the power devices.

Reference is made to FIG. 10, which shows a method for mapping the order or the location of power devices (e.g., the power devices 102-1-102-N) in a string (e.g., the string 148 in FIG. 9). In step 620, the power system controller 106 (e.g., using the communications interface 193) may transmit a signal (e.g., a mapping signal) to the power devices 102-1-102-N in the string 148. The signal transmitted by the power system controller 106 may be a unicast signal, a multicast signal, and/or a broadcast signal. The power system controller 206 may sequentially or concurrently transmit a plurality of unicast signals to some or all of the power devices 102-1-102-N. The mapping signal may instruct the power devices 102-1-102-N to initiate mapping measurements of electrical characteristics as explained herein above and below.

In step 622, after receiving the signal of step 620, each of the power devices 102-1-102-N may measure (e.g., using sensor(s) 183) a corresponding level of an electrical characteristic relating to the parasitic leakage for mapping the location of power devices 102-1-102-N. As mentioned above, a sensor 183 of each of the power devices 102-1-102-N may measure a voltage across the corresponding one of the equivalent resistances 160-1-160-N (e.g., by measuring the voltage level between the terminals 114-1 and 114-2 of the corresponding power device 102-1-102-N). Additionally, or alternatively, the sensor 183 of each of the power devices 102-1-102-N may measure a current through the corresponding one of the equivalent resistances 160-1-160-N. Additionally, or alternatively, the sensor 183 of each of the power devices 102-1-102-N may measure a voltage across a corresponding one of the parasitic resistances 602-1-602-N. Additionally, or alternatively, the Sensor 183 of each of the power devices 102-1-102-N may measure a current through a corresponding one of the parasitic resistances 602-1-602-N (e.g., by measuring the current level through the terminal 112-2 of the corresponding power device 102-1-102-N).

In step 624, each of the power devices 102-1-102-N may transmit (e.g., using the communications interface 182 of the power device) to the power system controller 106 another signal, where this other signal comprises the measurement of the electrical characteristic relating to the parasitic leakage from step 624.

In step 626, the power system controller 106 may determine the order of the power devices 102-1-102-N within string 148 based on the electrical characteristics received relating to the parasitic leakage. For example, the power system controller 106 may determine the order and/or location of the power devices 102-1-102-N within the string 148 by determining that the power device with the highest measured electrical characteristic may be located closest to the power source 126, and thus closest to the terminal 116-1 (which may also be referred to as "top of the string"). Additionally, and/or alternatively, the power system controller 106 may determine that another power device with the second highest measured electrical characteristic is located second closest to the power source 126 and/or to the terminal 116-1. As described above, the levels of the current ID-1-ID-N and IL-1-IL-N may reduce along the string 148 from the terminal 116-1 (e.g., the current level may be larger closer to the power source 126 and/or to the terminal 116-1 and smaller when further away from the power source 126 and/or to the terminal 116-1).

Referring back to FIG. 9, the current level of ID-N or IL-N (e.g., the current level from the power device farthest away from the power source 126 and the terminal 116-1) may be small, and thus, the accuracy of the measurement may be reduced. To improve the accuracy of the measurements, the power system controller 106 may iteratively determine the order of power devices 102-1-102-N within the string 148. At the first stage of iteratively determining the order of power devices 102-1-102-N, the power system controller 106 may transmit a signal to all the power devices 102-1-102-N to measure the levels of an electrical characteristic. Responsive to receiving the signal from the power system controller 106, the controller 110 in a power device may control the switches 187-3 and 187-4 to a non-conducting state. Additionally, the sensor(s) 183 of the power device may measure a level of an electrical characteristic of the power device, where the measured electrical characteristics indicate the level of parasitic leakage of the power device (e.g., as described above in step 622-FIG. 10). The controller 110 of the power device may receive the measurement from sensor(s) 183 and may transmit, via the communications interface 182, a signal, which may indicate the level of the measured electrical characteristic relating to the parasitic leakage of the power device to the power system controller 106. The power system controller 106 may, after receiving the signals from the power devices 102-1-102-N, determine a power device (e.g., power device 102-*i*) with the highest measured level of the electrical characteristic relating to parasitic leakage is located closest to the power source 126 and thus to the terminal 116-1.

Figure 11A:
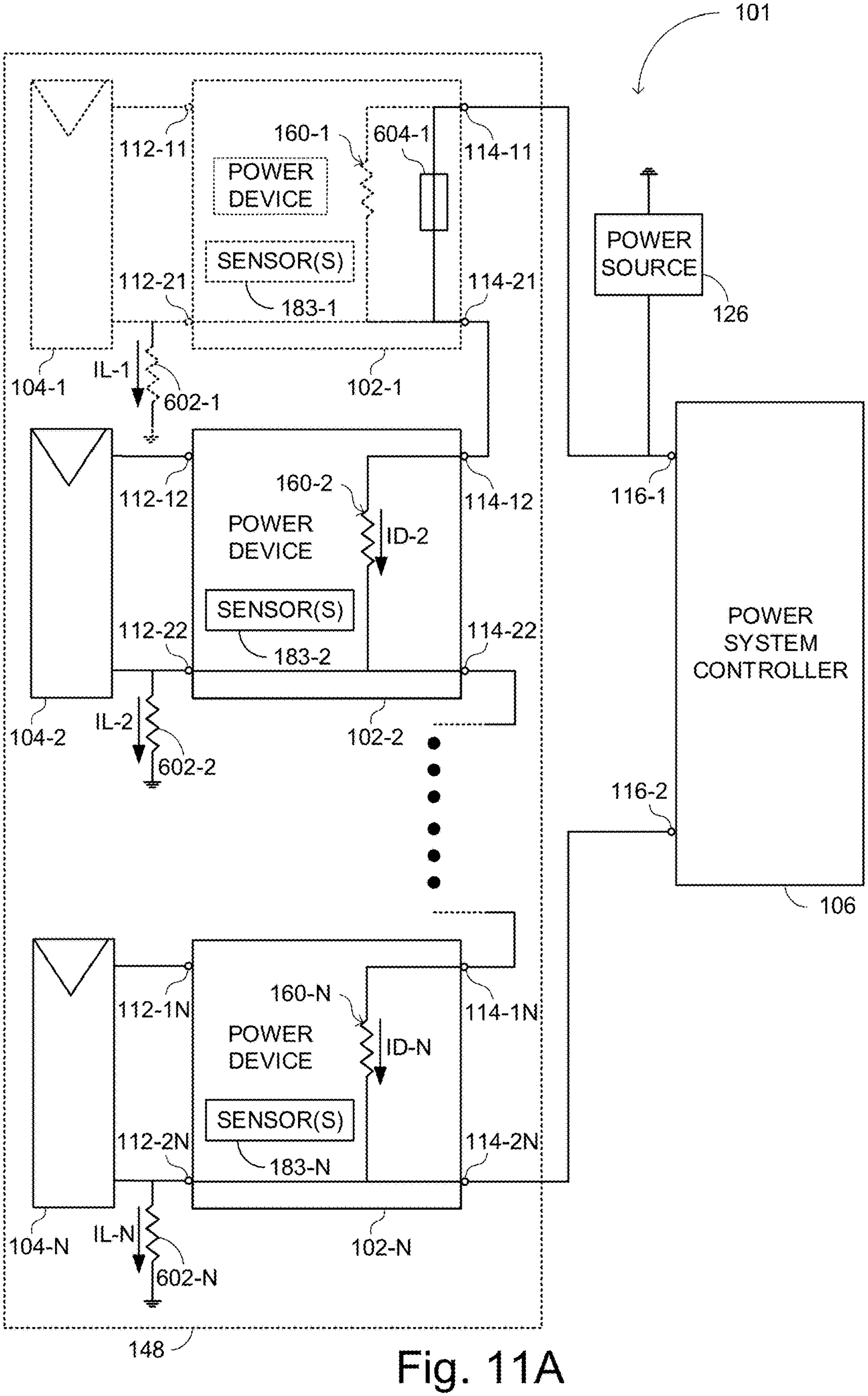
FIGS. 11A and 11B show a power system for iteratively mapping the locations of power devices in a serial string of power devices.
Figure 11B:
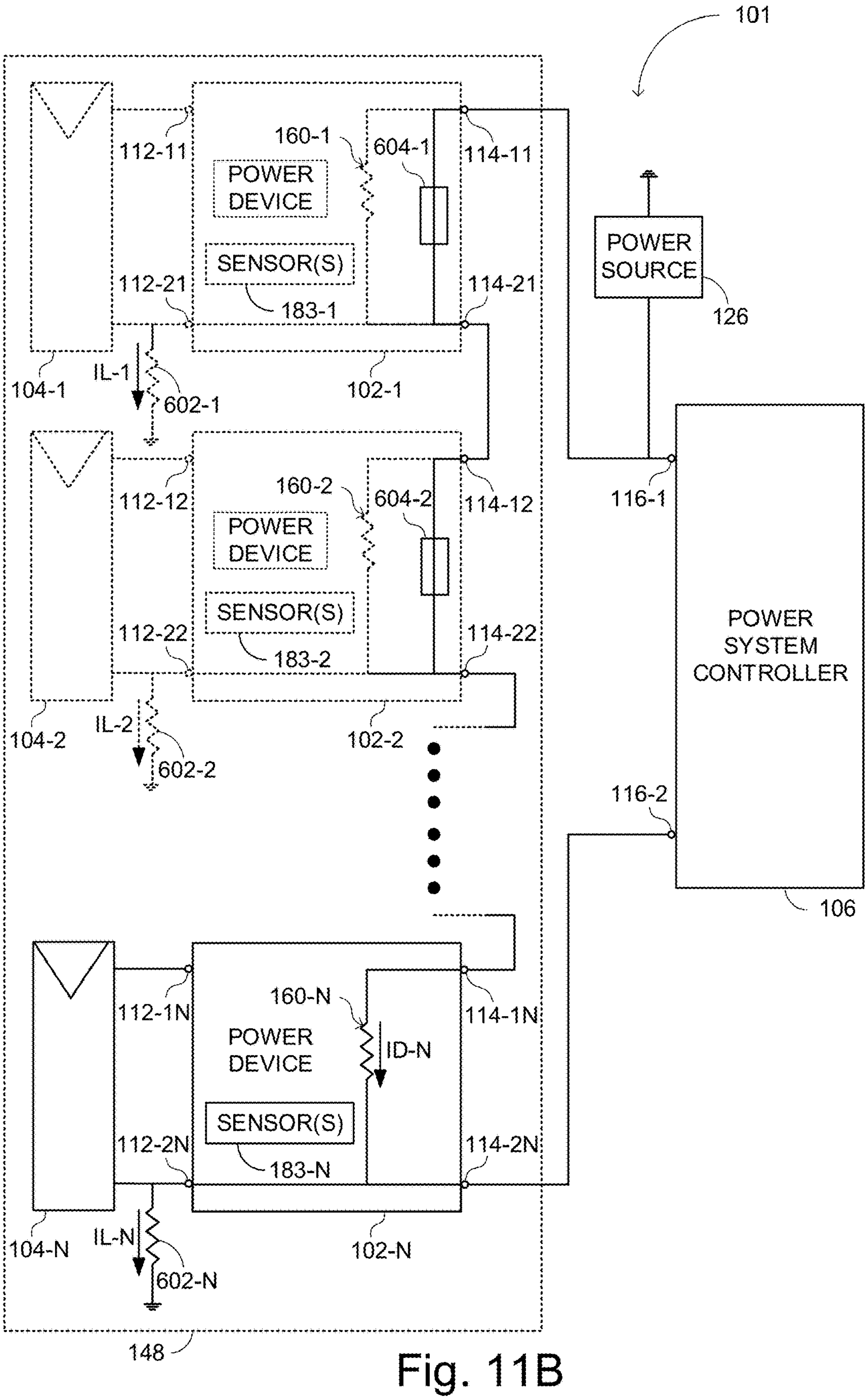

During a subsequent stage of iteratively determining the order of power devices 102-1-102-N, and referring to FIG. 11A, the power system controller 106 may transmit a signal to the power device 102-*i* (with the highest measured level of the electrical characteristic relating to parasitic leakage determined in the previous stage) to transition to a bypass mode. For example, the controller 110-*i* of the chosen power device 102-*i* may control the switches 187-3 and 187-4 of the power device 102-*i* to a conducting state, or the power device 102-*i* may comprise a bypass switch (e.g., a transistor), which may be controlled to connect the terminal 114-1 of the power device 102-*i* with the terminal 114-2 of the power device 102-*i*. In FIG. 11A, the power device 102-1 is shown to be in the bypass mode by using a bypass switch 604-1. The power system controller 106 may transmit a signal to the power devices 102-2-102-N (e.g., excluding power device 102-1) comprising instruction to measure the level of the electrical characteristics of the power devices 102-2-102-N relating to parasitic leakage. Responsive to receiving the signal, the controller of the power devices 102-2-102-N may control the switches 187-3 and 187-4 of the power devices to a non-conducting state. The sensor(s) 183 of the power devices 102-2-102-N may measure a level of the electrical characteristic relating to parasitic leakage. The controllers 110-2-110-N of the power devices 102-2-102-N may receive the measurement from the sensor(s) 183, and may transmit, via the communications interface 182 of the power devices 102-2-102-N, a signal, which may comprise the level of the corresponding measurement. The power system controller 106 may, after receiving the signals from the power devices 102-2-102-N, determine the power device 102-*j* with the highest measured level of electrical characteristic relating to parasitic leakage, and therefore the power device 102-*j* (e.g., the power device 102-2) is the second closest to the power source 126 and thus to the terminal 116-1. The power system controller 106 may transmit a signal to the power device 102-*j* (e.g., the power device 102-2) to transition to a bypass mode in addition to power device 102-*i* (e.g., the power device 102-1 determined in the first stage the iterative process). With reference to FIG. 11B, the power devices 102-1 and 102-2 are shown to be in bypass mode using the bypass switches 604-1 and 604-2, respectively. The power system controller 106 may repeat this process until the order and/or the location of the power devices 102-1-102-N within the string 148 have been determined.

In the example described above in conjunction with FIGS. 9 and 10, and the iterative mapping process described in conjunction with FIGS. 11A & 11B, power system controller 106 determines the location of power devices 102-1-102-N in string 148 by determining the order of power devices 102-1-102-N using a reducing order of the levels of measured electric characteristics (e.g., a voltage level between the terminals 114-1 and 114-2 of the corresponding power device 102-1-102-N). According to the disclosure herein, power system controller 106 may determine the location of power devices 102-1-102-N in string 148 using an increasing order of the levels of measured electric characteristics. For example, in cases in which power system controller 106 may determine the power device with the lowest measured electrical characteristic as being furthest away from terminal 116-1, the power device with the second lowest measured electrical characteristic as being the second furthest away from terminal 116-1 and so on.

Figure 12:
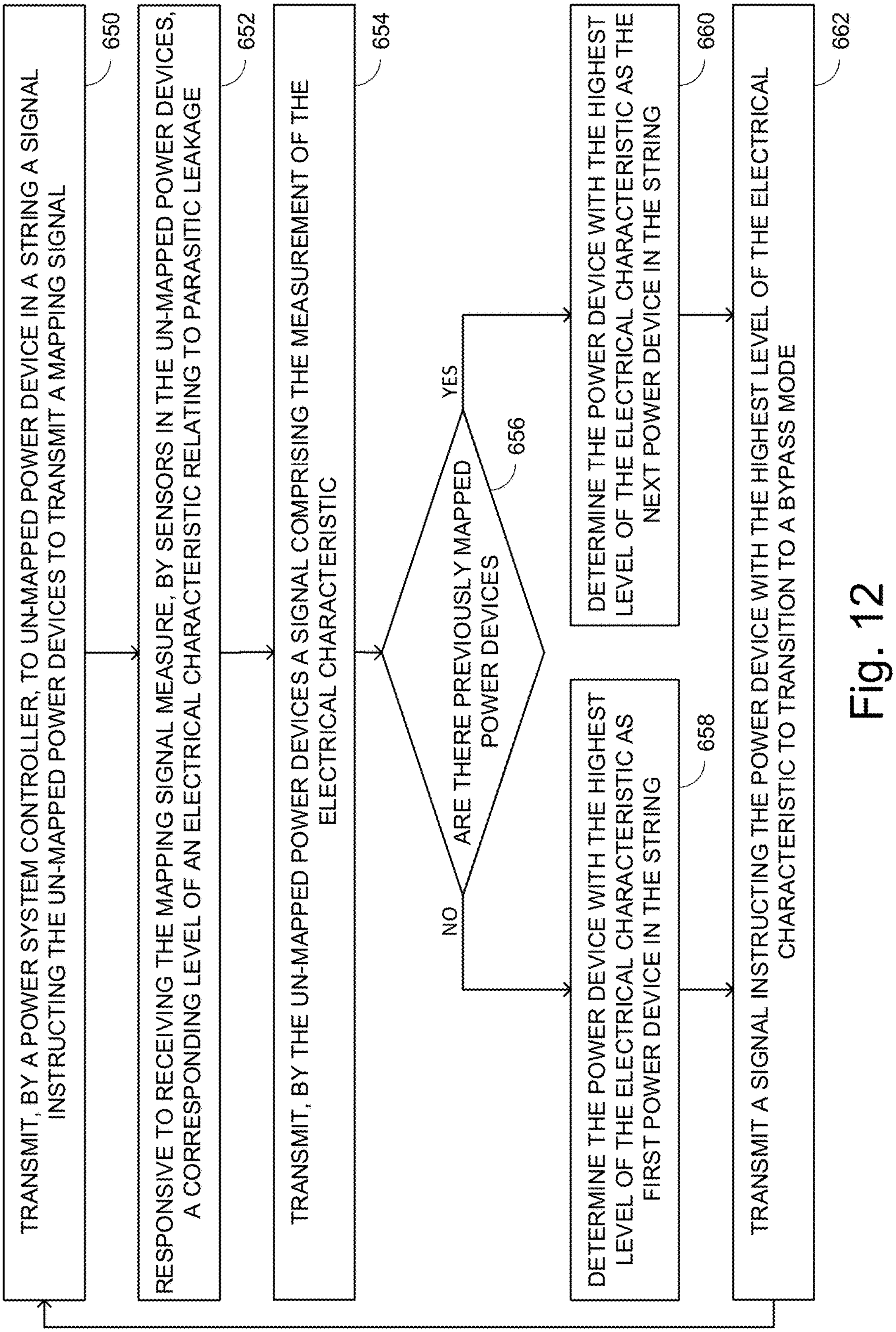
FIG. 12 shows an example method for iteratively mapping the locations of the power devices.

Reference is made to FIG. 12, which shows a method for mapping the order and/or locations of the power devices in a string of power devices. In step 650, the power system controller 106 may transmit (e.g., using communications interface 193) a signal to unmapped power devices of power devices 102-1-102-N in the string 148 (FIG. 9). The transmitted signal may provide power devices 102-1-102-N with instructions to initiate a mapping process. For example, the transmitted signal may comprise a request to the power devices 102-1-102-N to send a mapping signal back to the power system controller 106.

In step 652, responsive to receiving the signal from power system controller 106, one or more of the unmapped power devices 102-1-102-N in the string may measure (e.g., using sensor(s) 183) a corresponding level of an electrical characteristic of the power device. The level of electrical characteristics may indicate the level of parasitic leakage for the power device, and such data may be helpful for mapping the location of the power device.

In step 654, the unmapped power devices 102-1-102-N may transmit (e.g., using communications interface 182) to the power system controller 106 a signal comprising the measurement of the electrical characteristic relating to the parasitic leakage.

In step 656, the power system controller 106 may determine if there are any previously mapped power devices. For example, the power system controller 106 may store (e.g., in memory 197) an order list of the mapped power devices. In cases in which the list is empty, the power system controller 106 may determine that there are no previously mapped power devices, and the method may proceed to step 658. In cases in which the list is not empty, the power system controller 106 may determine that there are previously mapped power devices, and the method may proceed to step 660.

In step 658, the power system controller 106 may determine that the power device with the highest level of electrical characteristic is the first power device in the string. The first power device may be the closest power device to the power source 126. For example, the power system controller 106 may determine that the power device 102-*i* with the highest measured electrical characteristic is the first power device in the string 148. The power system controller 106 may add the power device 102-*i* as the first power device in the list. After step 658, the method may proceed to step 662.

In step 660, the power system controller 106 may determine that the power device with the highest level of electrical characteristic is the next power device in the string closest to the power source 126. For example, the power system controller 106 may determine that the power device 102-*j* with the highest measured electrical characteristic is the next power device in the string 148. The power system controller 106 may add the power device 102-*j* to the list.

In step 662, the power system controller 106 may transmit a signal instructing the power device with the highest level of the electrical characteristic to transition to a bypass mode.

It is noted that iteratively determining the power device with the highest leakage current level, one at a time, is brought herein as an example. The determination of the order of the power devices may be performed two at time, three at a time, or any other selected number of power devices. As mentioned above, prior to mapping the power devices 102-1-102-N within the string 148, the power system controller 106 may verify that no leakages are present in the system 101. Therefore, the power system controller 106 may perform a preliminary leakage test.

Figure 13A:
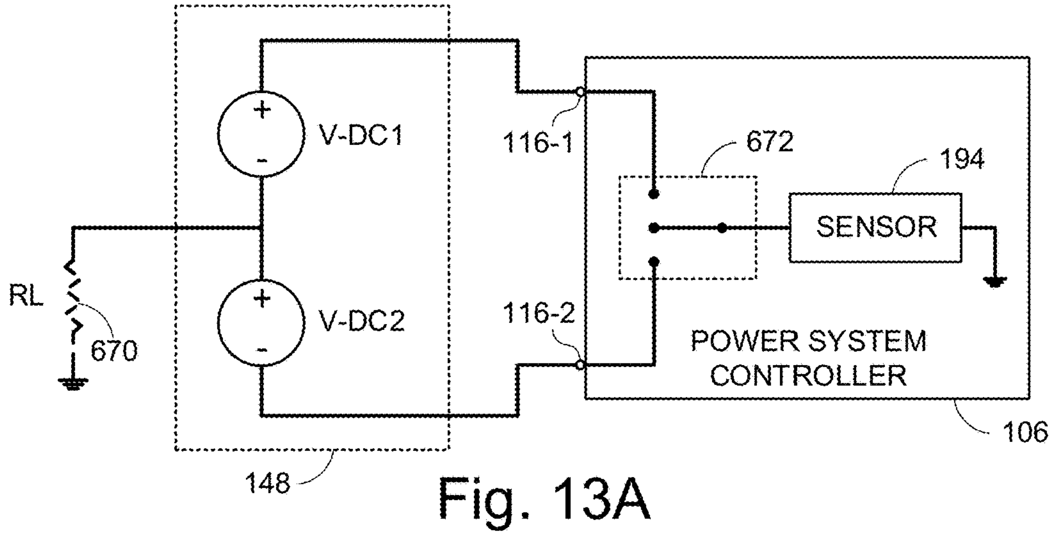
FIGS. 13A, 13B, and 13C show a power system for performing a preliminary leakage test.
Figure 13B:
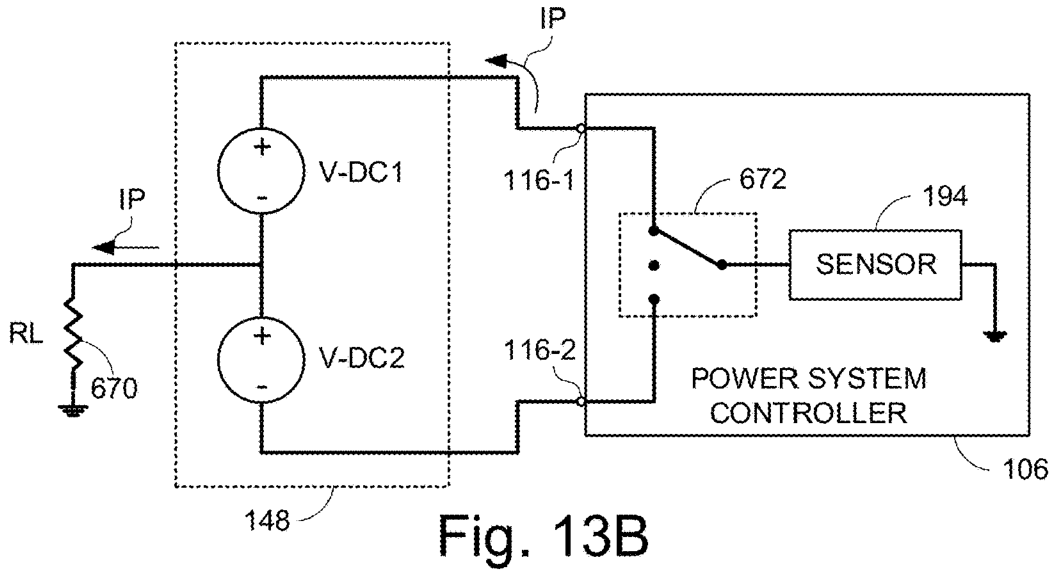
Figure 13C:
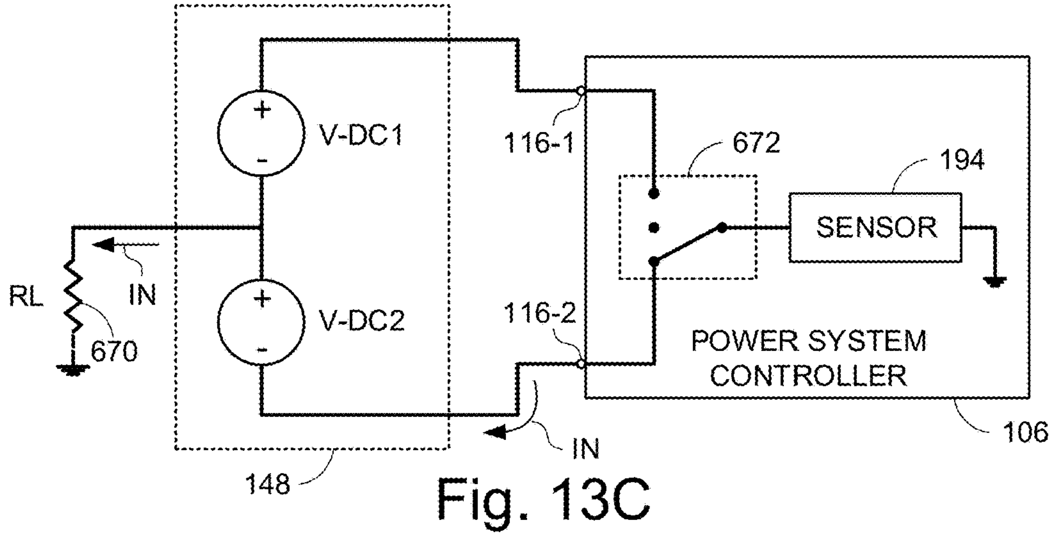

Reference is now made to FIGS. 13A-13C, which may show aspects of system 101 in which detection of a leakage or leakages in system 101 may be detected. Some aspects of system 101 are omitted from FIGS. 13A-13C for the sake of the clarity of the Figures. In FIGS. 13A-13C, the string 148 is modeled as two DC voltage sources, V-DC1 and V-DC2, where the sum of V-DC1 and V-DC2 (V-DC1+V-DC2) is the string voltage, VDC. Power system controller 106 may transmit a signal or signals to power devices 102-1-102-N, so that each generates a determined voltage, where the sum of the determined voltages is VDC. The string 148 may have a leakage, which may be modeled by a leakage resistance RL 670. The DC voltage sources V-DC1 and V-DC2 may model the voltages generated by two groups of power devices of the plurality of power devices 102-1-102-N. For example, a first group of power devices may comprise X power devices, e.g., 102-1-102X, and be modeled as the voltage source V-DC1. The second group of power devices may comprise N-X power devices, e.g., 102-(X+1)-102N, and modeled as the voltage source V-DC2. The actual voltage level modeled by each of the voltage sources V-DC1 and V-DC2 may depend on the voltage level generated by each of the power devices 102-1-102-N and the location of the leakage in the string 148 (e.g., between the power device 102-X and the power device102-(X+1). The power system controller 106 may comprise a single pole triple throw switch 672, which may be controlled by the controller 191 to be in three different states. In the first state, the single pole triple throw switch 672 may be disconnected from the terminals 116-1 and 116-2. In the second state, the single pole triple throw switch 672 may connect the terminal 116-1 to the ground, while in the third state, the single pole triple throw switch 672 may connect the terminal 116-2 to the ground. Single pole triple throw switch 672 may be implemented using discrete components such as transistors and/or diodes (e.g., two or more transistors connected either at the drains or the sources of the transistors). Single pole triple throw switch 672 may be implemented using integrated components.

According to the disclosure herein, prior to the leakage test, and as shown in FIG. 13A, the switch 672 may be in a disconnect state. To conduct the leakage test, as shown in FIG. 13B, the power system controller 106 may control the switch 672 to connect the terminal 116-1 to the ground. The sensor 194 may measure the current, IP, flowing through the terminal 116-1. The power system controller 106 may then control the switch 672 to connect the terminal 116-2 to the ground, as shown in FIG. 13C, the sensor 194 may measure the current, IN, flowing through the terminal 116-2. If no leakage occurs in system 100, both IP and IN will be zero. The power system controller 106 may determine if a leakage occurs in system 100 by determining the value of the leakage resistance, RL, according to:

$$RL = \frac{VDC}{IP - IN} \tag{1}$$

As can be inferred from Equation (1), if no leakage occurs in system 101, the value of RL will be large. According to the disclosure herein, the power system controller 106 may determine that leakage occurs in the system 101 if the value of RL is lower than a determined value. The power system controller 106 may proceed to determine the location of the leakage using any of the methods and/or processes described in the disclosure herein.

Aspects of the disclosure described above regarding the mapping of the locations of the power devices 102-1-102-N (e.g., relative to each other) within the string 148 or 158 may require that the equivalent resistances 160-1-160-N are equal or nearly equal, and/or that the parasitic resistances 602-1-602-N of the photovoltaic panel 104-1-104-N are equal or nearly equal. According to the disclosure herein, the mapping of the locations of the power devices 102-1-102-N may be achieved even if equivalent resistance 160-1-160-N are not equal, or if parasitic impedances 602-1-602-N are not equal.

Figure 14A:
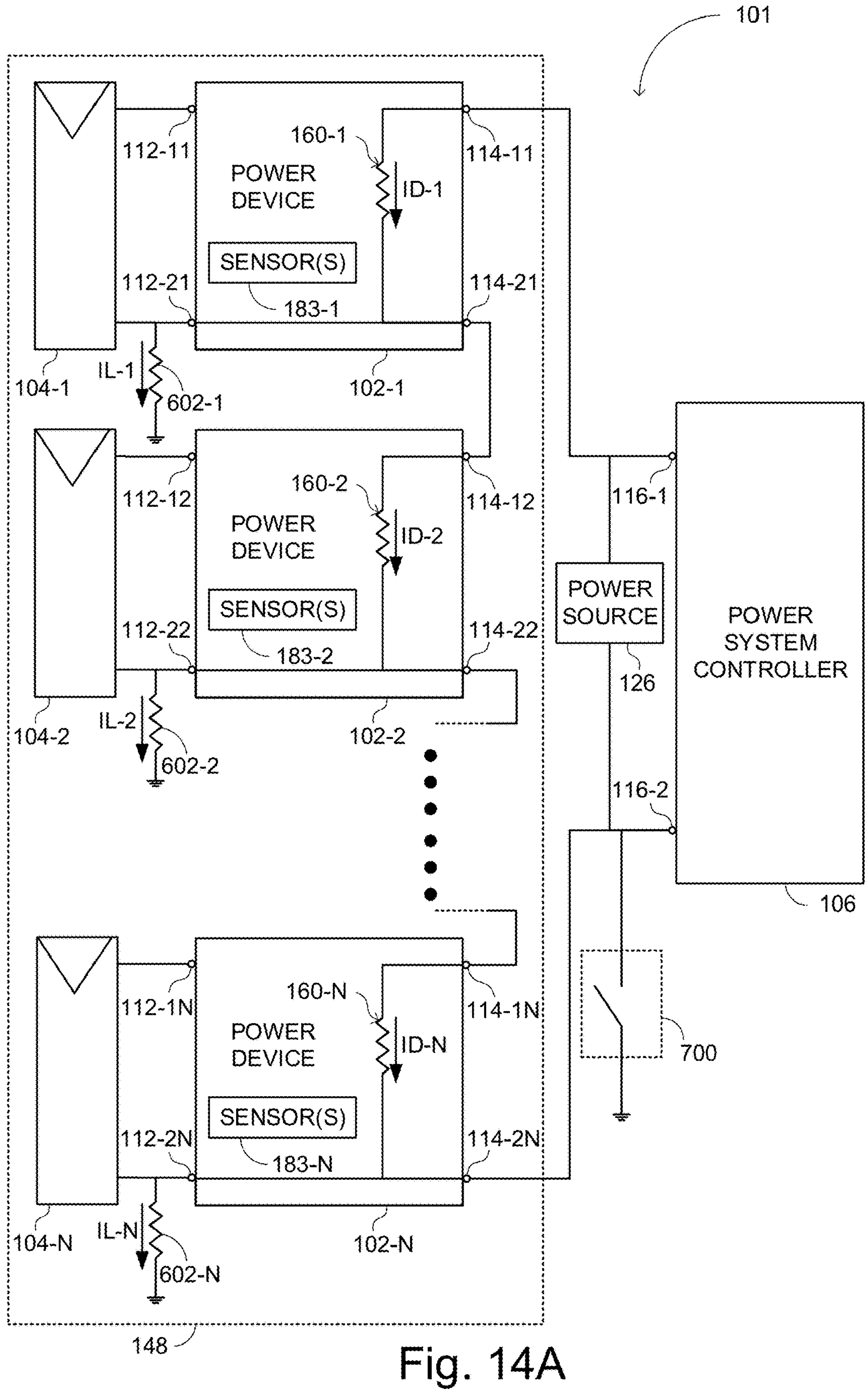
FIGS. 14A, 14B, and 14C show another power system for mapping the locations of power devices in a serial string of power devices.
Figure 14B:
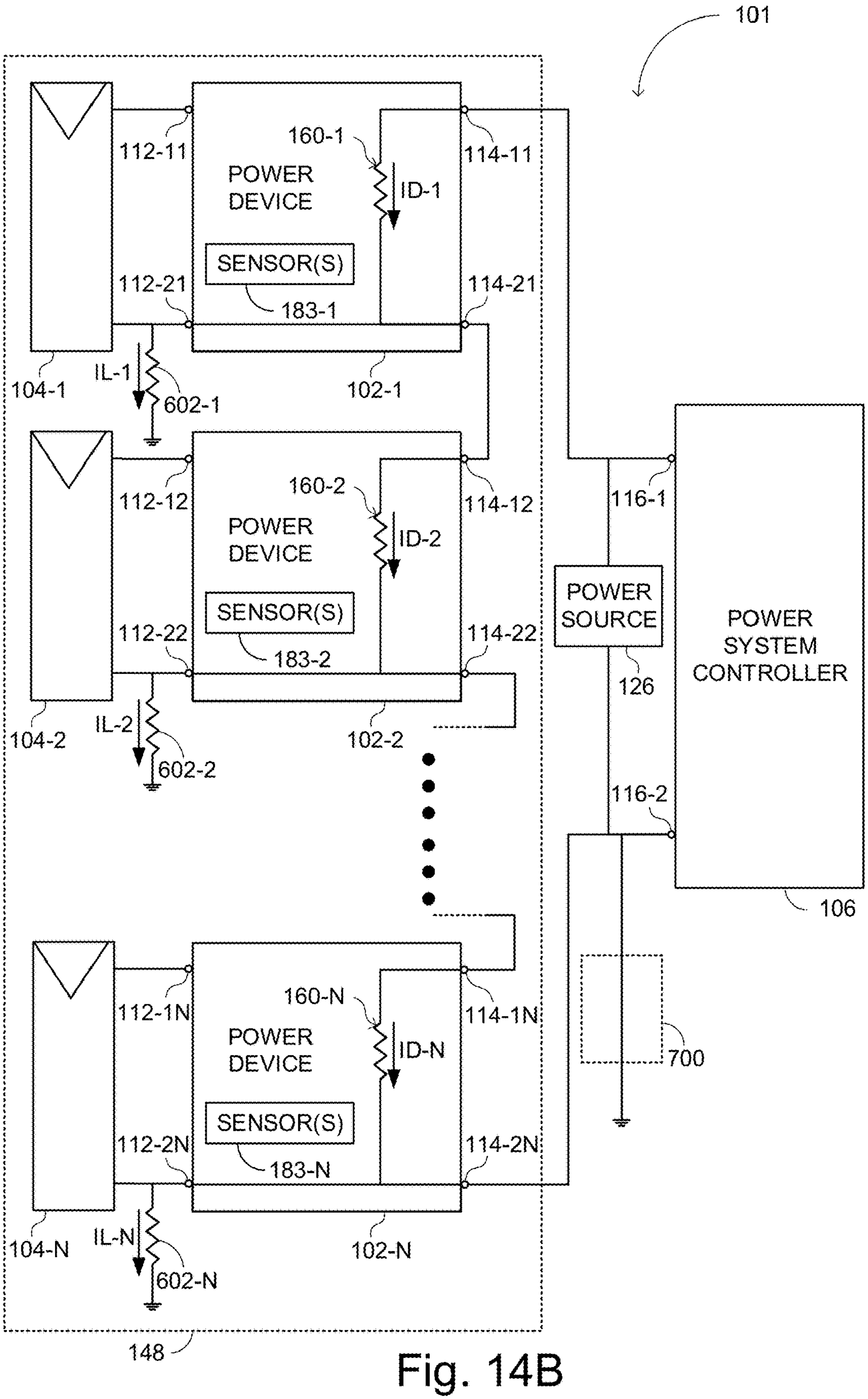
Figure 14C:
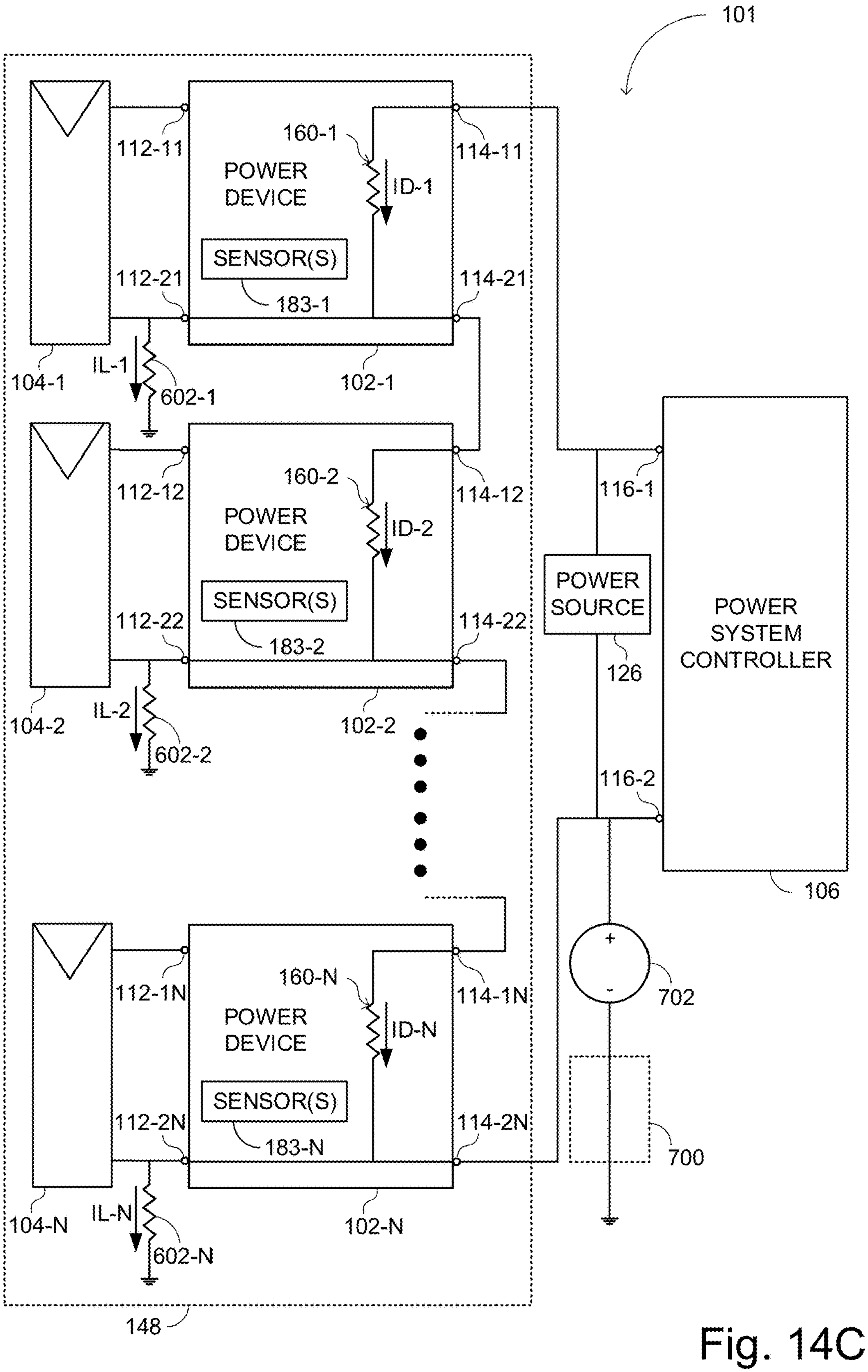

Reference is made to FIGS. 14A-14C, which may show aspects of a power system 101. For the sake of the clarity of FIGS. 14A-14C, and of the explanations brought in conjunction therewith, the photovoltaic panels 104-1-104-N are not illustrated in the figures. As shown in FIGS. 14A-14C, the power source 126 may be coupled between the terminals 116-1 and 116-2, and thus across the string 148. The system 101 may further comprise a switch 700. In the example shown in FIGS. 14A-14C, the switch 700 may be coupled between the terminal 116-2 of the power system controller 106 and ground. For example, switch 700 may be implemented as one or more transistors or relays. In cases in which one or more transistors or relays are used, the transistors or relays may be connected in series, parallel, or a combination of series and parallel connections. In some cases, additional components (e.g., resistors and/or capacitors) may be connected in series or in parallel with switch 700.

To map the locations of the power devices 102-1-102-N (e.g., relative to each other) within the string 148, the power system controller 106 may control the power source 126 to generate a voltage across the string 148 (e.g., such that the voltage at terminal 116-1 is higher than the voltage at the terminal 116-2—referred to herein as "positive polarity"). With reference to FIG. 14A, the power system controller 106 may control the switch 700 to a non-conducting state, thus disconnecting the string 148 from the ground (e.g., isolating string 148 from the ground). The power system controller 106 may transmit a first signal to the power devices 102-1-102-N to measure a level of an electrical characteristic relating to parasitic leakage in order to map the locations of the power devices 102-1-102-N in the string 148. Responsive to receiving the signal, the controller 110 of the power devices 102-1-102-N may control the switches 187-3 and 187-4 of the power devices to a non-conducting state. The sensor(s) 183 may measure a first level of an electrical characteristic relating to parasitic leakage (e.g., as described above in step 625 of FIG. 10). The controller 110 may receive the measurement from the sensor(s) 183, and may transmit, via communications interface 182, a signal, which may comprise the first level of the measured electrical characteristic, to the power system controller 106. Since the string is not grounded, no current will flow through the parasitic leakages 602-1-602-N, since there may be no return path for the current through ground. Any differences in the levels of the measured electrical characteristic are due to the differences in equivalent resistances 160-1-160-N.

With reference to FIG. 14B, the power system controller 106 may control the switch 700 to a conducting state, thus connecting the string 148 to the ground. The power system controller 106 may transmit a second signal to the power devices 102-1-102-N to measure a second level of the electrical characteristic relating to the parasitic leakage. Responsive to receiving the signal, the sensor(s) 183 of the power devices 102-1-102-N may measure a second level of the electrical characteristic relating to the parasitic leakage. The controllers 110 of the power devices 102-1-102-N may receive the measurement from the sensor(s) 183 and/or may transmit, via the communications interfaces 182, signals, which may comprise the second levels of the measured electrical characteristics, to the power system controller 106. Since the string is grounded, current will flow through the parasitic leakages 602-1-602-N, since there may be a return path for the current through ground. Any differences in the levels of the measured electrical characteristic are due to the differences in equivalent resistances 160-1-160-N and parasitic leakages 602-1-602-N.

The power system controller 106 may determine a ratio between the first level of the measured electrical characteristic and the second level of the measured electrical characteristic for each of the power devices 102-1-102-N. The power system controller 106 may determine the order of the power devices 102-1-102-N within the string 148 by determining that the power device 102-*i* with the highest ratio is located the closest to the terminal 116-1, and/or the power device 102-*j* with the second highest ratio is located second closest to the terminal 116-1, and so on.

In some cases, the currents, and therefore, the voltages resulting from parasitic leakages, may be small, such that the measurements thereof may be prone to errors. To reduce the measurement errors, according to the disclosure herein, during the second measurement phase (e.g., as described in conjunction with FIG. 14B), the voltage of the terminal 116-2 may be raised above the ground potential by a determined voltage level using a voltage source. For example, with reference to FIG. 14C, the power system 101 may comprise a voltage source 702, which may be coupled between the terminal 116-2 and the switch 700. The voltage source 702 may alternatively be coupled between the switch 700 and the ground. When the power system controller 106 controls the switch 700 to a conducting state, the power system controller 106 also controls the voltage source 702 to generate a voltage, thus increasing the voltage of the string above the ground potential, which may result in larger currents flowing through the parasitic impedances 602-1-602-N, and/or through the equivalent resistances 160-1-160-N. Larger currents, and thus larger voltage may be less prone to measurement errors.

Figure 15:
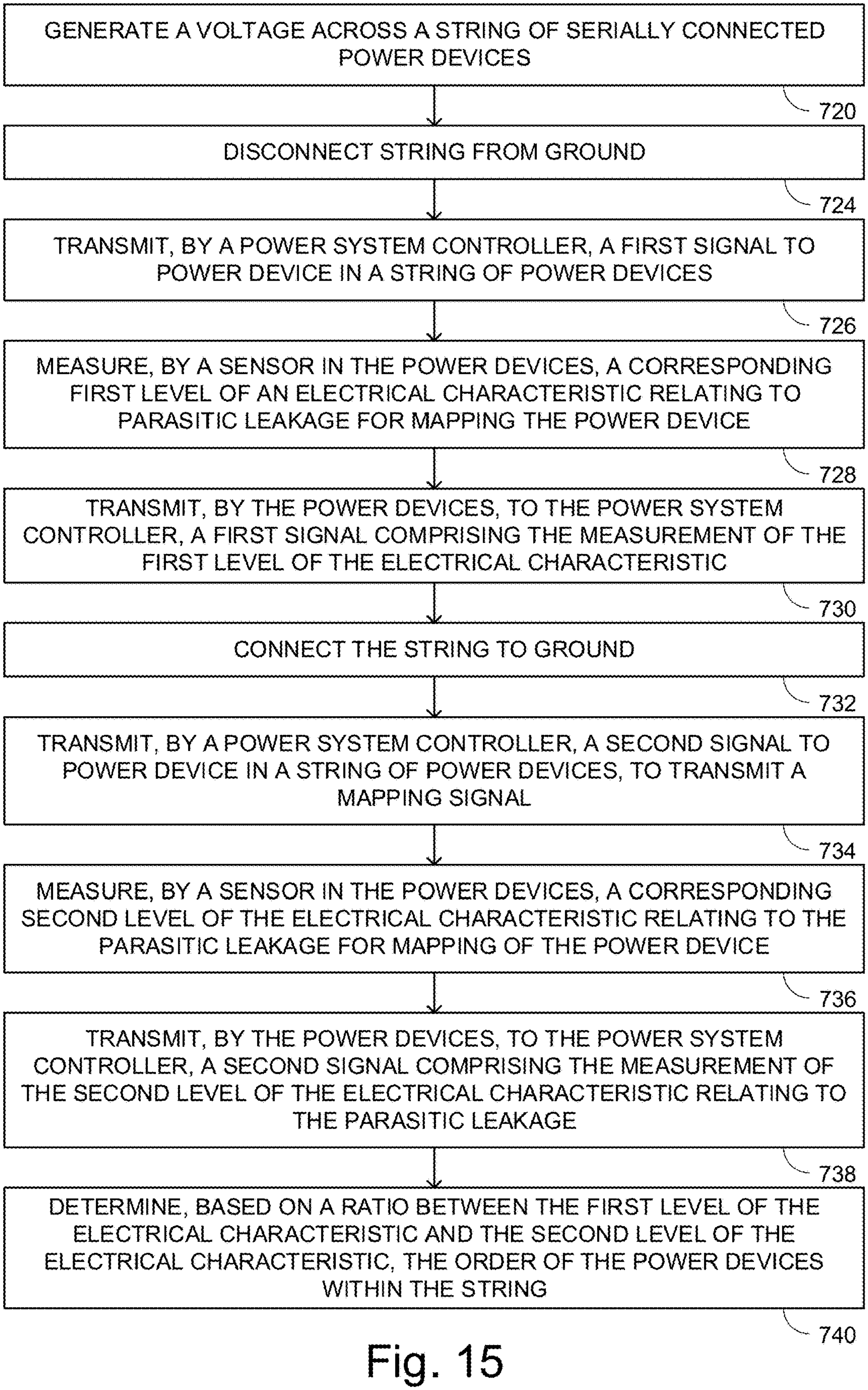
FIG. 15 shows another example method for mapping the locations of the power devices.

Reference is now made to FIG. 15, which shows another method for mapping the order of power devices in a string. In step 720, the power system controller 106 may control the power source 126 to generate a voltage across the string 148.

In step 724, the power system controller may control switch 700 to a non-conducting state such that string 148 is disconnected from the ground (e.g., isolating string 148 from the ground).

In step 726, the power system controller 206 (e.g., using communications interface 193) may transmit a first signal to the power devices 102-1-102-N in the string 148. The signal may be a unicast signal, a multicast signal, or a broadcast signal. The power system controller 206 may sequentially or concurrently transmit a plurality of unicast signals to some or all of the power devices 102-1-102-N. The transmitted signal may instruct the power devices 102-1-102-N to initiate the measurements of electrical characteristics, as explained below.

In step 728, the sensors 183 in the power devices 102-1-102-N may measure a corresponding first level of an electrical characteristic relating to parasitic leakage. As mentioned above, the sensor(s) 183 may measure a voltage across the equivalent resistances 160-1-160-N (e.g., by measuring the voltage level between the terminals 114-1 and 114-2 of the corresponding power device 102-1-102-N). Alternatively, or additionally, the sensor(s) 183 may measure a current through the equivalent resistances 160-1-160-N. Alternatively, or additionally, the sensors183 may measure voltages across the parasitic impedances 602-1-602-N. Alternatively, or additionally, the sensors 183 may measure current through the parasitic impedances 602-1-602-N (e.g., by measuring the current level through terminal 112-2 of the corresponding power device 102-1-102-N).

In step 730, each power device 102-*i* of the power devices 102-1-102-N (e.g., using the communications interface 182) may transmit to the power system controller 106 a signal comprising the measurement of the first level of the electrical characteristic relating to the parasitic leakage.

In step 732, the controlling switch 700 may connect the string 148 to the ground. For example, the power system controller 106 may control the switch 700 to a conducting state.

In step 734, the power system controller 106 may transmit (e.g., using communications interface 193) a second signal to the power devices 102-1-102-N, in the string 148, to transmit another mapping signal (e.g., similar to as described in conjunction with step 726).

In step 736, the sensors 183 of the power devices 102-1-102-N may each measure a corresponding second level of the electrical characteristic relating to parasitic leakage. (e.g., similar to as described in conjunction with step 728).

In step 738, each power device 102-*i* of the power devices 102-1-102-N may transmit (e.g., using communications interface 182) to the power system controller 106 a signal comprising the measurement of the second level of the electrical characteristic relating to the parasitic leakage.

In step 740, the power system controller 106 may determine, based on a ratio between the first level of the electrical characteristic and the second level of the electrical characteristic of each of the power devices in the string 148, the order of the power devices within the string 148. For example, the power system controller 106 may determine that the power device 102-*i*, with the highest ratio between the first level of the measured electrical characteristic and the second level of the measured electrical characteristic, is located closest to the terminal 116-1, the power device 102-*j* with the second highest ratio is located second closest to power source to terminal 116-1, and so on.

In the description above, in conjunction with FIGS. 14A-14B, the switch 700 is shown as connected to the terminal 116-2. According to the description herein, the switch 700 may alternatively be connected to the terminal 116-1, and the power source 126 may generate a voltage across the string 148 such that the voltage at the terminal 116-2 is higher than the voltage at the terminal 116-1 (referred to herein as "negative polarity"). Similarly, the voltage source 702 may be located between the terminal 116-1 and the switch 700, or between the switch 700 and the ground.

The mapping described in conjunction with FIGS. 14A-14C may be combined with the iterative mapping described in conjunction with FIGS. 11A, 11B, and 12, where the power device 102-*i* with the highest ratio may be transitioned to bypass mode, and the mapping process may be repeated.

Figure 16A:
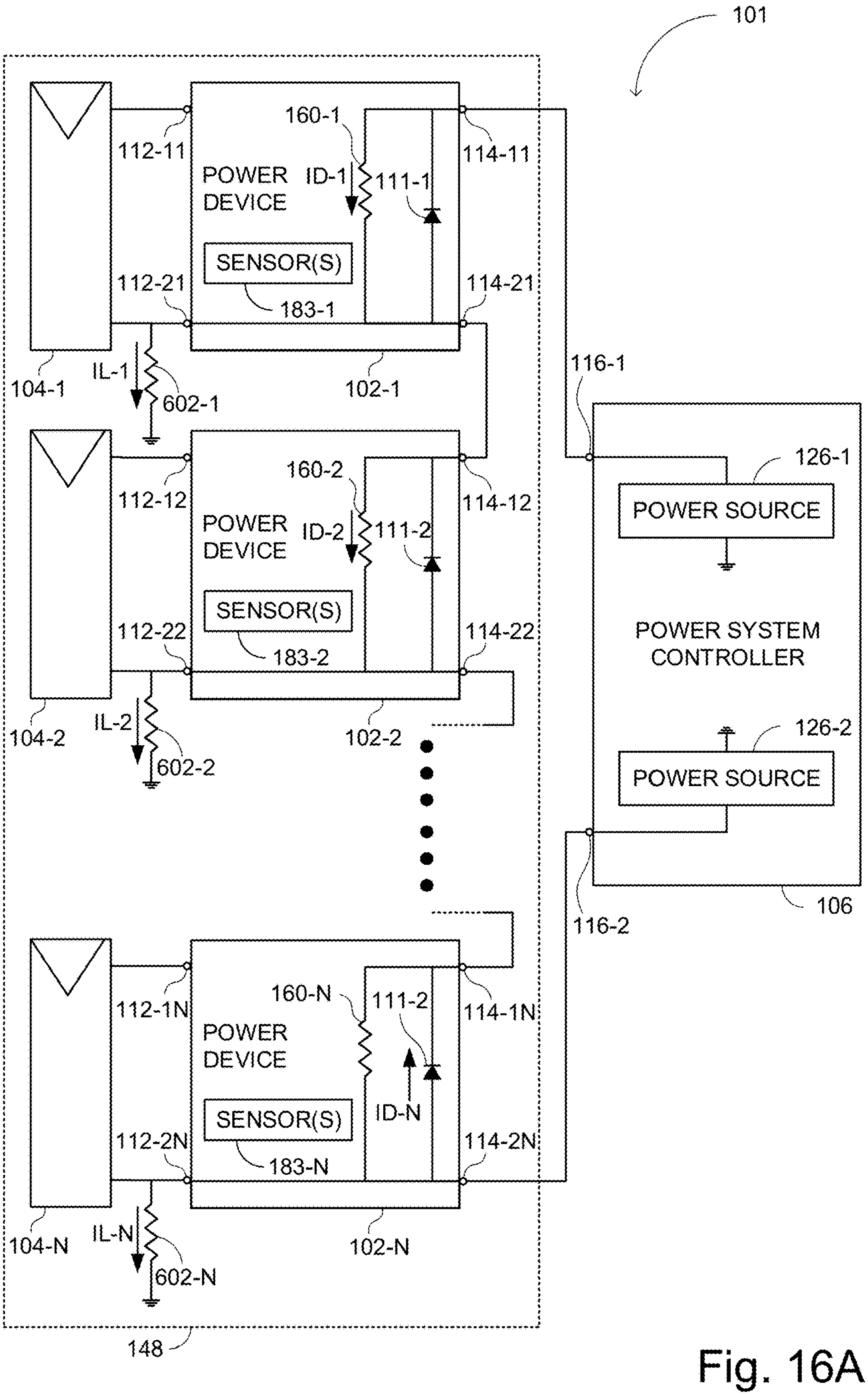
FIGS. 16A, 16B, and 16C show another power system for mapping the locations of power devices in a serial string of power devices.
Figure 16B:
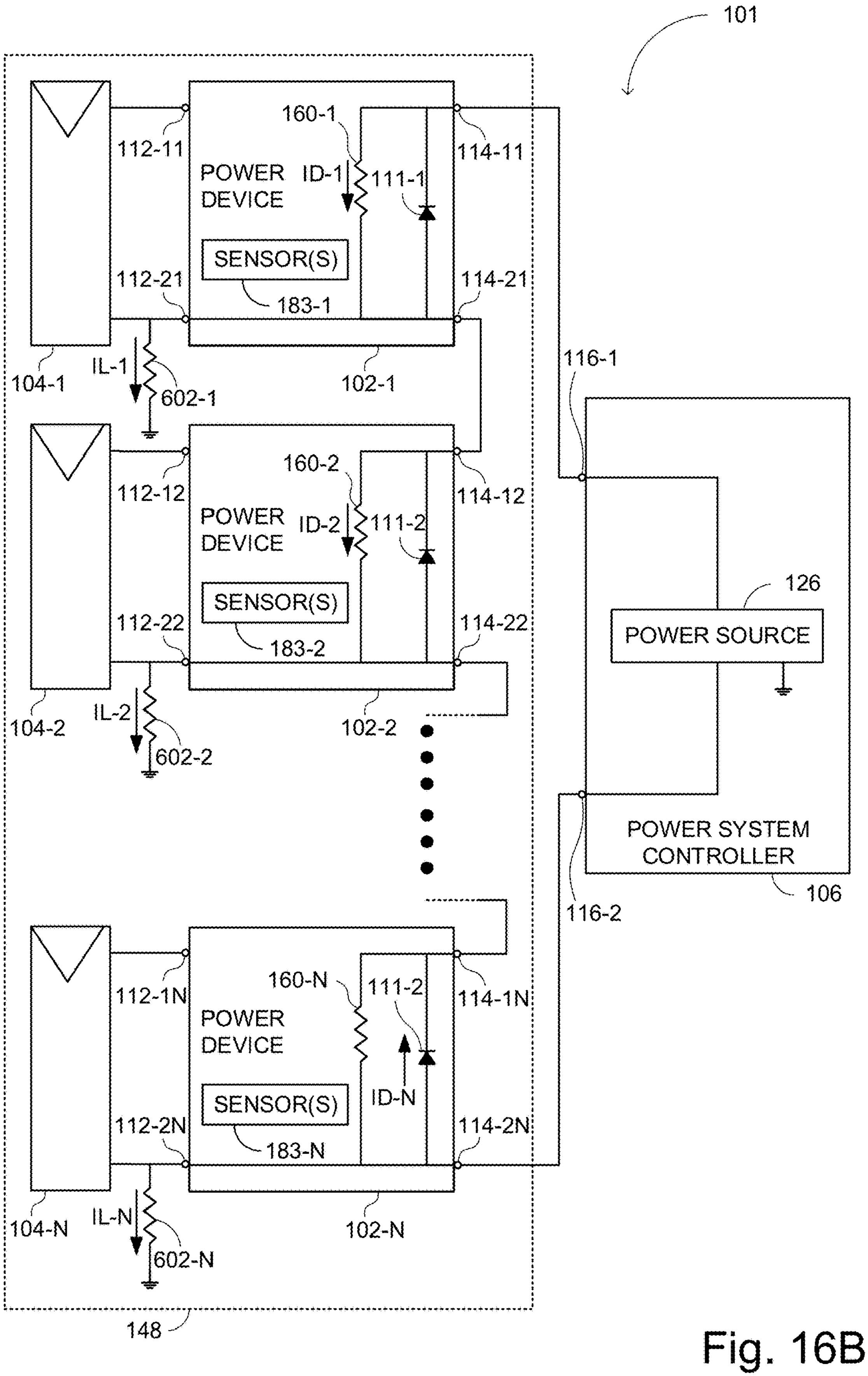
Figure 16C:
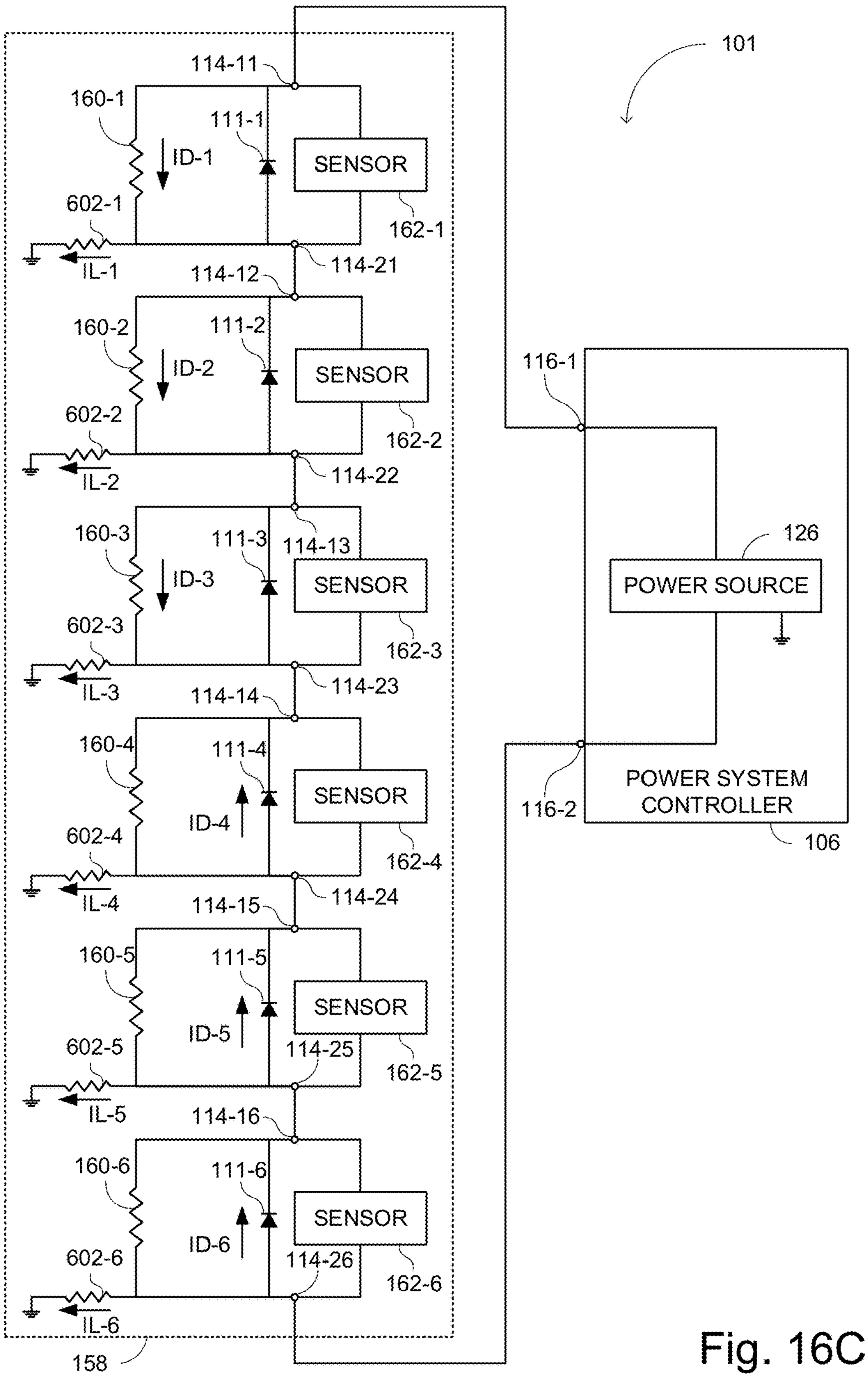

The following description in conjunction with FIGS. 16A-16C and 17 may also relate to an iterative process for mapping the location of power devices 102-1-102-N in a string in case of uneven impedances. According to the disclosure herein, a voltage may be applied to both terminals 1161-1 and 116-2. Reference is now made to FIGS. 16A-16C, which shows an example in which the power system controller 106 may determine the locations of power devices 102-1-102-N in string 148. The power system controller 106 may use a reducing order of the levels of measured electric characteristics (e.g., a voltage level between the terminals 114-1 and 114-2 of the corresponding power device 102-1-102-N) to determine the order of power devices 102-1-102-N. In the example shown in FIGS. 16A-16C, a voltage is applied to terminal 116-1 and 116-2. The example in FIG. 16A shows two power sources, 126-1 and 126-2. The power source 126-1 may apply a voltage, relative to ground, to terminal 116-1, and the power source 126-2 may apply a voltage, relative to ground, to terminal 116-2. In the example shown in FIG. 16B, the power source 126 may apply a voltage, relative to ground, to both of terminals 116-1 and 116-2. Reference is made to FIG. 16C which may show aspects of a power system 101. For the sake of the clarity of FIG. 16C, and of the explanations brought in conjunction therewith, FIG. 16C shows six resistances 160-1-160-6 and six sensors 162-1-162-6 corresponding to the six power devices 102-1-102-6. Each of sensors 162-1-162-6 may be a voltage sensor, which may be coupled between terminals 114-1 and 114-2 of the corresponding power device 102-1-102-6 and may be configured to measure a voltage level between the corresponding terminals 114-1 and 114-2. As shown in FIGS. 16C, the power system 101 may comprise a power source 126 coupled to terminals 1161-1 and 116-2 of the power controller system 106 and configured to apply a voltage to terminals 116-1 and 116-2. Thus, the power source 126 applies a voltage to both ends of string 158, relative to ground. The power source 126 may be similar to the power source described above in conjunction with FIGS. 2A-2C. For example, FIG. 16C shows the power source 126 that is internal to power system controller 106.

To map the order of power device 102-1-102-6 in string 158, the controller 191 in the power system controller 106 controls power source 126 to apply a voltage (e.g., 50V, 100V, 200V, 400V, 800V, 1000V or higher) to terminals 116-1 and 116-2. This voltage may cause currents ID-1-ID-6 to flow through the power devices, and currents IL-1-IL-6 to leak through the equivalent parasitic impedances 602-1-602-6. In the example shown in FIGS. 16C, the same voltage is applied to terminal 116-1 and to terminal 116-2. Therefore, depending on the value of equivalent resistances 160-1-160-6 and of equivalent parasitic impedances 602-1-602-6, some of the bypass diodes 111-1-111-6 may be reversed biased and others may be forward biased. Thus, in some of power devices 102-1-102-6 current may flow through equivalent resistances 160-1-160-6, and in other ones of power devices 102-1-102-6 current may flow through the respective bypass diodes 111-1-111-6. For the sake of the explanations herein, it is assumed that, in the example shown in FIG. 16C, equivalent resistances 160-1-160-6 are equal and equivalent parasitic impedances 602-1-602-6 are equal. As such, bypass diodes 111-1-111-3 are reversed biased and current flows through equivalent resistances 160-1-160-3, and bypass diodes 111-4-111-6 are forward biased and current flows through bypass diodes 111-4-111-6. Similar to as described above, due to equivalent parasitic impedances 602-1-602-3, ID-1>ID-2>ID-3, and the voltage drop across equivalent resistance 160-1 may be larger than the voltage drop across equivalent resistance 160-2, which may be larger than the voltage drop across equivalent resistance 160-3. The power system controller 106 may use these differences in voltages to iteratively map power devices 102-1-102-6 in string 158.

Following is a numerical example of iteratively mapping the location of power devices 102-1-102-6 in string 158. In this example, equivalent resistances 160-1-160-6 are assumed to be equal, each having a value of 50K Ohms. Equivalent parasitic impedances 602-1-602-6 are assumed to be equal, each having a value of 100M Ohms. The controller 191 in power system controller 106 may control the power source 126 to apply a voltage of 800V to terminals 116-1 and 116-2. Consequent to the voltage applied to terminals 116-1 and 116-2, current flows through equivalent parasitic impedances 602-1-602-6. Consequent to the voltage applied to terminals 116-1 and 116-2, current flows from terminals 116-1 through equivalent resistances 160-1-160-3, and from terminals 116-2 through bypass diodes 111-4-111-6. These currents generate a voltage across the corresponding terminals 114-1 and 114-2 of power devices 102-1-102-6. In power devices 102-1-102-3, the voltage across the corresponding terminals 114-1 and 114-2 may be a positive voltage (the voltage at terminal 114-1 is higher than the voltage at terminal 114-2). In power devices, 102-4-102-3 the voltage across the corresponding terminals 114-1 and 114-2 may be a negative voltage (the voltage at terminal 114-1 is lower than the voltage at terminal 114-2). Due to the leakage current IL-1-IL-3, the voltage drops across the corresponding terminals 114-1 and 114-2 of power devices 102-1-102-3 are not equal. In the numerical example brought in FIG. 16C, the voltage between terminals 114-11 and 114-21 of power device 102-1 may be 0.86V, the voltage between terminals 114-12 and 114-22 of power device 102-2 may be 0.46V, and the voltage between terminals 114-13 and 114-23 of power device 102-1 may be 0.06V. The voltage between terminals 114-1 and 114-2 corresponding to power devices 102-4-102-6 may correspond to the forward bias voltage across bypass diodes 111-4-111-6 in forward bias. It is noted that the numerical example of FIG. 16C is not limiting and is described herein for the sake of the clarity of the explanations. Actual levels of the voltage may differ depending on the length of string 158, the values of the equivalent parasitic impedances 602-1-602-N and of equivalent impedances 160-1-160-N, and the level of the voltage applied by power source 126.

To map the location of power devices 102-1-102-6 in string 158, the communications interface 193 in the power system controller 106 may transmit a signal to the power devices 102-1-102-6 (the unmapped power devices) instructing the power devices 102-1-102-6 to measure the voltage level across the corresponding terminals 114-1 and 114-2. Responsive to receiving the signal from the power system controller 106 (e.g., by communications interface 182), the power devices 102-1-102-6 may measure, using the corresponding sensors 162-1-162-6, a voltage level across the corresponding terminals 114-1 and 114-2. The power devices 102-1-102-6 may transmit (e.g., using communications interface 182) the measured voltage level to the power system controller 106. The power system controller 106 may receive (e.g., using communications interface 193) the measured voltage levels from the power devices 102-1-102-6. The power system controller 106 (e.g., using processor 195) may order the power devices with a positive voltage level. If neither of the power devices 102-1-102-6, was previously mapped, the power system controller may determine that power device 102-*i* of power devices 102-1-102-6, with the highest voltage level is the power devices closest to terminal 116-1. In the example shown in FIG. 16C, the power system controller determines that power device 102-1 is the closest to terminal 116-1, followed by the power device 102-2, and the power device 102-3.

After mapping power devices 102-1-102-3, the power system controller 106 may transmit a signal to the power devices 102-1-102-3 to transition to a bypass mode. For example, the controller 110-1 of the power device 102-1 may control the switches 187-3 and 187-4 of the power device 102-1 to a conducting state, or the power devices 102-1-102-6 may comprise a bypass switch (e.g., a transistor), which may be controlled to connect the terminal 114-1 of the power device 102-*i* with the terminal 114-2 of the power device 102-*i*. The power system controller 106 may repeat (e.g., iteratively) the process described above with power devices 102-4-102-6, until the order of power devices 102-1-102-6 in the string 158 is determined.

Figure 17:
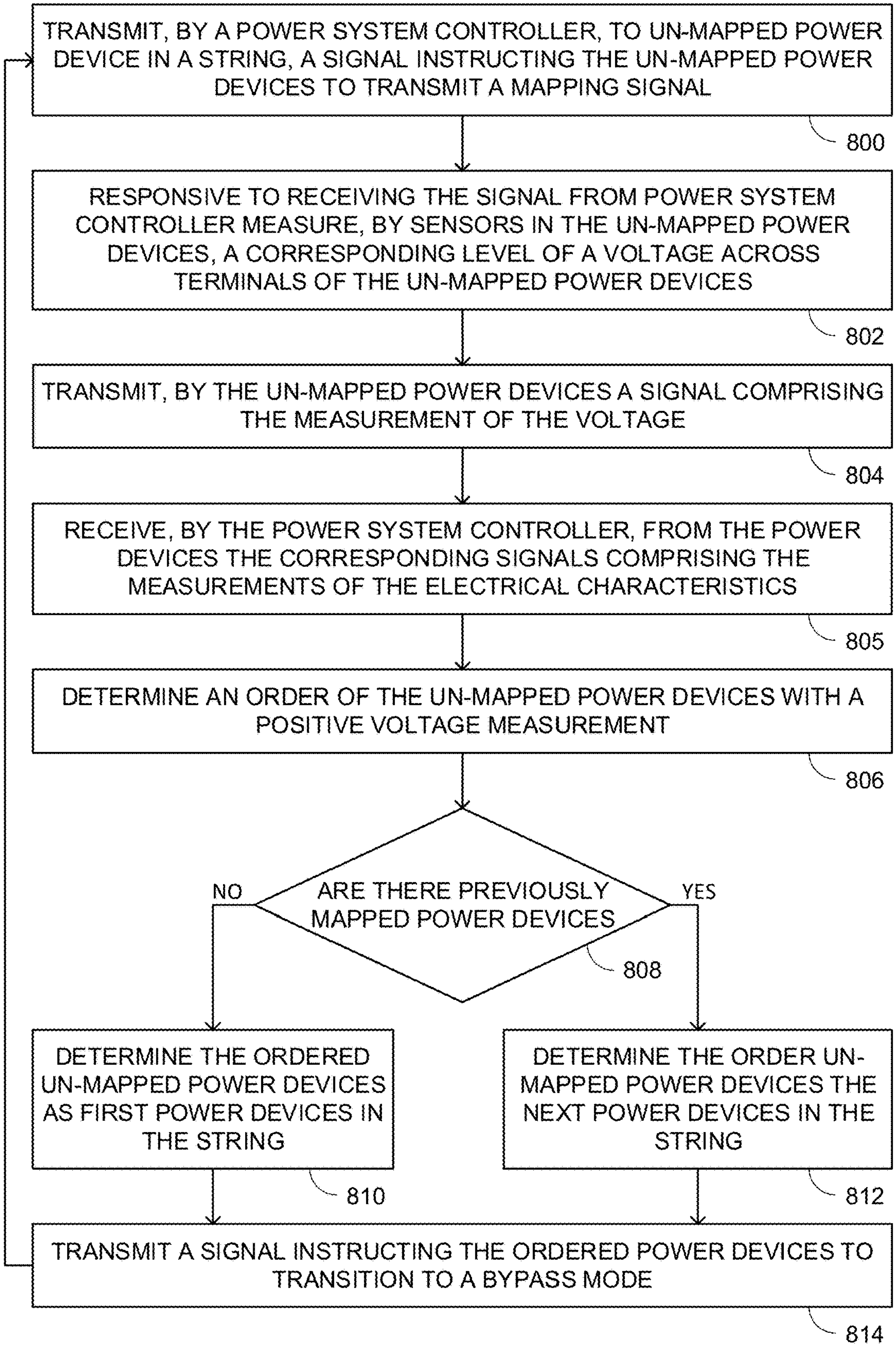
FIG. 17 shows another example method for mapping the locations of the power devices.

Reference is made to FIG. 17, which shows a method for mapping the order and/or locations of the power devices in a string of power devices. In step 800, the power system controller 106 may transmit (e.g., using the communications interface 193) a mapping signal to unmapped power devices of the power devices 102-1-102-N in the string 148. The transmitted mapping signal may provide the power devices 102-1-102-N with instructions to measure a level of an electrical characteristic relating to mapping (e.g., the voltage across the corresponding terminals 114-1 and 114-2).

In step 802, responsive to receiving the signal from the power system controller 106, one or more of the unmapped power devices 102-1-102-N in string 148 may measure (e.g., using sensor(s) 183) a corresponding level of an electrical characteristic of the power device. The level of electrical characteristics may indicate the level of parasitic leakage for the power device, and such data may be helpful for mapping the location of the power device. For example, the electrical characteristic may be a voltage level across corresponding terminals 114-1 and 114-2 of power devices 102-1-102-N. For example, the electrical characteristic may be a current level through one or more of terminal 114-1 and terminal 114-2.

In step 804, the unmapped power devices 102-1-102-N may transmit (e.g., using communications interface 182) to the power system controller 106 a signal comprising the measurement of the corresponding electrical characteristic.

In step 805, the power system controller 106 may receive (e.g., using communications interface 193), from the power devices 102-1-102-N, the corresponding signals comprising the measurements of the electrical characteristics.

In step 806, the power system controller 106 may determine an order of the un-mapped power devices with a positive voltage across the respective terminals 114-1 and 114-2. In the example shown in FIG. 16C, some of the un-mapped power devices may have a negative voltage across the respective terminals 114-1 and 114-2 (e.g., the voltage at terminal 114-2 is higher than the voltage at terminal 114-1) resulting from the current flowing through the respective bypass diode 111. The power system controller 106 may determine the power device 102-*i*, with the highest voltage across the terminals 114-1 and 114-2, as the first power device of the un-mapped power devices. The power system controller 106 may determine the power device 102-*j*, with the second highest voltage across the terminals 114-1 and 114-2, as the second power device of the un-mapped power devices, and so on.

In step 808, the power system controller 106 may determine if there are any previously mapped power devices. For example, the power system controller 106 may store (e.g., in memory 197) an order list of the mapped power devices. In cases in which the list is empty, the power system controller 106 may determine that there are no previously mapped power devices, and the method may proceed to step 810. In cases in which the list is not empty, the power system controller 106 may determine that there are previously mapped power devices, and the method may proceed to step 812.

In step 810, the power system controller 106 may determine that the ordered un-mapped power device as the first power devices in the string. After step 810, the method may proceed to step 814.

In step 812, the power system controller 106 may determine the ordered un-mapped power device as the next power devices in the string. After step 810, the method may proceed to step 814.

In step 814, the power system controller 106 may transmit a signal instructing the power device with the ordered power devices to transition to a bypass mode. From procedure 814, the method may return step 800 (e.g., in case there are unmapped power devices in string 148 or 158).

In a system such as the power system 101, the voltage levels across equivalent impedances 160-1-160-N, when applying a voltage to the terminal 116-1 of the power system controller 106, may vary based on various conditions. For example, for a determined voltage level, the drop across equivalent impedances 160-1-160-N may depend to the number of power devices 102-1-102-N attached to the power sources 104-1-104-N in string 148. The number of power devices 102-1-102-N attached to the power source 104-1-104-N in string 148 may be referred to as the "string length." The larger the string length the lower the voltage level across the equivalent impedances 160-1-160-N. The voltage across the equivalent impedances 160-1-160-N may depend on the level of parasitic leakage impedances 602-1-602-N. For example, the level of parasitic leakage impedances 602-1-602-N may vary with humidity. For example, in high relative humidity conditions, the level of parasitic leakage impedances 602-1-602-N may be lower than in low relative humidity conditions. A decrease in the level of parasitic leakage impedances 602-1-602-N (e.g., due to humidity) may cause the differences between the voltage levels across equivalent impedances 160-1-160-N to increase (e.g., due to the increase in leakage current). Furthermore, the values of equivalent impedances 160-1-160-N may not be equal and/or the corresponding power device 102-1-102-N may have current leakages which may affect the voltage drops across equivalent impedances 160-1-160-N. The above-mentioned factors may cause the voltage levels across the equivalent impedances 160-1-160-N, and/or the differences between the voltage levels across the equivalent impedances 160-1-160-N, to drop below a measurement error of the sensors measuring these voltage levels, and/or to not correspond to the position of the power device 102-1-102-N in the string.

Figure 18A:
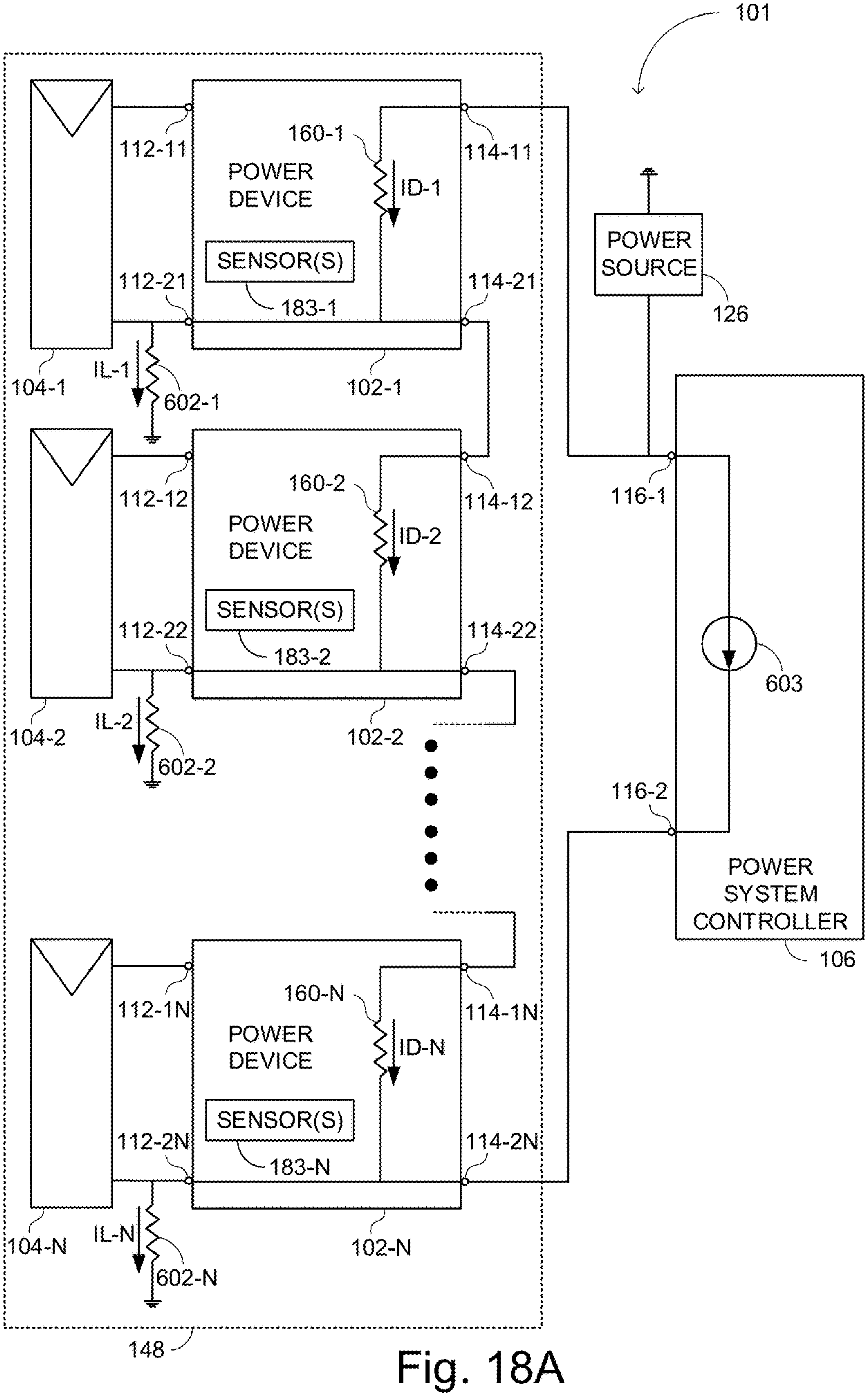
FIG. 18A shows another power system for mapping the locations of power devices in a serial string of power devices.
Figure 18B:
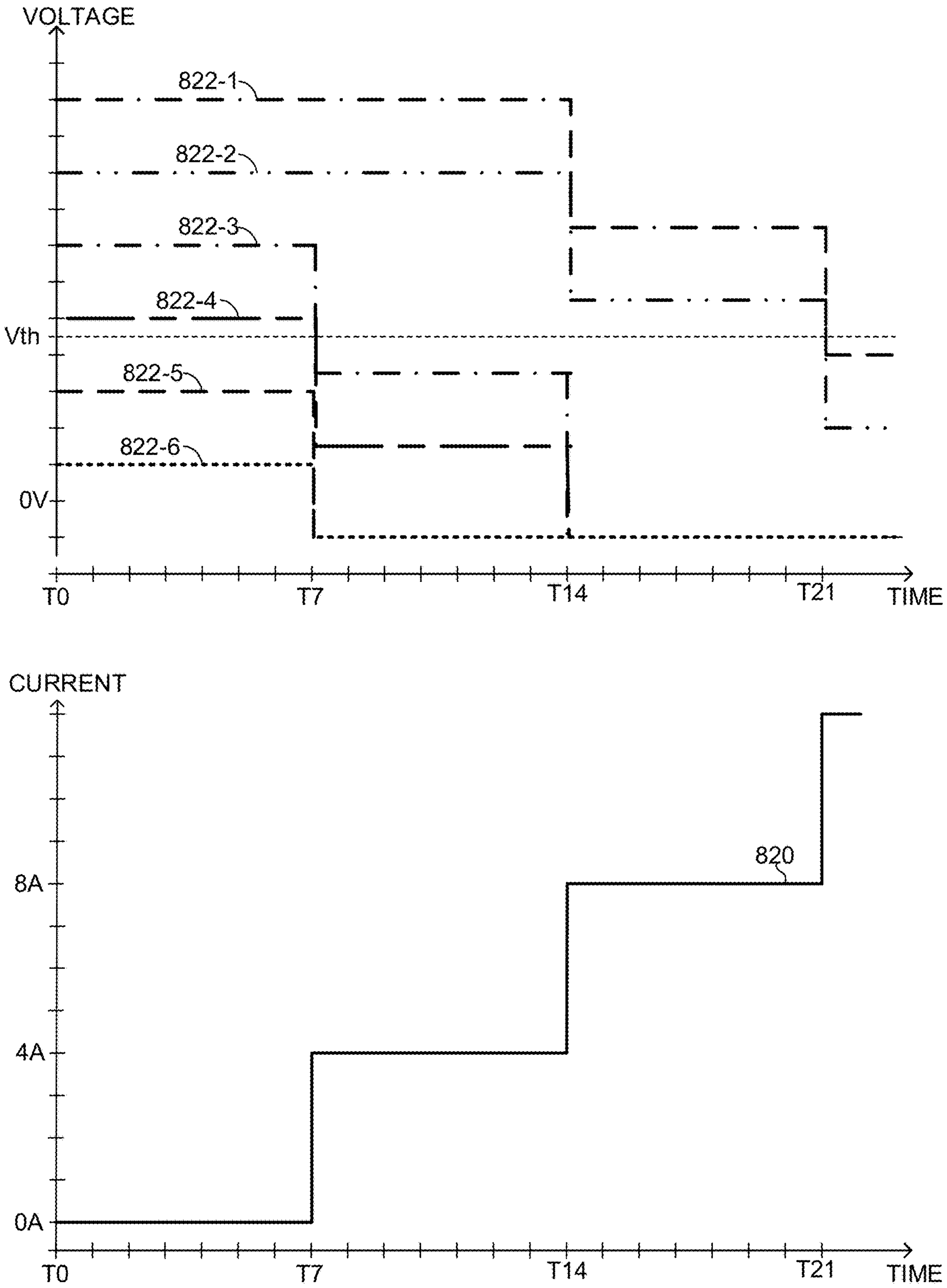
FIGS. 18B and 18C show current generated by components of the power system of FIG. 18A.
Figure 18C:
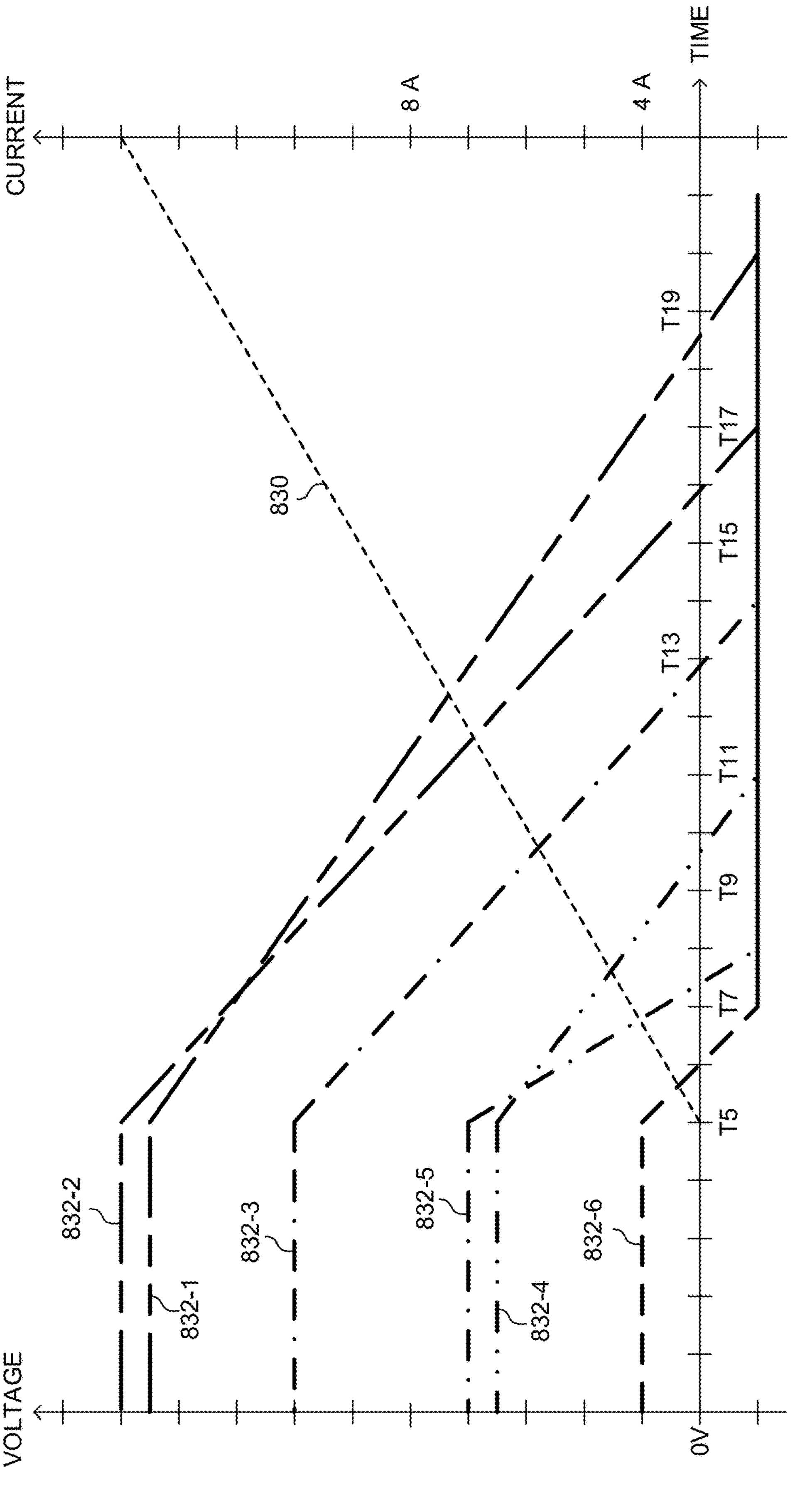

To reduces effects of the variations of the voltage levels across equivalent impedances 160-1-160-N, a current source may be used as further described herein with reference to FIGS. 18A-18C. FIG. 18A may show aspects of the power system 101. To map the locations of the power devices 102-1-102-N (e.g., relative to each other) within the string 148, the power source 126 may be connected to the terminal 116-1 of the power system controller 106 (e.g., via switches). The power system 101 may include a current source 603. The current source 603 may be a variable current source, connected between the terminals 116-1 and 116-2 (e.g., current source 603 is a differential current source), and may generate a current from the terminal 116-2, through the string 148, and to terminal 116-1 (e.g., the current source 603 may generate a differential current through the string 148). The controller 191 may control the power source 126 to generate a voltage at the terminal 116-1 of the power system controller 106, similar to as described above in conjunction with FIG. 9. The controller 191 may control variable current source 603 to generate a current. The current generated by the variable current source 603 may reduce the common current flowing through the string 148 and the equivalent impedances 160-1-160-N, such that the voltage drop across equivalent impedances 160-1-160-N, may be, primarily, due to leakage current IL1-ILN. For example, the current generated by the variable current source 603 may reduce the voltage across equivalent impedances 160-1-160-N, such that the differences between these voltage drops are above a measurement error (e.g., as a percentage of the measured value).

The power system controller 106 may determine the current generated by the variable current source 603 and map the locations of the power devices 102-1-102-N in several ways. For example, to map the locations of the power devices 102-1-102N in the string, at time TO, the power system controller 106 may control the power source 126 to generate a voltage at the terminal 116-1 (e.g., relative to ground), and the current generated by the variable current generator 603 is zero. The power system controller may transmit, via communications interface 193, a signal instructing the power devices 102-1-102-6 to measure a voltage level across the corresponding equivalent impedances 160-1-160-N. Each of power devices 102-1-102-N may measure a corresponding voltage level across the corresponding equivalent impedances 160-1-160-6 and transmit to the power system controller 106, a signal comprising the measured voltage level. The power system controller 106 may determine the highest level of the measured voltage and divide this highest level by a typical or worst-case impedance of a power device of power devices 102-1-102-N to determine a current level. The power system controller 106 may control the variable current generator 603 to generate the determined current level, and transmit again, via communications interface 193, a signal instructing the power devices 102-1-102-N to measure a voltage level across the corresponding equivalent impedances 160-1-160-N. Each of power devices 102-1-102-N may measure a second corresponding voltage level across the corresponding equivalent impedances 160-1-160-6 and transmit to power system controller 106, a signal comprising the measured voltage level. The power system controller 106 may map the locations of the power devices 102-1-102-N based on the second measurements. For example, the power system controller 106 may map the locations of the power devices 102-1-102-N based a reducing order of voltage levels where a power device 102-*i*, with the highest voltage levels across the corresponding equivalent impedance 160-*i* is mapped to be the closest to terminal 116-1, and a power device 102-*j*, with the second highest voltage levels across the corresponding equivalent impedance 160-*i* is mapped to be the second closest to terminal 116-1 and so on.

Referenced is made to FIG. 18B which shows the current level 820 generated by the variable current generator 602, and the voltage levels 822-1-822-6 across the equivalent impedances 160-1-160-6 of the six power devices 102-1-102-6. To map the locations of the power devices 102-1-1026 in the string, at time T0, the power system controller 106 may control the power source 126 to generate a voltage at the terminal 116-1, and the current 820 generated by the variable current generator 603 is zero. The power system controller may transmit, via communications interface 193, a signal instructing power devices 102-1-102-6 to measure a voltage level across the corresponding equivalent impedances 160-1-160-6. Each of power devices 102-1-102-6 may measure a corresponding voltage level across the corresponding equivalent impedances 160-1-160-6 and transmit to power system controller 106, a signal comprising the measured voltage level. Since the voltage level 822-6 across the equivalent impedance 160-6 is the lowest, the power system controller may determine that the power device 102-6 is at the bottom of the string. In FIG. 18B, the voltage level 822-6 across the equivalent impedance 160-6 and the voltage level 822-5 across the equivalent impedance 160-5 are positive and below a voltage threshold, Vth. The power system controller 106 may determine that the power device 102-6 with the lowest corresponding voltage level is at the bottom of the string 158 (closest to terminal 116-2), and that the power device 102-5 with the second lowest corresponding voltage level is second from the bottom of the string 158. The determined threshold may be based on the lowest expected voltage drop across the equivalent impedances 160-1-160-6.

According to the disclosure herein, the power system controller may determine a current increase (e.g., a current step) for the current generator 603. For example, the power system controller may determine a current increase using the lowest measured voltage when no current is applied to string 148, and dividing by the worst case impedance. The power system controller 106 may control the variable current generator 603 to increase the current level by the determined current increase. In FIG. 18B, at time T7, the power system controller may control the variable current generator 603 to increase the current level 820 (e.g., from 0 to 4 A). The power system controller 106 may again transmit a signal instructing the power devices 102-1-102-6 to measure the voltage levels across the corresponding the equivalent impedances 160-1-160-6 and the power devices 102-1-102-6 may measure these voltage levels and transmit a signal comprising the corresponding measured voltage level. As shown in FIG. 18B, the voltage level 822-6 across the equivalent impedance 160-6 and the voltage level 822-5 of the equivalent impedance 160-5 reduce below zero. The voltages levels 822-4 and 822-3 across the equivalent impedances 160-4 and 160-3 respectively are still positive, but reduce below the voltage threshold, Vth. The voltage levels 822-2 and 822-1 across impedances 160-2 and 160-1, respectively, also reduce but remain above the voltage threshold, Vth. The power system controller 106 may determine that the power device 102-4 is the next power device from the bottom of the string (above power device 102-5) and that the power device 102-3 is above power device 102-4. At time T14, the power device 106 may control the variable current source 603 to increase the current level 820 generated thereby (e.g., by another 4 A, to 8 A) and may repeat the process described until the power devices 102-1-102-6 are mapped.

According to the disclosure herein, the power system controller 106 may control the variable current source 603 to continuously increase or decrease the current generated by the variable current source 603. Since the voltage generated by the power source 126 may result in a positive voltage between the terminals 114-1 and 114-2 of power devices 102-1-102-N, as the current generated by the current source 603 increases, the diodes 111-1-111-N of the power devices 102-1-102N may become forward biased in sequence, starting from the bottom of the string. Thus, the voltage between the terminals 114-1 and 114-2 of the power devices 102-1-102-N may become negative in sequence, starting from the bottom of the string. FIG. 18C shows a current level 830 generated by the current generator 603 versus time. Shown in FIG. 18C is an example of voltage levels 832-1-832-6 of six power devices 102-1-102-6, respectively. In FIG. 18C, the power source 126 applies a voltage to string 148 at TO, and current source starts increasing the current level at T5. As shown in FIG. 18C, due to differences in the levels of equivalent impedances 160-1-160-6, and additional leakages, the voltage levels 832-1-832-6 across the equivalent impedances 160-1-160-6 are not ordered when no differential current is provided by current source 603. For example, the voltage level 832-2 across the equivalent impedance 160-2 is higher than the voltage level 832-1 across equivalent impedance 160-1, and the voltage level 832-5 across the equivalent impedance 160-5 is higher than the voltage level 832-4 across the equivalent impedance 160-4. However, the order at which the voltage levels 832-1-832-6 cross the zero voltage level is in order. For example, the voltage level 831-6 across the equivalent impedance 160-6 crosses the zero voltage level first, and the voltage level 832-1 across the equivalent impedance 160-1 crosses the zero voltage level last. Accordingly, the power devices 102-1-102-N may measure (using sensor(s) 183) the voltage level across the corresponding terminals 114-1 and 114-2 and transmit a signal comprising the corresponding voltage levels to power system controller 106. The power system controller may detect the order in which the voltage levels between terminals 114-1 and 114-2 of the power devices 102-1-102-6 become negative. It is noted that the term "continuously" may refer to small changes (e.g., the smallest possible step by which the current may be increased or decreased).

The variable current source 603 may be implemented using a variable resistor, one or more resistors, one or more capacitors, one or more transistors, and/or one or more OpAmps. For example, the variable current source 603 may be implemented as a current mirror. The power system controller 106 may determine if to increase or decrease the current generated by the variable current source 603 based on measurements from the sensors 194 and the received signals from the power devices 104-1-104-N (e.g., signals relating to the voltage levels across corresponding equivalent impedances 160-1-160-N).

Figure 19:
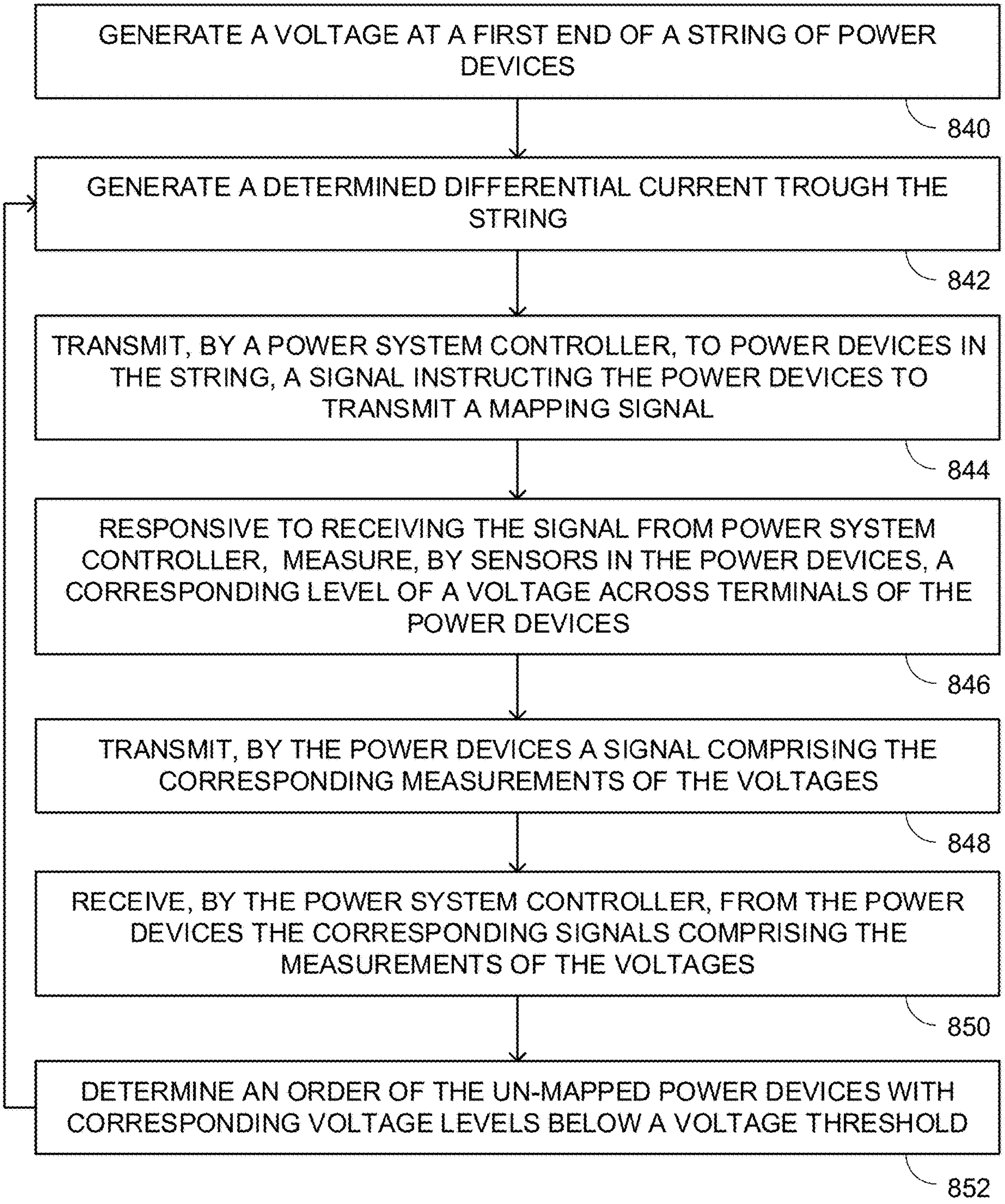
FIG. 19 shows another example method for mapping the locations of the power devices.

Reference is now made to FIG. 19, which shows a method for mapping the location of the power devices in a string. In step 840, the power system controller 106 may control the power source 126 to generate a voltage at a first end of string 158 of the power devices 102-1-102-N.

In step 842, the power system controller 106 may control the variable current source 603 to generate a determined differential current trough the string 158. The power system controller 106 may determine the level of the differential current based on a lowest measured voltage across the equivalent impedances 160-1-160-N when no current is applied to string 148, divide by the worst-case impedance.

In step 844, the power system controller 106 may transmit to the power devices 102-1-102-N in the string 158 a signal instructing the power devices to transmit a mapping signal.

In step 846, responsive to receiving the signal from the power system controller 106, the sensor(s) 183 in each of the power devices 102-1-102-N may measure a corresponding level of a voltage across terminals 114-1 and 114-2 of the power device.

In step 848, the power devices 102-1-102-N may transmit a signal comprising the corresponding measurements of the voltage across the corresponding terminals 114-1 and 114-2.

In step 850, the power system controller 106 may receive from the power devices 102-1-102-N the corresponding signals comprising the measurements of the voltages.

In step 852, the power system controller 106 may determine an order of the un-mapped power devices with voltage levels above a voltage threshold. As described above in connection with FIG. 18B, between time T0 and T7, the voltage levels across the equivalent impedances 160-6 and 160-5 of the power devices 102-6 and 102-5 are positive and below a voltage threshold. The power system controller 106 may determine that the power device 102-6 with the lowest corresponding voltage level is at the bottom of string 158 (closest to terminal 116-2), and that power device 102-5 with the second lowest corresponding voltage level is second from the bottom of the string 158. Between T7 and T14, the voltage levels across equivalent impedances 160-4 and 160-3 of power devices 102-4 and 102-3 are positive and below a voltage threshold. The power system controller 106 may determine that the power device 102-4 with the lowest corresponding voltage level is the next power device from the bottom of the string after power device 102-5 and that power device 102-3 is the next power device after per device 102-4.

Figure 20A:
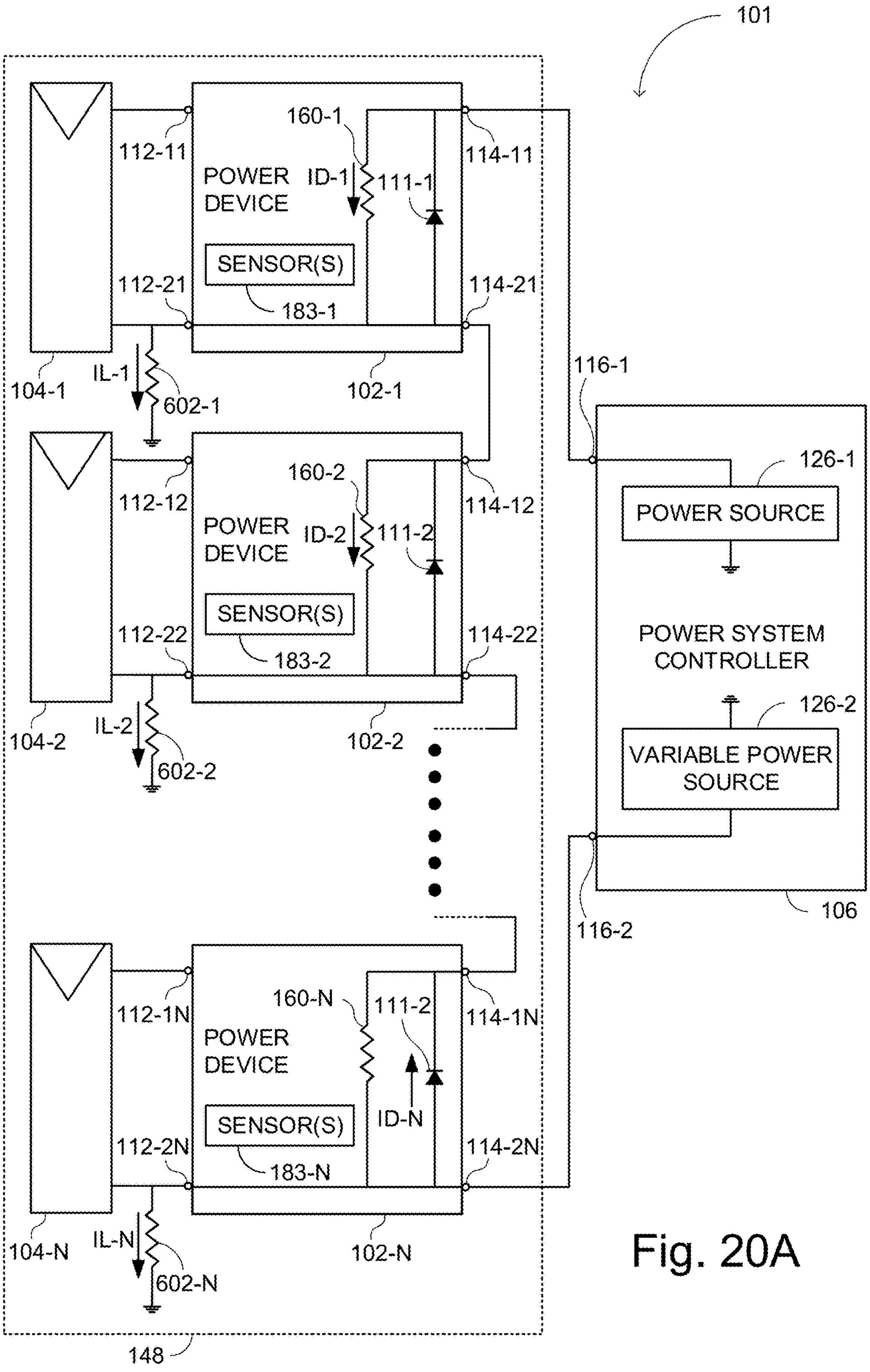
FIG. 20A shows another power system for mapping the locations of power devices in a serial string of power devices.
Figure 20B:
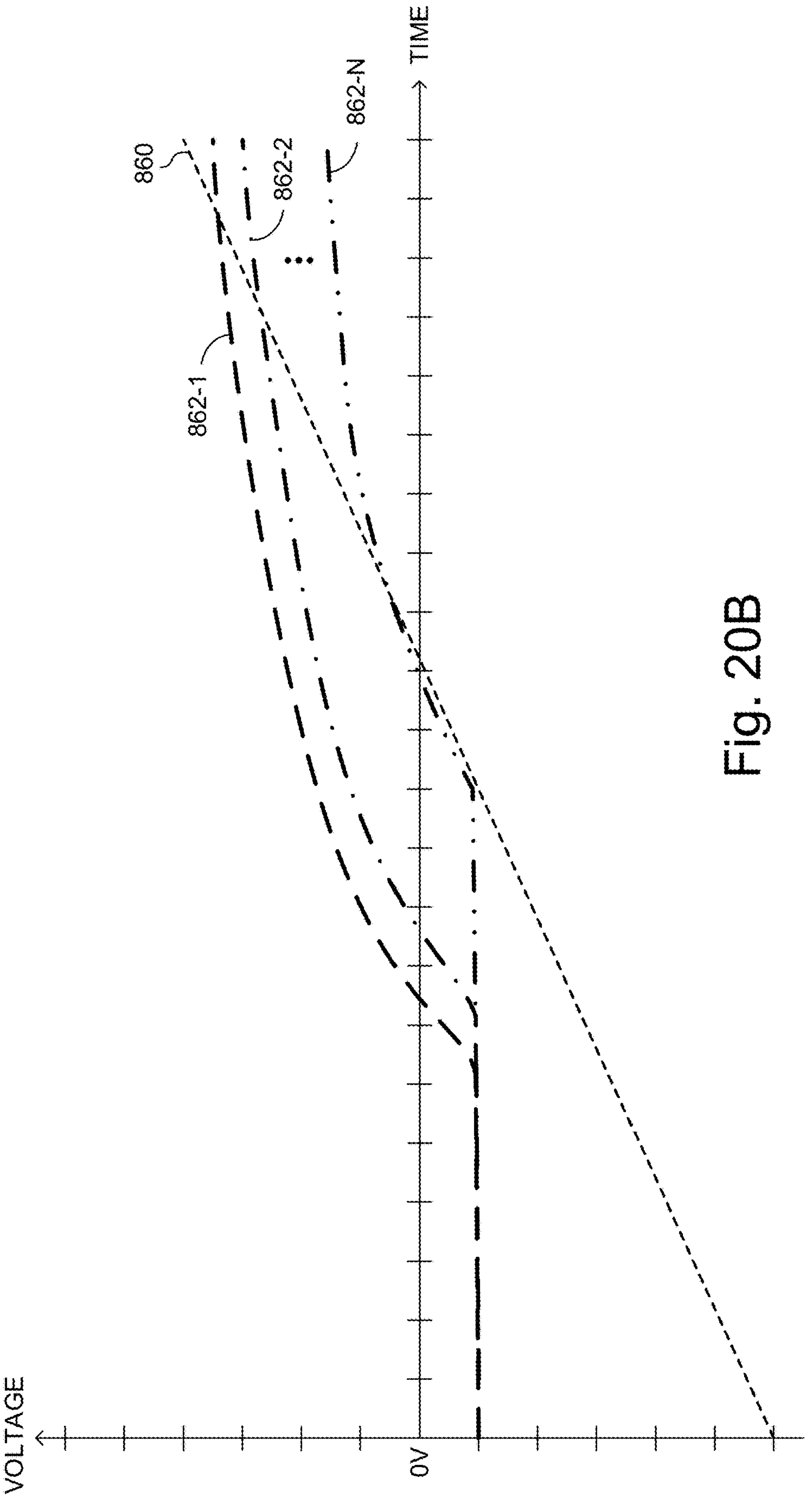
FIG. 20B shows a voltage versus time diagram for the power system.

The following description in connection with FIGS. 20A and 20B may relate to a process for mapping the locations of the power devices 102-1-102-N in a string based on the time of transition of voltage levels from negative to positive. According to the disclosure herein, a voltage may be applied to both terminals 1161-1 and 116-2, where one of the applied voltages to either the terminal 116-1 or the terminal 116-2 varies with time. Reference is now made to FIGS. 20A, which shown an example in which the power system controller 106 may determine the locations of the power devices 102-1-102-N in the string 148 by using a reducing order of the levels of measured electric characteristics (e.g., a voltage level between the terminals 114-1 and 114-2 of the corresponding power device 102-1-102-N). In the example shown in FIGS. 20A and 20B, a constant voltage is applied to the terminal 116-1, and a variable voltage is applied to the terminal 116-2. The example in FIG. 20A shows two power sources 126-1 and 126-2. The power source 126-1 may apply a voltage, relative to ground, to the terminal 116-1, and the variable power source 126-2 may apply a variable voltage, relative to ground, to the terminal 116-2. Shown in FIG. 20A are impedances 602-1-602-N, which may represent equivalent parasitic impedances between the corresponding photovoltaic panels 104-1-104-N and ground. In the example in FIGS. 20A and 20B, the power source 126-1 applies a first voltage level to the terminal 116-1. Initially, the variable power source 126-2 applies, to the terminal 116-2, a voltage level which is higher than the first voltage level (e.g., initially the voltage level between terminal 116-1 and 116-2 is negative). Thus, the diodes 111-1-111-N are in a conducting state, and the voltage across the corresponding terminals 114-1 and 114-2 of each of power devices 102-1-102-N may be negative. Thereafter, the variable power source 126-2 reduces the level of the voltage applied to the terminal 116-2. For example, FIG. 20B shows a voltage versus time diagram in which dashed line 860 represents the voltage level between the terminal 116-1 and the terminal 116-2, which may initially be negative, but rise and become positive as time progresses (e.g., the voltage level at the terminal 116-2 becomes lower than the voltage level at the terminal 116-1). As the voltage level between the terminal 116-1 and the terminal 116-2 rises, the diodes 111-1-111-N may sequentially transit into a non-conducting state, and the voltage across the corresponding terminals 114-1 and 114-2 of the power devices 102-1-102-N may be sequentially become positive. In FIG. 20B, lines 862-1-862-N represents the voltage level across the corresponding terminals 114-1 and 114-2 of the power devices 102-1-102-N. As show in FIG. 20B, the voltage level 862-1 between the terminals 114-11 and 114-21 of the power device 102-1 become positive before the voltage level 862-2 between the terminals 114-12 and 114-22 of the power device 102-2.

The power system controller 106 may control the power source 126-1 to apply a first voltage level to the terminal 116-1 and control the variable power source 126-2 to apply an initial voltage level to the terminal 116-2 higher than the first voltage level. The power system controller may control the variable power source 126-2 to increase the voltage level at the terminal 116-2 and transmit to the power devices 102-1-102-N a signal instructing the power devices to repeatedly measure a voltage across their terminals 114-1 and 114-2. The power devices 102-1-102-N may repeatedly measure, using sensors 183, the voltage levels between the corresponding terminals 114-1 and 114-2, and transmit signals corresponding to the measured voltage levels. The power system controller 106 may map the locations of the power devices 102-1-102-N based on the times at which the voltage levels across the corresponding terminals 114-1-114-2 becomes positive or crosses a threshold. According to another example, the power system controller may control the variable power source 126-2 to increase the voltage level at terminal 116-2 in increments, and transmit to the power devices 102-1-102-N a signal instructing the power devices to measure a voltage across their corresponding terminals 114-1 and 114-2 in each increment.

Figure 21:
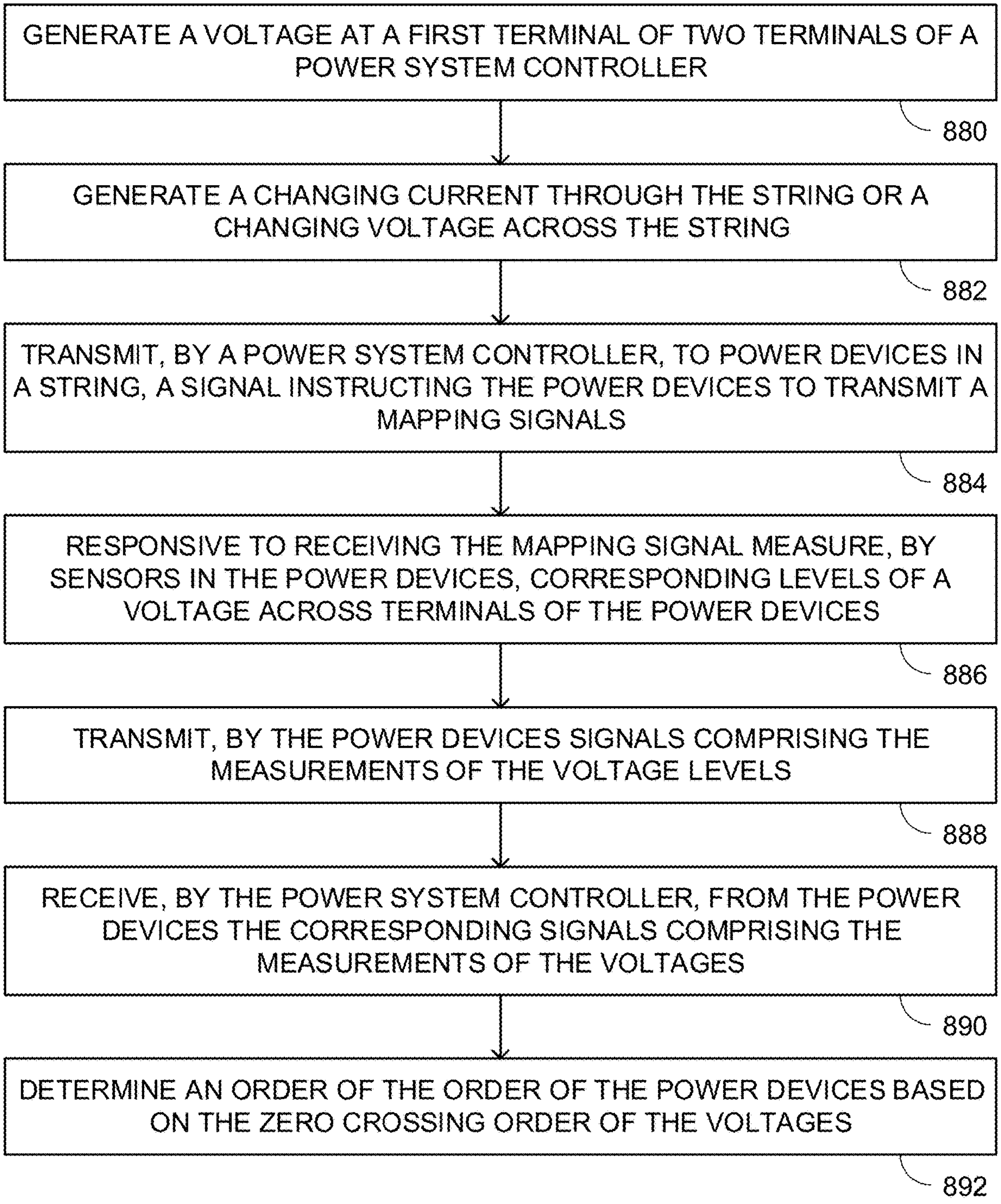
FIG. 21 shows another example method for mapping the locations of the power devices.

Reference is made to FIG. 21, which shows a method for mapping the locations of the power devices 102-1-102-N in the string 158. The method shown in FIG. 21 may refer to method shown in conjunction with FIGS. 18A and 20A. In step 880, the power system controller 106 may control the power source 126-1 to generate a voltage at a first end of the string 158 of the power devices 102-1-102-N.

In step 882, the power system controller 106 may control the current source 603 to generate a changing (e.g., increasing or decreasing) differential current through the string 158, or control the voltage source 126-2 to generate a changing voltage across the string 158.

In step 884, the power system controller 106 may transmit, to the power devices 102-1-102-N in the string 158, a signal instructing the power devices 102-1-102-N to transmit a mapping signal In step 886, responsive to receiving the signal from the power system controller 106, the sensor(s) 183 in the power devices 102-1-102-N may measure a corresponding level of a voltage across the terminals 114-1 and 114-2 of the power devices.

In step 888, the power devices 102-1-102-N may transmit signals comprising the corresponding measurements of the voltages across the corresponding terminals 114-1 and 114-2.

In step 890, the power system controller 106 may receive from the power devices 102-1-102-N the corresponding signals comprising the measurements of the voltages.

In step 890, the power system controller 106 may an order of the power devices 102-1-102-N based on when the voltage levels of the power devices are going from positive to negative or crossing a voltage threshold.

It is noted that FIG. 18C shows and example in which the current is increasing. Nevertheless, the order of the power devices 102-1-102-N in the string 158 may be determined by the zero-crossing of the voltages using a decreasing current. When using a decreasing current, the voltage levels between terminals 114-1 and 114-2 of the power devices at the top of the string may zero-cross, from negative voltage to positive voltage first. Similarly, FIG. 20B shows and example in which the voltage across the string is increasing. Nevertheless, the order of the power devices 102-1-102-N in the string 158 may be determined by the zero-crossing of the voltages using a decreasing voltage. When using a decreasing voltage across the string, the voltage levels between terminals 114-1 and 114-2 of the power device at the bottom of the string may zero-cross, from a positive voltage to a negative positive voltage first.

Figure 22:
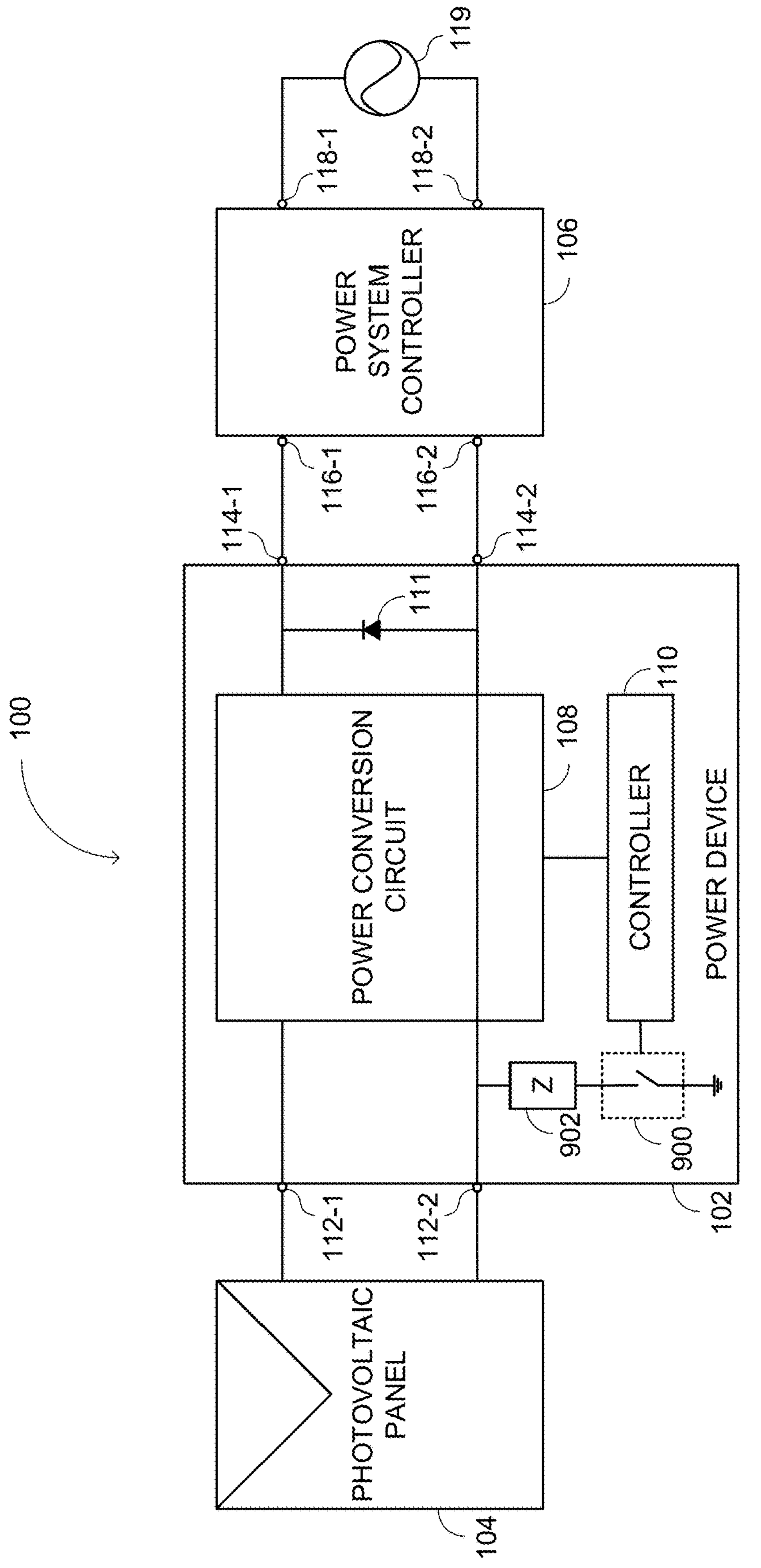
FIG. 22 shows an example power device.

In the description above, in conjunction with FIGS. 9-21, the mapping of the locations of the power devices 102-1-102-N was performed using the parasitic impedances 602-1-602-N, which may result in the parasitic leakage currents IL-1-IL-N. According to the disclosure herein, a leakage current may be generated using a controlled switch. Reference is now made to FIG. 22, which shows a system 100, where the power device 102 may comprise a switch 900. The switch 900 may be coupled between the terminal 112-2 of the power device 102 and the ground. The switch 900 may be controlled by the controller 110 to transition between a conducting state and a non-conducting state. The power device 102 may further comprise an impedance 902 (e.g., a resistor, a capacitor, an inductor, or any combination thereof) coupled to the switch 900 to limit the current flowing through the switch 900 to the ground. When the power device 102 receives a signal from the power system controller 106 to transmit a mapping signal, the controller 110 may control the switch 900 to a conducting state, and then measure by sensor(s) 183, an electrical characteristic of the power device 102 (e.g., a voltage level between the terminals 114-1 and 114-2, a voltage across the impedance 902, or a current through the switch 900). Although in FIG. 19, the switch 900 is depicted as located in the power device 102 the switch 900 may alternatively be located outside the power device 102.

As mentioned above, the power source 126 may be an AC power source. In cases in which the power source 126 is an AC power source, the impedances used for mapping the location of the power devices 102-1-102-N in the string 148 (e.g., parasitic impedances 602-1-602-N, or the impedance 902) may be capacitive or inductive. When using the switch 900 to generate a leakage current (e.g., as described above in conjunction with FIG. 16), using the impedance 902, which comprises a capacitor, may provide additional safety since a capacitor may provide isolation of DC currents (e.g., in cases in which switch 900 shorts). In some cases, when using PLC, power source 126 may be used for communications. In cases in which the power source 126 is an AC power source, the frequency of the waveform produced by the power source 126 may be selected to generate a selected impedance.

According to the disclosure herein, when mapping the locations of the power devices 102-1-102-N in the string 148 or 158, the current through the equivalent resistances 160-1-160-N of some of the power devices 102-1-102-N may be different depending on the location of the power devices in the string 148, and the polarity of the voltage applied to the string 148. For example, in cases where the power source 126 generates a positive voltage at the terminal 116-1, the current through the power device 102-N may be lower than the current through power device 102-1. Thus, for example, the measurement of the level of the current through the power device 102-N may not be as accurate as the measurement of the level of the current through the power device 102-1. Therefore, a mapping process, as described in the disclosure herein, may be performed twice, once when the polarity of the voltage generated by power source 126 is a positive polarity and once when the polarity of the voltage generated by power source 126 is a negative polarity. Also, the system 101 may comprise two switches, such as the switch 700 (or a single, single pole, multi-throw switch), which may connect either the terminal 116-1 or the terminal 116-2 to ground or to the voltage source 702.

In the description above, in conjunction with FIGS. 9-21, the power system controller 106 transmitted a signal to power devices 102-1-102-N to transmit a mapping signal. It is noted that this step is not necessary and is brought herein as an example. It may be sufficient for the power devices 102-1-102-N to transmit a signal comprising the measured level of the electrical characteristics related to the mapping (e.g., periodically if more than one such signal is required).

According to the disclosure herein, the transmission of signals from the power devices 102-1-102-N to the power system controller 106 may enable the detection of leakage in the system 101 based on various measured electrical characteristics. The detection of the leakage may be based on a difference in related measurements in the power system controller 106 and power-related measurements in the power devices 102-1-102N, which the power devices 102-1-102N may transmit to the controller 106. For example, one or more power devices 102-1-102N may transmit a signal comprising a measurement of a respective current 128 (FIGS. 2A-2C). The power system controller 106 may measure a level of a current through the terminal 116-1 or the terminal 116-2. If the level of the current received from the one or more of the power devices 102-1-102N is larger than the level of the current measured by the power system controller 106, then the power system controller may determine that leakage has occurred.

In cases in which the power system 101 comprises more than one string, and the mapping of devices 102-1-102-N between the strings (which power device is located in which string) is known, the power system controller 106 may receive a signal comprising the level of the current at each string from one of more power devices 102 located at each string (e.g., the current through each of the power devices 102 located in the same string should be the same). The power system controller 106 may sum the current levels in each string and may measure a level of a current through the terminal 116-1. If the level of the sum of the currents from the strings is larger than the level of the current measured by the power system controller 106 (e.g., the difference is above a threshold), then the power system controller 106 may determine that leakage has occurred.

According to the disclosure herein, each of the power devices 102-1-102N, located in the same string, may transmit a signal comprising a measurement of a respective current 128. The power system controller 106 may receive the signals from the power devices 102-1-102N and compare the current levels received from the power devices 102-1-102N. If no leakage occurs, the current levels received from power devices 102-1-102N should be the same (e.g., within a tolerance). If the power system controller 106 detects a difference between the current level of one or more power devices 102-1-102-N and the current level of another power device, then leakage occurs.

According to the disclosure herein, the system 101 may comprise more than one string, and the power system controller 106 may measure the current level of each string. The power system controller 106 may transmit a signal comprising the measured current level of each string to the power devices in that string. If a power device 102-*i* in a string measures a current level that is higher than the current level received from the power system controller 106, then the power device 102-*i* (e.g., power device controller 110) may determine that leakage has occurred and/or the power device 102-*i* may cease the production of power (e.g., by controlling switches 187-1-187-4 to a non-conducting state).

According to the disclosure herein, after the power system controller 106 performs a preliminary leakage test (e.g., as described above in FIGS. 13A-13C, the power system controller 106 may receive from each power devices 102-1-102N, in a string of power devices (e.g., string 148)) a signal comprising a level of a measured current through one of the terminals 114-1 or 114-2. The power system controller 106 may transmit this current to the power devices 102-1-102-N (e.g., periodically). The power devices 102-1-102N may compare the level of the current received from the power system controller 106 with a level of the measured current through one of the terminals 114-1 or 114-2. If a power device 102-*i* measures a level of a current through one of terminals 114-1 or 114-2, which is higher than the level of the current received from the power system controller 106, then the power device 102-*i* may determine that leakage occurs and may cease the production of power.

According to the disclosure herein, the power devices 102-1-102-N may transmit a signal comprising a measurement of a level of a respective temperature. The power system controller 106 may determine that leakage occurs if a measured temperature of one of the power devices 102-1-102-N exceeds a temperature threshold. Power system controller may transmit a signal to power devices 102-1-102-N to stop drawing power from the photovoltaic panel 104.

As described above, the power devices 102-1-102-N may be connected in a string such as the string 148. In such cases, the sum of the voltages between the terminals 114-1 and 114-2 of power devices 102-1-102-N should equal the voltage across the terminals 116-1 and 116-2 of the power system controller 106. According to the disclosure herein, the power devices 102-1-102-N may transmit a signal comprising a measurement of a level of the voltage between the corresponding terminals 114-1 and 114-2. The power system controller 106 may measure a level of the voltage between the terminals 116-1 and 116-2. The power system controller 106 may sum the level of the voltages received from the signals from the power devices 102-1-102-N. If the sum of the voltage levels from the power devices 102-1-102-N is larger than the measured level of the voltage between terminals 116-1 and 116-2, the power system controller 106 may determine that a leakage has occurred.

According to the disclosure herein, the power device controller 110 of a power device 102 may determine that leakage has occurred based on measurements of the voltage between the terminals 114-1 and 114-2 and a current through the power device 102 (e.g., from the current sensor 132 or the current sensor 134 as illustrated in FIG. 2B). For example, in some systems, such as the system 101, the power system controller may transmit signals to the power device 102 requesting power device 102 to increase the voltage between the terminals 114-1 and 114-2. For example, if a measured level of the voltage between the terminals 114-1 and 114-2 is lower than a threshold, the power device 102 receives a signal from the power system controller 106 to increase the voltage level between the terminals 114-1 and 114-2, and a measured level of the current level through the power device 102 is higher than a threshold (e.g., lower than a threshold), the power device controller 110 may determine that leakage has occurred. The power device 102 may transmit a signal, via communications interface 182, to the power system controller 106 that leakage may occur in power device 102.

According to the disclosure herein, the transmission of signals from the power devices 102-1-102-N to the power system controller 106 may enable the detection of leakage in the system 101 based on power measurements. For example, in cases in which power system controller 106 does not draw power from power devices 102-1-102-N, one or more power devices 102-1-102N may transmit a signal comprising a measurement of a corresponding consumed power. If the level of power consumed by the one or more of the power devices 102-1-102N is larger than a threshold, then the power system controller 106 may determine that leakage has occurred.

One or more aspects of the disclosure may be embodied in computer-usable data and computer-executable instructions, such as in one or more program modules executed by one or more computers or other devices. Generally, program modules include routines, programs, objects, components, data structures, etc., that perform particular tasks or implement particular abstract data types when executed by a processor in a computer or other device. The computer executable instructions may be stored on a computer readable medium such as a hard disk, optical disk, removable storage media, solid-state memory, RAM, etc. As will be appreciated by one of the skills in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Hereinafter, various characteristics will be highlighted in a set of numbered clauses or paragraphs. These characteristics are not to be interpreted as being limiting, but are provided merely as a highlighting of some characteristics as described herein, without suggesting a particular order of importance or relevancy of such characteristics.

Clause 1: A system comprising:
- a string of serially connected power devices;
- a power source configured to apply a source voltage to a first end of the string; and
- a power system controller,
- wherein each power device in the string is configured to:
  - measure, based on receiving a first signal from the power system controller, a level of an electrical characteristic of the power device, wherein the level of the electrical characteristic is based on parasitic leakage of the power device; and
  - transmit, to the power system controller, a second signal comprising the level of the electrical characteristic; and
- wherein the power system controller is configured to:
  - transmit, to each power device in the string, the first signal;
  - receive, from each power device in the string, the second signal; and
  - determine a location of at least a first power device within the string based on a difference between the level of the electrical characteristic of the first power device and the level of the electrical characteristic of a second power device in the string.

Clause 2: The system of clause 1, wherein the power system controller is configured to determine, based on the level of the electrical characteristic of the first power device being greater than the level of the electrical characteristic of the second power device, the first power device is closer to the first end of the string.

Clause 3: The system of any one of clauses 1-2, wherein the power system controller is further configured to:
- transmit the first signal to the first power device based on a determination that the first power device is an unmapped power device in the string; and
- determine, based on the level of the electrical characteristic of the first power device being greater than the level of the electrical characteristics of other unmapped power devices in the string, the first power device is closer to the first end of the string than the other unmapped power devices.

Clause 4: The system of clause 3, wherein the power system controller is further configured to transmit, to the first power device, a third signal instructing the first power device to transition to a bypass mode.

Clause 5: The system of any one of clauses 1-4, wherein the electrical characteristic, of each power device in the string of power devices, is at least one of:
- an output voltage between a first terminal and a second terminal of the power device; or
- an output current through the first terminal or the second terminal of the power device.

Clause 6: The system of clause 5, wherein the power system controller comprises:
- a third terminal coupled to the first end of the string; and
- a fourth terminal coupled to a second end of the string; and wherein the power source is coupled to:

the third terminal;

the fourth terminal; or both the third terminal and the fourth terminal.

Clause 7: The system of any one of clauses 1-6, further comprising a switch, coupled between a second end of the string and a ground potential, wherein the power source is configured to apply the source voltage at the first end of the string by applying a differential voltage across the first end of the string and the second end of the string; and wherein the power system controller is configured to determine the location of at least the first power device within the string by:

before transmitting the first signal, controlling the switch to a non-conducting state;

after receiving the second signal, controlling the switch to a conducting state;

transmitting, to the first power device, a third signal;

receiving, from the first power device, a fourth signal comprising a second level of the electrical characteristic of the first power device in response to the third signal; and determining the location of the first power device within the string based on a ratio between the level of the electrical characteristic of the first power device and the second level of the electrical characteristic of the first power device.

Clause 8: The system of any one of clauses 1-7, further comprising a current source, wherein the power system controller comprises:

a first terminal coupled to the first end of the string; and a second terminal coupled to a second end of the string;

wherein the power source is coupled to the first terminal or the second terminal;

wherein the current source is coupled between the first terminal and the second terminal; and wherein the current source is configured to generate a differential current between the first terminal and the second terminal.

Clause 9: The system of any one of clause 8, wherein the current source is a variable current source;

wherein the power system controller is configured to control the variable current source to increase the differential current; and wherein the electrical characteristic of the first power device is further based on the increased differential current.

Clause 10: The system of any one of clauses 8-9, wherein the current source is a variable current source; and wherein the power system controller is configured to determine the location of at least the first power device within the string by:

controlling the variable current source to gradually increase the differential current generated by the current source; and determining the location of the first power device based on a time when the level of the electrical characteristic of the first power device changes sign based on the differential current.

Clause 11: The system of any one of clauses 1-10, further comprising a variable voltage source.

wherein the power system controller comprises:

a first terminal coupled to the first end of the string; and a second terminal coupled to a second end of the string;

wherein the power source is coupled the first terminal;

wherein the variable voltage source is coupled to the second terminal; and wherein the power system controller is configured to determine the location of at least the first power device within the string by:

controlling the variable voltage source to continuously increase a second voltage generated by the variable voltage source; and determining the location of the first power device in the string based on a time when the level of the electrical characteristic of the first power device changes sign based on the second voltage.

Clause 12: A method comprising:

generating, by a power source, a source voltage at a first end of a string of serially connected power devices;

transmitting, by a power system controller coupled to the power source and to the string, a first signal;

measuring, by a sensor in each power device in the string, a level of an electrical characteristic of the power device, wherein the level of the electrical characteristic is based on parasitic leakage of the power device;

transmitting, by each power device in the string, a second signal comprising the level of the electrical characteristic of the power device;

receiving, by the power system controller, the second signal from each power device in the string; and determining a location of at least a first power device within the string based on a difference between the level of the electrical characteristic of the first power device and the level of the electrical characteristic of a second power device in the string.

Clause 13: The method of clauses 12, wherein the determining the location of at least the first power device comprises determining, based on the level of the electrical characteristic of the first power device being greater than the level of the electrical characteristic of the second power device, that the first power device is closer to the first end of the string.

Clause 14: The method of any one of clauses 12-13, wherein the transmitting the first signal comprises transmitting the first signal to the first power device based on a determination that the first power device is an unmapped power device in the string; and wherein the determining the location of at least the first power device comprises determining, based on the level of the electrical characteristic of the first power device being greater than the level of the electrical characteristics of other unmapped power devices in the string, that the first power device is closer to the first end of the string than the other unmapped power devices.

Clause 15: The method of clause 14, further comprising transmitting, by the power system controller and to the first power device, a third signal instructing the first power device to transition to a bypass mode.

Clause 16: The method of any one of clauses 12-15, wherein the generating the source voltage comprises generating the source voltage at one of:

a first terminal of the power system controller;

a second terminal of the power system controller; or both the first terminal and the second terminal.

Clause 17: The method of clause 16, wherein the string is isolated from a ground potential;

wherein the generating the source voltage at the first end of the string comprises applying a differential voltage across the first end of the string and a second end of the string; and wherein the determining the location of at least the first power device within the string comprises:

before transmitting the first signal, controlling a switch, coupled between the second end of the string and a ground potential, to a non-conducting state;

after receiving the second signal, controlling the switch to a conducting state transmitting, to the first power device, a third signal;

receiving, from the first power device, a fourth signal comprising a second level of the electrical characteristic of the first power device in response to the third signal; and determining the location of the first power device within the string based on a ratio between the level of the electrical characteristic of the first power device and the second level of the electrical characteristic of the first power device.

Clause 18: The method of any one of clauses 12-17, wherein the determining the location of at least the first power device comprises:

generating a differential current in the string;

increasing the differential current; and determining of the location of at least the first power device based on a change in the electrical characteristic of the first power device in response to the increased differential current.

Clause 19: The method of any one of clauses 12-18, wherein the determining the location of at least the first power device comprises:

generating a differential current in the string;

gradually increasing the differential current; and determining of the location of at least the first power device based on a time when the level of the electrical characteristic of the first power device changes sign based on the differential current.

Clause 20: The method of any one of clauses 12-19, wherein the determining the location of at least the first power device comprises:

generating a variable voltage at a second end of the string; and determining the location of at least the first power device in the string based on a time when the electrical characteristic of the first power device changes sign in response to the variable voltage.

Clause 21: A system comprising:

a power device comprising a power conversion circuit, a positive terminal, and a negative terminal;

a power source configured to supply a voltage to one of the positive terminal or the negative terminal of the power device;

a sensor configured to measure a level of current flowing through the power device responsive to the voltage; and a power system controller configured to detect a ground fault based on the level of current measured by the sensor.

Clause 22: The system of any one of clauses 21, wherein the power device further comprises a bypass diode connected between the positive terminal and the negative terminal; and wherein the sensor is configured to measure the level of current flowing through the power device by measuring a level of current flowing through the bypass diode.

Clause 23: The system of any one of clauses 21-22, wherein the sensor is configured to measure the level of current flowing through the power device by measuring a level of a current flowing through the power conversion circuit.

Clause 24: The system of any one of clauses 21-23, wherein the power device further comprises a power device communications interface configured to transmit, to the power system controller, a signal corresponding to the level of the current flowing through the power device.

Clause 25: The system of clause 24, wherein the power system controller further comprises a controller communications interface configured to receive, from the power device, the signal corresponding to the level of the current flowing through the power device.

Clause 26: The system of clause 25, wherein the controller communications interface is further configured to transmit, to the power device, another signal comprising instructions for the power device to conduct a ground fault test.

Clause 27: The system of any one of clauses 21-26, wherein the power system controller is configured to detect the ground fault by sending instructions to the power source for the power source to supply the voltage to the one of the positive terminal or the negative terminal.

Clause 28: The system of any one of clauses 21-27, further comprising a second power source coupled to other terminals of the power device, wherein the ground fault corresponds to a ground fault in the power device or in the second power source.

Clause 29: The system of clause 28, wherein the second power source is a photovoltaic panel.

Clause 30: The system of any one of clauses 1-29, wherein the power source comprises a power converter; and wherein the power converter is configured to receive power from a second power source and convert the received power to supply the voltage at the one of the positive terminal or the negative terminal.

Clause 31: The system of clause 30, wherein the second power source is one of:

a battery;

a photovoltaic panel;

a generator;

a fuel cell;

a wind turbine; or a grid.

Clause 32: The system of any one of clauses 30-31, wherein the second power source is a grid; wherein the received power is Alternating Current (AC) power; and wherein the power converter is configured to convert the power by converting the AC power to Direct Current (DC) power.

Clause 33: The system of any one of clauses 21-32, wherein the sensor is configured to measure the level of current flowing through the power device by measuring a level of current flowing through the power conversion circuit;

wherein the power device further comprises a bypass diode and a second sensor;

wherein the bypass diode is connected between the positive terminal and the negative terminal; and wherein the second sensor is configured to measure a level of a current flowing through the bypass diode.

Clause 34: A system comprising:

a power device comprising a power conversion circuit, a positive terminal, and a negative terminal;

a power source configured to supply a voltage to one of the positive terminal or the negative terminal of the power device; and a sensor configured to measure a level of current flowing through the power device responsive to the voltage, wherein the power device is further configured to detect a ground fault based on the level of current measured by the sensor.

Clause 35: A method comprising:
controlling, by a power system controller, a power source to generate a voltage at one of a positive terminal or a negative terminal of a power device;
measuring by a sensor, a level of a current flowing through the power device responsive to the voltage; and
detecting, by the power system controller and based on the level of the current measured by the sensor, a ground fault.

Clause 36: The method of clause 35 further comprising:
transmitting, by the power system controller to the power device, a signal comprising instructions for the power device to conduct a ground fault test; and
transmitting by the power device to the power system controller, another signal corresponding to the measured level of current flowing through the power device.

Clause 37: A system comprising:
a power device comprising:
a positive terminal and a negative terminal;
an electrically conducting plate insulated from a ground potential and biased at a bias voltage relative to a voltage between the positive terminal and the negative terminal; and
a sensor configured to measure a voltage between the electrically conducting plate and one of the positive terminal and the negative terminal; and
a controller configured to detect, based on the voltage level measured by the sensor, a ground fault in the power device.

Clause 38: The system of clause 37, wherein the electrically conducting plate is configured to thermally couple at least one switch of the power device to a heatsink.

Clause 39: A method comprising:
applying, to an electrically conducting plate, a bias voltage relative to a voltage between a positive terminal and a negative terminal of a power device;
measuring, by a sensor, a level of voltage between the electrically conducting plate and one of the positive terminal and the negative terminal; and
detecting, by a controller and based on the level of voltage measured by the sensor, a ground fault in the power device.

Clause 40: A system comprising:
a power device comprising:
a positive terminal and a negative terminal;
an electrically conducting plate insulated from a ground potential and biased at a bias voltage relative to a voltage between the positive terminal and the negative terminal; and
a temperature sensor configured to measure a temperature of the power device; and
a controller configured to detect, based on the temperature of the power device, a ground fault in the power device.

Clause 41: A method comprising:
applying, to an electrically conducting plate, a bias voltage relative to a voltage between a positive terminal and a negative terminal of a power device;
measuring, by a temperature sensor, a temperature of the power device; and
detecting, by a controller and based on the temperature of the power device, a ground fault in the power device.

Clause 42: A system comprising:
a plurality of serially connected power devices;
a power source configured to apply a voltage to the plurality of serially connected power devices; and
a power system controller,
wherein each power device, of a plurality of serially connected power devices, comprises:
a first terminal and a second terminal;
a voltage sensor configured to measure a voltage level between the first terminal and the second terminal in response to the voltage; and
a power device communications interface configured to transmit a signal corresponding to the voltage level;
wherein the power system controller comprises:
a third terminal and a fourth terminal coupled to the plurality of serially connected power devices; and
a controller communications interface configured to receive, from each power device, of the plurality of serially connected power devices, the signal; and
wherein the power system controller is configured to detect, based on the signal received from each power device of the plurality of power devices, a ground fault.

Clause 43: The system of clause 42, wherein the power system controller is configured to detect the ground fault by determining that the voltage between the positive terminal and the negative terminal of each power device of the plurality of serially connected power devices, is different from a reference voltage.

Clause 44: The system of any one of clauses 42-43, wherein the power system controller is further configured to detect, based on signals received from each power device of the plurality of serially connected power devices and a reference voltage, a location of the ground fault in the plurality of serially connected power devices.

Clause 45: The system of any one of clauses 42-44, wherein the power source comprises a power converter; and
wherein the power converter is configured to receive power from a second power source and convert the received power to the voltage applied to the plurality of serially connected power devices.

Clause 46: The system of clause 45, wherein the second power source is one of:
a battery;
a photovoltaic panel;
a generator;
a fuel cell;
a wind turbine; or
a grid.

Clause 47: The system of any one of clauses 45-46, wherein the second power source is a grid;
wherein the received power is Alternating Current (AC) power; and
wherein the power converter is configured to convert the power by converting the AC power from the grid to Direct Current (DC) power.

Clause 48: The system of any one of clauses 42-47, further comprising:
a first resistor disposed between a positive terminal of the power source and the plurality of serially connected power devices; and
a second resistor disposed between a negative terminal of the power source and the plurality of serially connected power devices.

Clause 49: The system of clause 48, further comprising:
a first switch for connecting and disconnecting the first resistor and the plurality of serially connected power devices; and a second switch for connecting and disconnecting the second resistor and the plurality of serially connected power devices.

Clause 50: A method comprising:

controlling, by a power system controller, a power source to apply a voltage to a serial connection of a plurality of power devices;

measuring, by a voltage sensor in each power device of the plurality of power devices, a voltage level across a first terminal and a second terminal of the power device; and detecting, by a power system controller and based on the voltage level of each power device of the plurality of power devices, a ground fault.

Clause 51: The method of clauses 50, further comprising:

based on detecting the ground fault, the voltage level of each power device of the plurality of power devices, and a mapping of a location of each power device, of the plurality of power devices, in the serial connection, detecting, by the power system controller, a location of the ground fault.

Clause 52: The system of any one of clauses 50-51, wherein each power device, of the plurality of power devices power device, comprises:

a third terminal and a fourth terminal;

a first power conversion circuit configured to convert a first power at the third terminal and the fourth terminal to a second power at the first terminal and the second terminal;

a power device communication interface configured to transmit and receive signals;

sensors configured to measure a voltage level, a current level, or a temperature of the power device;

a first controller configured to receive:

the voltage level, the current level, or the temperature of the power device from the sensors; and the signals from the power device communication interface; and a first auxiliary power supply configured to provide operating power to the first controller and to the power device communications interface.

Clause 53: The system of any one of clauses 50-52, wherein the power system controller comprises:

a second power conversion circuit configured to convert the second power at the first terminal and the second terminal to third power;

a power system controller communication interface configured to transmit and receive signals;

a second controller configured to receive the signals from the power system controller communication interface; and a second auxiliary power supply configured to provide power to the second controller and to the power system controller communications interface.

Clause 54: A method comprising:

transmitting, by a power system controller to one or more power devices, a signal comprising instructions for the one or more power devices to conduct a ground fault test;

conducting, by each of the one or more power devices, the ground fault test;

transmitting, by each of the one or more power devices and to the power system controller, a corresponding signal relating to a result of the ground fault test;

receiving, by the power system controller and from each of the one or more power devices, the corresponding signal; and detecting, by the power system controller and based on the received corresponding signal from each of the one or more power devices, a ground fault in the one or more power devices.

Clause 55: The method of clause 54 further comprising:

prior to transmitting the signal, conducting, by the power system controller and via a test resistor, another ground fault test.

Clause 56: A system comprising:

a power device comprising a power conversion circuit, a positive terminal, and a negative terminal;

a sensor configured to measure a level of current flowing through the power device responsive to the voltage; and a power system controller comprising a power source, wherein the power source is configured to supply a voltage to one of the positive terminal or the negative terminal of the power device, and wherein the power system controller is configured to detect a ground fault based on the level of current measured by the sensor.

Clause 57: A method comprising:

for each power device in a string of power devices:

receiving, by the power device and from a power system controller, a first signal;

measuring, by a sensor in the power device and based on the first signal, an electrical characteristic of the power device, wherein the measured electrical characteristic indicates parasitic leakage associated with the power device; and transmitting, by the power device and to the power system controller, a second signal indicating the measured electrical characteristic; and determining, by the power system controller and based on receiving the second signal from each power device in the string of power devices, a location of one or more power devices within the string of power devices.

Clause 58: The method of clause 57, wherein the electrical characteristic, of each power device in the string of power devices, is a voltage across terminals of the power device.

Clause 59: The method of any one of clauses 57-58, wherein the electrical characteristic, of each power device in the string of power devices, is a current through a terminal of the power device.

Clause 60: A method comprising:

transmitting, by a power system controller and to unmapped power devices in a string of power devices, a first signal;

measuring, by a sensor in each of the unmapped power devices, an electrical characteristic of the un-mapped power device, wherein the measured electrical characteristic indicates parasitic leakage associated with the up-mapped power device;

transmitting, by each of the unmapped power devices, a second signal indicating the measured electrical characteristic of the power device;

receiving, by the power system controller, the second signal from each of the un-mapped power devices;

determining, based on the second signal from each of the unmapped power devices, that a power device, of the up-mapped power devices, with a highest level of the electrical characteristic is the next power device in the string; and transmitting, by the power system controller, a third signal instructing the power device with the highest level of the electrical characteristic to transition to a bypass mode.

Clause 61: A system comprising:

a plurality of serially connected power devices;

a power source configured to apply a voltage to the plurality of serially connected power devices; and a power system controller, wherein each power device of the plurality of serially connected power devices comprises:

a first terminal and a second terminal;

a sensor configured to, responsive to receiving a first signal, measure an electrical characteristic of the power device, wherein the measured electrical characteristic indicates parasitic leakage; and a power device communications interface configured to receive the first signal and transmit a second signal indicating the electrical characteristic;

wherein the power system controller comprises:

a third terminal and a fourth terminal coupled to the plurality of serially connected power devices; and a controller communications interface configured to transmit the first signal and to receive, from each power device of the plurality of serially connected power devices, the second signal; and wherein the power system controller is configured to determine locations of the power devices within the string based on the second signal from each power device of the plurality of serially connected power devices.

Clause 62: The system of clause 61, wherein the controller communications interface is configured to transmit the first signal to unmapped power devices of the plurality of serially connected power devices.

Clause 63: The system of clause 62, wherein the power system controller is configured to determine, based on the second signal from each power device of the plurality of serially connected power devices, a location of a power device, from the plurality of serially connected power devices, with a highest level of the electrical characteristic.

Clause 64: The system of clause 63, wherein the power system controller is further configured to transmit a third signal instructing the power device to transition to a bypass mode.

Clause 65: A method comprising:

generating a voltage across a string, the string comprising a plurality of serially connected power devices, and wherein the string is isolated from a ground potential;

measuring, by a sensor in each of the plurality of serially connected power devices, a corresponding first level of an electrical characteristic;

transmitting, by each of the plurality of serially connected power devices and to a power system controller, a first signal comprising the measured first level of the electrical characteristic;

connecting the string to the ground potential;

measuring, by the sensor in each of the plurality of serially connected power devices, a corresponding second level of the electrical characteristic;

transmitting, by each of the plurality of power devices and to a power system controller, a second signal comprising the measured second level of the electrical characteristic; and determining, by the power system controller, based on the first signal from each of the plurality of serially connected power devices and the second signal from each of the plurality of serially connected power devices, locations of the plurality of serially connected power devices within the string.

Clause 66: A method comprising:

generating, by a power source, a source voltage at a first end of a string of serially connected power devices;

transmitting, by a power system controller coupled to the power source and to the string, a first signal;

measuring, by a sensor in each power device in the string, a level of an electrical characteristic of the power device, wherein the level of the electrical characteristic is based on parasitic leakage of the power device;

transmitting, by each power device in the string, a second signal comprising the level of the electrical characteristic of the power device;

receiving, by the power system controller, the second signal from each power device in the string; and determining a location of at least a first power device within the string based on the level of the electrical characteristic of the first power device being greater than the level of the electrical characteristic of the second power device, that the first power device is closer to the first end of the string.

Clause 67: The method of any one of clause 12 or 66, wherein the determining the location of at least the first power device comprises:

generating a differential power in the string;

increasing the differential power; and determining of the location of at least the first power device based on a change in the electrical characteristic of the first power device in response to the increased differential current.

Clause 68: A method comprising:

measuring, by a sensor in a power device of a plurality of power devices, a temperature relating to the power device;

transmitting, by the power device, and to a power system controller, a signal comprising the measured temperature; and based on the measured temperature exceeding a threshold, providing by the power system controller an indication that that leakage occurred.

Clause 69: The method of clause 68 further comprising transmitting by the power system controller, and to at least the power device, a signal comprising instruction to stop power production by the power device.

Clause 70: A method comprising:

measuring, by a sensor in a power device of a plurality of power devices, a power relating to the power device;

transmitting, by the power device, and to a power system controller, a signal comprising the measured power; and based on the measured power exceeding a threshold, providing by the power system controller an indication that that leakage occurred.

Clause 71: The method of clause 70 further comprising transmitting by the power system controller, and to at least the power device, a signal comprising instruction to stop power production by the power device.

The invention claimed is:

1. A system comprising:

a string of serially connected power devices;

a power source configured to apply a source voltage to a first end of the string; and a power system controller, wherein each power device in the string is configured to:

measure, based on receiving a first signal from the power system controller, a level of an electrical characteristic of the power device, wherein the level of the electrical characteristic is based on parasitic leakage of the power device; and transmit, to the power system controller, a second signal comprising the level of the electrical characteristic; and wherein the power system controller is configured to:

transmit, to each power device in the string, the first signal;

receive, from each power device in the string, the second signal; and determine a location of at least a first power device within the string based on a difference between the level of the electrical characteristic of the first power device and the level of the electrical characteristic of a second power device in the string.

2. The system of claim 1, wherein the power system controller is configured to determine, based on the level of the electrical characteristic of the first power device being greater than the level of the electrical characteristic of the second power device, the first power device is closer to the first end of the string.

3. The system of claim 1, wherein the power system controller is further configured to:

transmit the first signal to the first power device based on a determination that the first power device is an unmapped power device in the string; and determine, based on the level of the electrical characteristic of the first power device being greater than the level of the electrical characteristics of other unmapped power devices in the string, the first power device is closer to the first end of the string than the other unmapped power devices.

4. The system of claim 3, wherein the power system controller is further configured to transmit, to the first power device, a third signal instructing the first power device to transition to a bypass mode.

5. The system of claim 1, wherein the electrical characteristic, of each power device in the string of power devices, is at least one of:

an output voltage between a first terminal and a second terminal of the power device; or an output current through the first terminal or the second terminal of the power device.

6. The system of claim 5, wherein the power system controller comprises:

a third terminal coupled to the first end of the string; and a fourth terminal coupled to a second end of the string; and wherein the power source is coupled to:

the third terminal;

the fourth terminal; or both the third terminal and the fourth terminal.

7. The system of claim 1, further comprising a switch, coupled between a second end of the string and a ground potential, wherein the power source is configured to apply the source voltage at the first end of the string by applying a differential voltage across the first end of the string and the second end of the string; and wherein the power system controller is configured to determine the location of at least the first power device within the string by:

before transmitting the first signal, controlling the switch to a non-conducting state;

after receiving the second signal, controlling the switch to a conducting state;

transmitting, to the first power device, a third signal;

receiving, from the first power device, a fourth signal comprising a second level of the electrical characteristic of the first power device in response to the third signal; and determining the location of the first power device within the string based on a ratio between the level of the electrical characteristic of the first power device and the second level of the electrical characteristic of the first power device.

8. The system of claim 1, further comprising a current source, wherein the power system controller comprises:

a first terminal coupled to the first end of the string; and a second terminal coupled to a second end of the string;

wherein the power source is coupled to the first terminal or the second terminal;

wherein the current source is coupled between the first terminal and the second terminal; and wherein the current source is configured to generate a differential current between the first terminal and the second terminal.

9. The system of claim 8, wherein the current source is a variable current source;

wherein the power system controller is configured to control the variable current source to increase the differential current; and wherein the electrical characteristic of the first power device is further based on the increased differential current.

10. The system of claim 8, wherein the current source is a variable current source; and wherein the power system controller is configured to determine the location of at least the first power device within the string by:

controlling the variable current source to gradually increase the differential current generated by the current source; and determining the location of the first power device based on a time when the level of the electrical characteristic of the first power device changes sign based on the differential current.

11. The system of claim 1, further comprising a variable voltage source, wherein the power system controller comprises:

a first terminal coupled to the first end of the string; and a second terminal coupled to a second end of the string;

wherein the power source is coupled to the first terminal;

wherein the variable voltage source is coupled to the second terminal; and wherein the power system controller is configured to determine the location of at least the first power device within the string by:

controlling the variable voltage source to continuously increase a second voltage generated by the variable voltage source; and determining the location of the first power device in the string based on a time when the level of the electrical characteristic of the first power device changes sign based on the second voltage.

12. A method comprising:

generating, by a power source, a source voltage at a first end of a string of serially connected power devices;

transmitting, by a power system controller coupled to the power source and to the string, a first signal;

measuring, by a sensor in each power device in the string, a level of an electrical characteristic of the power device, wherein the level of the electrical characteristic is based on parasitic leakage of the power device;

transmitting, by each power device in the string, a second signal comprising the level of the electrical characteristic of the power device;

receiving, by the power system controller, the second signal from each power device in the string; and determining a location of at least a first power device within the string based on a difference between the level of the electrical characteristic of the first power device and the level of the electrical characteristic of a second power device in the string.

13. The method of claim 12, wherein the determining the location of at least the first power device comprises determining, based on the level of the electrical characteristic of the first power device being greater than the level of the electrical characteristic of the second power device, that the first power device is closer to the first end of the string.

14. The method of claim 12, wherein the transmitting the first signal comprises transmitting the first signal to the first power device based on a determination that the first power device is an unmapped power device in the string; and wherein the determining the location of at least the first power device comprises determining, based on the level of the electrical characteristic of the first power device being greater than the level of the electrical characteristics of other unmapped power devices in the string, that the first power device is closer to the first end of the string than the other unmapped power devices.

15. The method of claim 14, further comprising transmitting, by the power system controller and to the first power device, a third signal instructing the first power device to transition to a bypass mode.

16. The method of claim 12, wherein the generating the source voltage comprises generating the source voltage at one of:

a first terminal of the power system controller;

a second terminal of the power system controller; or both the first terminal and the second terminal.

17. The method of claim 16, wherein the string is isolated from a ground potential;

wherein the generating the source voltage at the first end of the string comprises applying a differential voltage across the first end of the string and a second end of the string; and wherein the determining the location of at least the first power device within the string comprises:

before transmitting the first signal, controlling a switch, coupled between the second end of the string and a ground potential, to a non-conducting state;

after receiving the second signal, controlling the switch to a conducting state;

transmitting, to the first power device, a third signal;

receiving, from the first power device, a fourth signal comprising a second level of the electrical characteristic of the first power device in response to the third signal; and determining the location of the first power device within the string based on a ratio between the level of the electrical characteristic of the first power device and the second level of the electrical characteristic of the first power device.

18. The method of claim 12, wherein the determining the location of at least the first power device comprises:

generating a differential current in the string;

increasing the differential current; and determining the location of at least the first power device based on a change in the electrical characteristic of the first power device in response to the increased differential current.

19. The method of claim 12, wherein the determining the location of at least the first power device comprises:

generating a differential current in the string;

gradually increasing the differential current; and determining the location of at least the first power device based on a time when the level of the electrical characteristic of the first power device changes sign based on the differential current.

20. The method of claim 12, wherein the determining the location of at least the first power device comprises:

generating a variable voltage at a second end of the string; and determining the location of at least the first power device in the string based on a time when the electrical characteristic of the first power device changes sign in response to the variable voltage.

* * * * *